United States Patent
Kim et al.

(10) Patent No.: US 8,198,189 B2
(45) Date of Patent: Jun. 12, 2012

(54) METHODS OF FABRICATING INTEGRATED CIRCUIT DEVICES INCLUDING AIR SPACERS SEPARATING CONDUCTIVE STRUCTURES AND CONTACT PLUGS

(75) Inventors: Dae-Ik Kim, Yongin-si (KR); Je-Min Park, Suwon-si (KR); Chang-Suk Hyun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 170 days.

(21) Appl. No.: 12/777,561

(22) Filed: May 11, 2010

(65) Prior Publication Data

US 2010/0285662 A1    Nov. 11, 2010

(30) Foreign Application Priority Data

May 11, 2009    (KR) .................. 10-2009-0040800

(51) Int. Cl.
*H01L 21/4763*    (2006.01)
(52) U.S. Cl. ........................................ 438/619
(58) Field of Classification Search .................. 438/619
See application file for complete search history.

(56) References Cited

U.S. PATENT DOCUMENTS 7,755,201 B2 *    7/2010    Kim ............................ 257/774

FOREIGN PATENT DOCUMENTS

| KR | 1020010011638 A | 2/2001 |
| KR | 1020040002234 A | 1/2004 |
| KR | 10-0549576 | 1/2006 |

* cited by examiner

*Primary Examiner* — Jenny L Wagner
(74) *Attorney, Agent, or Firm* — Myers Bigel Sibley & Sajovec, P.A.

(57) ABSTRACT

An integrated circuit device includes first and second conductive structures spaced apart from one another on a substrate along a first direction. The first and second conductive structures extend in a second direction substantially perpendicular to the first direction. A contact plug is interposed between the first and second conductive structures and is separated therefrom along the first direction by respective air gaps on opposite sides of the contact plug. The air gaps define first and second air spacers that electrically insulate the contact plug from the first and second conductive structures, respectively. An upper insulation layer covers the first and second air spacers and the first and second conductive structures. The air spacers may sufficiently reduce the loading capacitance between the conductive structures. Related fabrication methods are also discussed.

13 Claims, 41 Drawing Sheets

METHODS OF FABRICATING INTEGRATED CIRCUIT DEVICES INCLUDING AIR SPACERS SEPARATING CONDUCTIVE STRUCTURES AND CONTACT PLUGS

CROSS-REFERENCE TO RELATED APPLICATION

This application claims priority from Korean Patent Application No. 10-2009-0040800, filed on May 11, 2009, in the Korean Intellectual Property Office, the disclosure of which is incorporated herein in its entirety by reference.

BACKGROUND

Example embodiments relate to integrated circuit devices and a method of fabricating the same.

Generally, integrated circuit devices may include a multi-layer structure of wiring lines in which the wiring lines are vertically stacked on a substrate and electrically connected with each other by contact plugs. Recently, higher integration in integrated circuit devices has reduced the gap distance between the wiring lines and the contact plugs. As such, integrated circuit devices may have an increased loading capacitance in the multilayered wiring structure. Higher loading capacitance in dynamic random access memory (DRAM) devices may significantly reduce the operational speed of the devices and/or may deteriorate refresh characteristics of the devices.

SUMMARY

Example embodiments provide integrated circuit devices having reduced loading capacitance between conductive patterns thereof. Other example embodiments provide methods of fabricating such integrated circuit devices.

According to some embodiments, an integrated circuit device includes first and second conductive structures spaced apart from one another along a first direction. The first and second conductive structures extend in a second direction substantially perpendicular to the first direction. A contact plug is interposed between the first and second conductive structures and is separated therefrom along the first direction by respective air gaps on opposite sides of the contact plug. The air gaps define first and second air spacers that electrically insulate the contact plug from the first and second conductive structures, respectively. An upper insulation layer covers the first and second air spacers and the first and second conductive structures.

In some embodiments, first and second upper spacers may be positioned directly above the first and second air spacers, respectively. The first and second upper spacers may separate sidewalls of the contact plug from sidewalls of the first and second conductive structures adjacent thereto. The first and second upper spacers may define an upper boundary of the first and second air spacers therebelow.

In some embodiments, the first and second conductive structures may respectively include a conductive line extending in the second direction, and a hard mask pattern stacked on the conductive line. The first and second upper spacers may be positioned on the sidewalls of the first and second conductive structures, respectively, and the sidewalls of the first and second conductive structures may be defined by the respective hard mask patterns thereof.

In some embodiments, the first and second upper spacers may include a conductive material and may be directly on the sidewalls of the contact plug to increase a surface area thereof.

In some embodiments, the first and second upper spacers may extend along portions of the sidewalls of the first and second conductive structures in the second direction, and the first and second upper spacers may be discontinuous in the second direction.

In some embodiments, the first and second upper spacers may extend along a portion of the sidewalls of the first and second conductive structures in the second direction beyond the contact plug.

In some embodiments, portions of the first and second conductive structures may extend beyond the contact plug in the second direction and may be spaced apart from one another along the first direction by a second air gap. The upper insulation layer may provide an upper boundary of the second air gap.

In some embodiments, portions of the first and second conductive structures may extend beyond the contact plug in the second direction and may be spaced apart from one another by a second air gap along the first direction. An insulation interlayer may fill the second air gap between the portions of the first and second conductive structures that extend beyond the contact plug.

In some embodiments, the upper insulation layer may be directly above the first and second air spacers and may define an upper boundary for the first and second air spacers therebelow.

In some embodiments, an etch protection layer may extend on sidewalls of the first and second conductive structures. The etch protection layer may include portions that laterally extend in the first direction beneath the first and second air spacers. The laterally extending portions of the etch protection layer may define a lower boundary of the first and second air spacers thereabove.

According to further embodiments, a method of fabricating an integrated circuit device includes forming first and second conductive structures on a substrate spaced apart from one another in a first direction and extending in a second direction substantially perpendicular to the first direction. A contact plug is formed between the first and second conductive structures and is spaced apart therefrom in the first direction by respective air gaps on opposite sides of the contact plug. The air gaps define first and second air spacers that electrically insulate the contact plug from the first and second conductive structures, respectively. An upper insulation layer is formed on the first and second air spacers and the first and second conductive structures.

In some embodiments, first and second upper spacer may be formed above the first and second air spacers, respectively. The first and second upper spacers may separate sidewalls of the contact plug from sidewalls of the first and second conductive structures adjacent thereto. The first and second upper spacers may define an upper boundary of the first and second air spacers therebelow.

In some embodiments, the contact plug may be formed by forming an insulation layer on the substrate to cover the first and second conductive structures. The insulation layer may be partially removed to form a contact hole through which sidewalls of the first and second conductive structures are exposed. Sacrificial spacers may be formed in the contact hole on the sidewalls of the first and second conductive structures exposed through the contact hole, and the contact plug may be formed in the contact hole including the sacrificial spacers therein. Then, the sacrificial spacers may be at least partially removed from the sidewalls of the conductive structures such that the contact plug is spaced apart from the sidewalls of the first and second conductive structures by the air gaps defining the first and second air spacers.

In some embodiments, the insulation layer may be removed from the substrate after forming the contact plug and before removing the sacrificial spacers.

According to still further embodiments, an integrated circuit device includes a structure on a substrate, the structure including at least one pad contact. A plurality of bit line structures are arranged on the structure and spaced apart from one another along a first direction. The bit line structures extend in a second direction substantially perpendicular to the first direction. A plurality of contact plugs are respectively interposed between neighboring ones of the bit line structures and spaced apart therefrom by first gaps along the first direction. The first gaps define air spacers that electrically insulate the neighboring ones of the bit line structures from respective ones of the contact plugs therebetween. An upper insulation layer is provided on the air spacers and the bit line structures.

In some embodiments, the structure may further include a transistor on the substrate, a first insulation interlayer through which the pad contact extends, a second insulation interlayer on the first insulation interlayer, and a bit line contact directly on the pad contact. The pad contact may extend through the first insulation interlayer to contact source/drain regions of the transistor.

In some embodiments, at least one of the air spacers may extend from a top portion of a respective one of the contact plugs to a bottom portion of the respective one of the contact plugs.

In some embodiments, at least one of the air spacers may extend from a top portion of a respective one of the contact plugs but may not extend beyond a bottom portion of one of the bit line structures adjacent thereto.

In some embodiments, an upper spacer may be positioned directly above a respective one of the air spacers and may separate a sidewall of a respective one of the contact plugs adjacent thereto from a sidewall of a respective one of the bit line structures adjacent thereto. The upper spacer may define an upper boundary of the respective one of the air spacers therebelow.

In some embodiments, the bit line structures may respectively include a bit line extending in the second direction, and a hard mask pattern stacked on the bit line. The upper spacer may be positioned on the sidewall of the respective one of the bit line structures, and the sidewall of the respective one of the bit line structures may be defined by the hard mask pattern.

In some embodiments, the upper spacer may extend along an upper portion of the sidewall of the respective one of the bit line structures in the second direction, and the upper spacer may be discontinuous on the sidewall of the respective one of the bit line structures along the second direction.

In some embodiments, the upper spacer may be one of a solid insulating material and a conductive material.

In some embodiments, the upper spacer may extend along a portion of the sidewall of the respective one of the bit line structures along the second direction beyond the contact plug.

In some embodiments, the upper spacer may be an insulating material.

In some embodiments, portions of the neighboring ones of the bit line structures may extend beyond the contact plugs in the second direction and may be spaced apart from one another by respective second gaps along the first direction. The second gaps may define respective air gaps between the portions of the neighboring ones of the bit line structures.

In some embodiments, portions of the neighboring ones of the bit line structures may extend beyond the contact plugs in the second direction and may be spaced apart from one another in the first direction by respective second gaps. An insulation interlayer may fill the respective second gaps between the portions of the neighboring ones of the bit line structures.

In some embodiments, an etch protection layer may cover sidewalls of the bit line structures and may include portions that laterally extend along the first direction beneath the air spacers. The laterally extending portions of the etch protection layer may define a lower boundary of the air spacers thereabove.

In some embodiments, a capacitor may extend through the upper insulation layer to contact at least one of the contact plugs.

In some embodiments, neighboring ones of the bit line structures adjacent to each other in a peripheral region of the substrate may be spaced apart from each other by respective second gaps in the first direction. The second gaps may be filled with air and may define respective air gaps between the neighboring ones of the bit line structures in the peripheral region of the substrate.

In some embodiments, a method of fabricating an integrated circuit device includes forming a structure on a substrate, the structure including at least one pad contact. A plurality of bit line structures are formed on the substrate and spaced apart from one another along a first direction. The bit line structures extend in a second direction substantially perpendicular to the first direction. Respective contact plugs are formed between neighboring ones of the bit line structures and are spaced apart therefrom by first gaps in the first direction. The first gaps define respective air spacers that electrically insulate the neighboring ones of the bit line structures from the respective contact plugs therebetween. An upper insulation layer is formed on the air spacers and the bit line structures.

In some embodiments, in forming the respective contact plugs, an insulation layer may be formed on the substrate to cover the bit line structures. The insulation layer may be partially removed to form contact holes through which sidewalls of the bit line structures are exposed. Sacrificial spacers may be formed on the sidewalls of the bit line structures exposed through the contact holes, and the respective contact plugs may be formed in the contact holes including the sacrificial spacers therein. Then, the sacrificial spacers may be at least partially removed from the sidewalls of the bit line structures such that the contact plugs and the sidewalls of the bit line structures may be spaced apart from each other by the first gaps to define the air spacers.

In some embodiments, in forming the contact plugs, an upper portion of at least one of the sacrificial spacers may be removed to provide an upper gap space defined by a remaining portion of the at least one of the sacrificial spacers. An upper spacer may be formed in the upper gap space. The upper spacer may separate an upper portion of a respective one of the contact plugs adjacent thereto from an upper portion of a respective one of the bit line structures adjacent thereto in such a manner that the respective one of the contact plugs may be enclosed or surrounded by the upper spacer.

In some embodiments, the upper spacer may be one of a solid insulating material and a conductive material.

In some embodiments, the upper spacer may be a material having etching selectivity with respect to the sacrificial spacers.

In some embodiments, in forming the contact plugs, the insulation layer may be removed from the substrate before removing the sacrificial spacers such that portions of the neighboring ones of the bit line structures extending beyond the respective contact plugs in the second direction may be spaced apart from one another by respective second gaps along the first direction. The second gaps may define respective air gaps between the portions of the neighboring ones of the bit line structures.

In some embodiments, in forming the contact plugs, sacrificial spacers may be formed on sidewalls of the bit line structures, and an insulation layer may be formed on the substrate to a thickness sufficient to cover the bit line structures. The insulation layer may be partially removed from the substrate to form contact holes through which portions of the sacrificial spacers are exposed, and the respective contact plugs may be formed in the contact holes such that the sacrificial spacers contact the respective contact plugs. The sacrificial spacers may be at least partially removed such that the respective contact plugs and the bit line structures adjacent thereto may be spaced apart from one another by the first gaps to define the air spacers between the contact plugs and the bit line structures.

In some embodiments, in forming the contact plugs, an upper portion of at least one of the sacrificial spacers may be removed to form an upper gap space defined by a remaining portion of the at least one of the sacrificial spacers, and an upper spacer may be formed in the upper gap space. The upper spacer may extend on a sidewall of an upper portion of a respective one of the bit line structures in the second direction. The upper spacer may be an insulation material.

Thus, according to some example embodiments of the present inventive concept, an air spacer may be interposed between the contact plug and the conductive structure and an air gap may be interposed between neighboring ones of the conductive structures adjacent to each other. Thus, due to the relatively low dielectric constant of the air spacers, a loading capacitance between the conductive structure and the contact plug may be reduced even though the conductive structure and the contact plug may be positioned relatively close to each other. In addition, the loading capacitance between the immediately adjacent ones of the conductive structures may also be reduced due to the air gap therebetween.

As such, a signal speed may be improved in integrated circuit devices according to some embodiments, and refresh characteristics and/or operational speed of the integrated circuit devices may be improved due to the reduction of the loading capacitance.

BRIEF DESCRIPTION OF THE DRAWINGS

Example embodiments will be more clearly understood from the following detailed description taken in conjunction with the accompanying drawings.

FIGS. 23A to 24A illustrate processing steps for a method of fabricating the DRAM device shown in FIGS. 21A-21B and 22;

FIGS. 27A to 29A illustrate processing steps for a method of fabricating the DRAM device shown in FIG. 25A;

FIGS. 33A to 35A illustrate processing steps for a method of fabricating the DRAM device shown in FIG. 31A.

DETAILED DESCRIPTION OF THE EMBODIMENTS

Figure 1:
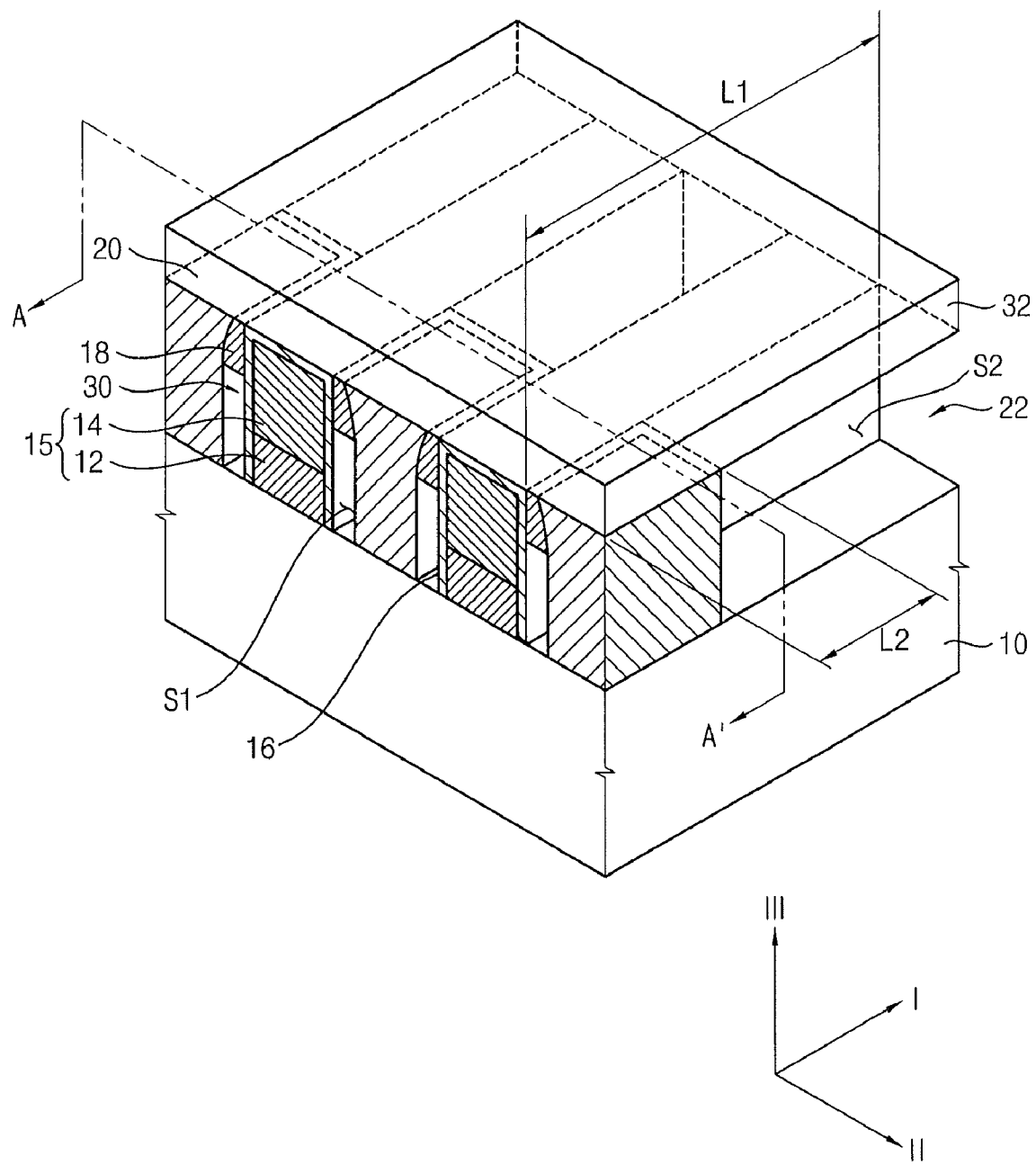
FIG. 1 is a perspective view illustrating an integrated circuit device in accordance with some embodiments of the present inventive concept.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As described herein, a "spacer" or "upper spacer" may refer to any structure that electrically insulates one conductive structure from another, while an "air spacer" refers to an insulating structure in which air, in the absence of other insulating materials, provides electrical insulation.

Hereinafter, example embodiments will be explained in detail with reference to the accompanying drawings.

Embodiment I

Figure 2:
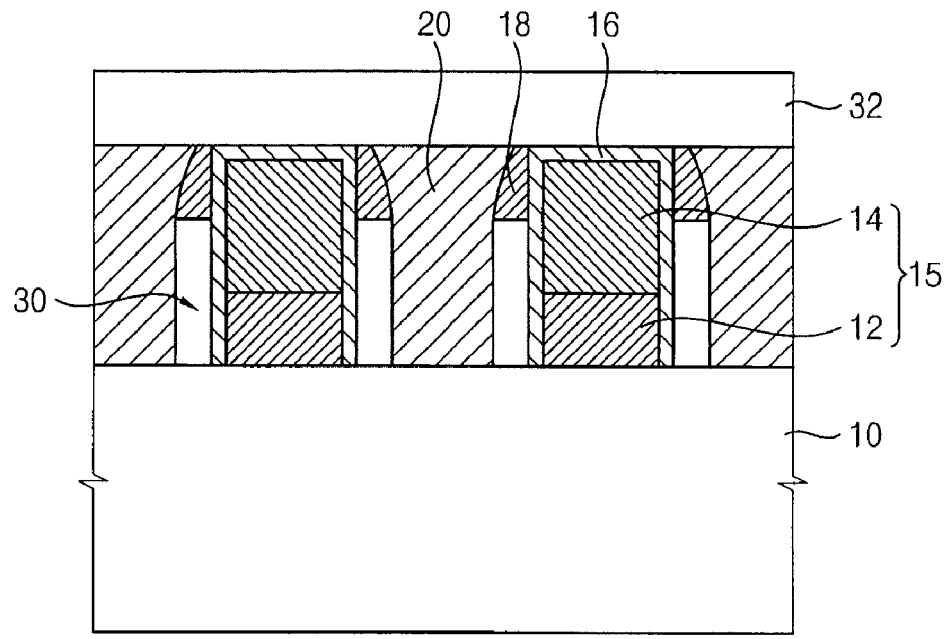
FIG. 2 is a cross-sectional view taken along a line A-A' in FIG. 1.

FIG. 1 is a perspective view illustrating an integrated circuit device in accordance with some embodiments of the present inventive concept and FIG. 2 is a cross-sectional view taken along a line A-A' in FIG. 1.

Referring to FIGS. 1 and 2, a plurality of conductive structures 15 may be provided on a substrate 10 and each of the conductive structures 15 may include a conductive pattern 12 and a hard mask pattern 14 on the conductive pattern 12.

In an example embodiment, the conductive pattern 12 may comprise semiconductor material doped with impurities, metal material, metal nitride, metal silicide, etc. These may be used alone or in combinations thereof. In the present example embodiment, the conductive pattern 12 may include a single layer or a multilayer having at least two thin layers stacked on the substrate 10, and may define a line extending in a first direction.

An underlying structure (not shown) and an insulation interlayer (not shown) for covering the underlying structure may be further provided on the substrate 10. In such a case, the conductive pattern 12 may be provided on the insulation interlayer.

The hard mask pattern 14 may comprise silicon nitride and may have a width substantially identical to that of the conductive pattern 12, and thus an upper surface of the conductive pattern 12 may be covered with the hard mask pattern 14. Thus the conductive structure 15 including the conductive pattern 12 and the hard mask pattern 14 may have a first length L1 in the first direction.

An etch protection layer 16 may be positioned on an upper surface and a sidewall of the hard mask pattern 14, a sidewall of the conductive pattern 12 and a portion of an upper surface of the substrate 10. For example, the etch protection layer 16 may comprise silicon nitride. Thus, the sidewall of the conductive pattern 12 may be protected from a subsequent etching process by the etch protection layer 16. However, no etch protection layer may be provided around the conductive structure 15 in some embodiments.

An upper spacer 18 may be provided at an upper portion of the hard mask pattern 14 which may be covered with the etch protection layer 16. Thus, the upper spacer 18 may be extended downward from a top portion of the hard mask pattern 14 in a configuration such that a bottom portion of the upper spacer 18 may be higher than the upper surface of the conductive pattern 12.

At least one contact plug 20 may be interposed between neighboring ones (e.g., immediately adjacent ones) of the conductive structures 15. In the present example embodiment, an upper surface of the contact plug 20 may be coplanar with an upper surface of the upper spacer 18 and the upper surface of the hard mask pattern 14 or the upper surface of the etch protection layer 16 (if provided).

Thus, the upper spacer 18 may be interposed between the conductive structure 15, which may or may not be covered with the etch protection layer 16, and the contact plug 20. More particularly, an upper side surface of the contact plug 20 may be covered with the upper spacer 18 and each of the upper spacers 18 making contact with the upper side surface of the contact plug 20 may be isolated from each other. Thus, the upper spacer 18 may be individually positioned on the upper portion of the hard mask pattern 14 independently from each other. The upper spacer may define an air spacer therebelow, as described in detail as follows.

As shown in FIGS. 1 and 2, a first space S1 is positioned below the upper spacer 18 and is defined between the conductive structure 15 and the contact plug 20. The first spacer S1 may provide a void (e.g., without any kind of thin layers and merely filled with air), to thereby form an air spacer 30 under the upper spacer 18. In addition, the contact plug 20 and the upper spacer 18 may have a second length L2 that is much shorter than the first length L1 in the first direction, and thus a second spacer S2 is defined by the contact plug 20 and the neighboring conductive structures 15. The second spacer S2 may also provide a void (e.g., without any kind of thin layers and merely filled with air), to thereby form an air gap 22 between the conductive structures 15. Thus, the air spacer 30 and the air gap 22 may be connected to each other.

Accordingly, the conductive pattern 12 and the contact plug 20 may face or may be separated from each other not by the medium of a high dielectric thin layer but by the medium of air having a relatively low dielectric constant, thus reducing the potential for parasitic capacitance between the conductive pattern 12 and the contact plug 20. As a result, the component of the loading capacitance caused by the first parasitic capacitance may be reduced between the conductive pattern 12 and the contact plug 20 (also referred to herein as a "first" parasitic capacitance or capacitor). In addition, the neighboring conductive structures 15 may face each other and may be separated from each other by the medium of air having low dielectric constant, thus reducing the potential for parasitic capacitance between the conductive patterns 12 of the neighboring conductive structures 15 (also referred to herein as a "second" parasitic capacitance or capacitor). As a result, the component of the loading capacitance caused by the second parasitic capacitance may be reduced between the conductive patterns 12 of the neighboring conductive structures 15.

An upper insulation layer 32 may be positioned on the contact plug 20, the upper spacer 18, the hard mask pattern 14 and the air gap 22. However, no upper insulation layer 32 may be filled into the air gap 22, to thereby maintain the shape of the air gap 22 despite of the upper insulation layer 32.

According to an example embodiment of the integrated circuit device, the air spacer 30 may be interposed between portions of the contact plug 20 and the conductive pattern 12 facing each other, to thereby reduce the component of the loading capacitance caused by the first parasitic capacitor between the conductive pattern 12 and the contact plug 20. In addition, the air gap 22 may be interposed between portions of the neighboring conductive structures 15 facing each other, to thereby reduce the component of the loading capacitance caused by the second parasitic capacitor between the conductive patterns. For example, the integrated circuit device may include a dynamic random access memory (DRAM) device, the conductive structure 15 may be a word line, and the contact plug 20 may be a contact plug between the neighboring word lines in the DRAM device.

Figure 3:
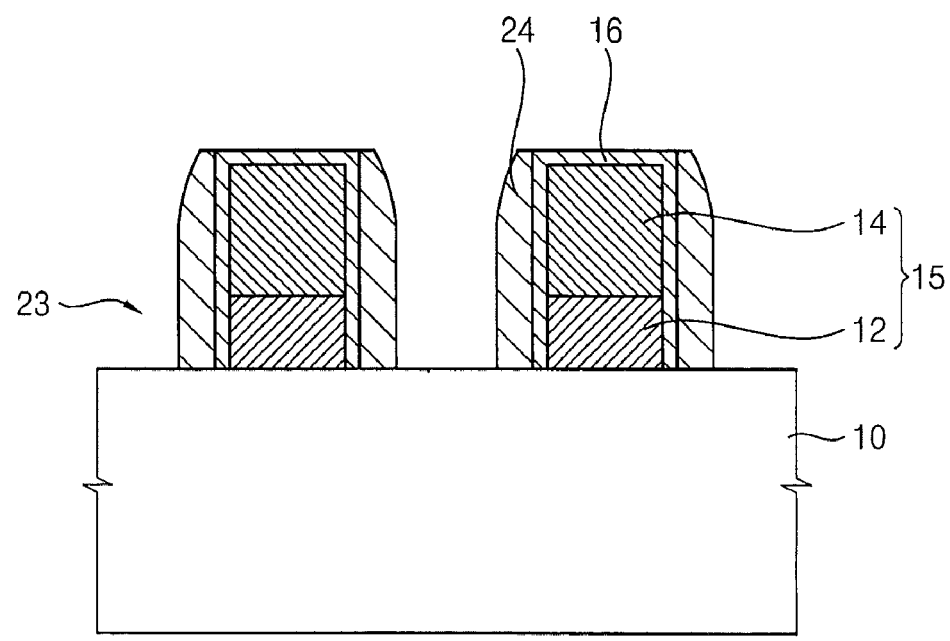
FIGS. 3 to 5 are cross-sectional view illustrating processing steps for a method of fabricating the integrated circuit device shown in FIG. 1.
Figure 4:
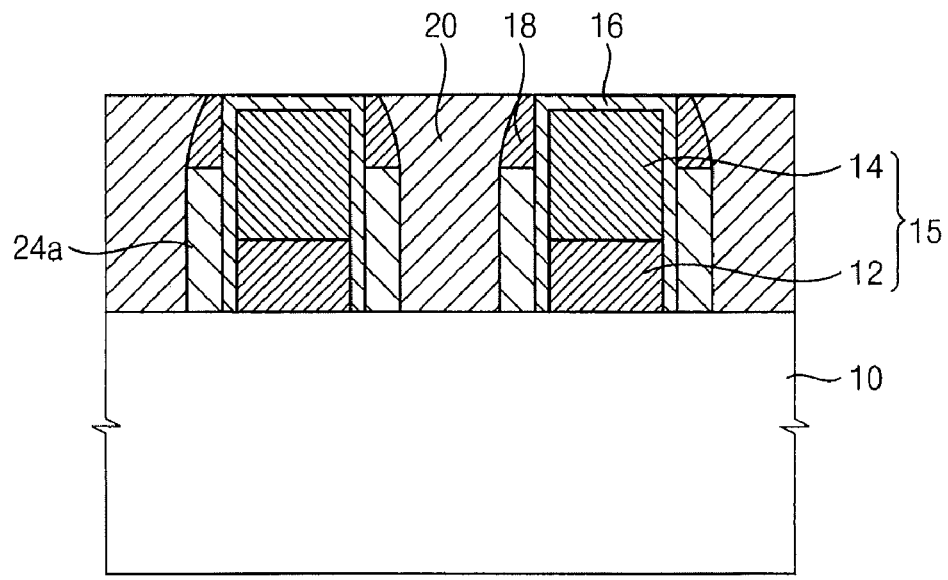
Figure 5:
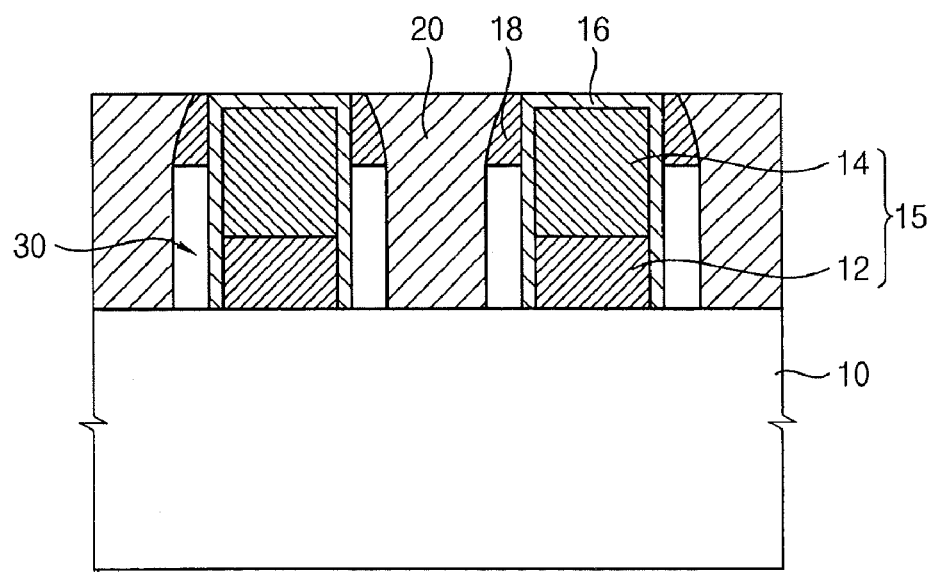

FIGS. 3 to 5 are cross-sectional views illustrating processing steps for a method of manufacturing the integrated circuit device shown in FIG. 1.

Referring to FIG. 3, a conductive layer (not shown) may be formed on the substrate 10. A hard mask pattern 14 may be formed on the conductive layer in a line extending in the first direction. The conductive layer may be partially removed from the substrate 10 by an anisotropic etching process using the hard mask pattern as an etching mask, to thereby form the conductive structure 15 in which the hard mask pattern 14 may be stacked on the conductive pattern 12. Thus, the conductive structure 15 may also be formed into a line-shaped pattern extending in the first direction.

The etch protection layer 16 may be optionally formed on the sidewalls and the upper surface of the conductive structure 15. No etch protection layer 16 may be formed on the sidewalls and the upper surface of the conductive structure 15 in accordance with some processing conditions.

An insulation interlayer (not shown) may be formed on the substrate 10 to a sufficient thickness to cover the conductive structure 15, and then the insulation interlayer may be partially removed from the substrate 10 by a planarization process until an upper surface of the conductive structure 15 or an upper surface of the etch protection layer 16 may be exposed. Then, the insulation interlayer may be partially removed from the substrate 10 between the neighboring conductive structures 15 and the etch protection layer 16 may also be removed from the substrate between the neighboring conductive structures 15, to thereby form a contact hole 23 through which the upper surface of the substrate 10 and the sidewalls of the neighboring conductive structures 15 may be exposed. For example, the contact hole 23 may be formed to have the second length L2 smaller than the first length L1 of the conductive structure 5. When the etch protection layer 16 may be formed on the sidewalls of the conductive structure 15, a surface of the etch protection layer 16 may be exposed through the contact hole 23.

A sacrificial layer (not shown) may be formed on the bottom and sidewalls of the contact hole 23, on the upper surface of the conductive structure 15 that may be covered with the etch protection layer 16 if necessary and on an upper surface of the insulation interlayer. For example, the sacrificial layer may have etching selectivity with respect to the etch protection layer 16 and the hard mask pattern 14 as well as the insulation interlayer. The sacrificial layer may comprise a material that may be easily dissolved in an etchant for a wet etching process. For example, the sacrificial layer may comprise silicon germanium.

The sacrificial layer may be partially removed by an anisotropic etching process, to thereby form a preliminary sacrificial spacer 24 on the sidewalls of the contact hole 23.

Referring to FIG. 4, a contact plug 20 may be formed in the contact hole 23 including the preliminary sacrificial spacer 24. Then, an upper portion of the preliminary sacrificial layer 24 may be removed to a depth in the third direction III, to thereby foam a sacrificial spacer 24a interposed between the contact plug 20 and the conductive structure 15. Thus, a gap space (not shown) may be formed between an upper portion of the conductive structure 15 and an upper portion of the contact plug 20 and between the upper portion of the contact plug 20 and the upper portion of the insulation interlayer.

An upper spacer 18 may be formed in the gap space between the upper portion of the conductive structure 15 and the contact plug 20 and between the upper portion of the conductive structure 15 and the insulation interlayer. The upper spacer 18 may have etching selectivity with respect to the sacrificial spacer 24a and the insulation interlayer.

Referring to FIG. 5, the insulation interlayer may be removed from the substrate 10 by a dry etching process or a wet etching process, to thereby form the air gap 22 between the neighboring conductive structures 15. The sacrificial spacer 24a may also be exposed to the air gap 22.

Thereafter, the sacrificial spacer 24a may be removed from the substrate 10 by a wet etching process, to thereby form the air spacer 30 under the upper spacer 18. In other words, the upper spacer 18 may provide an upper boundary for the air spacer 30.

Referring to again FIGS. 1 and 2, an upper insulation layer 32 may be formed on the contact plug 20 and the conductive structure 15 in such a manner that the air gap 22 is not filled by the upper insulation layer 32. Therefore, the air gap 22 may still remain between the neighboring conductive structures 15 although the conductive structures 15 may be covered with the upper insulation layer 32.

Accordingly, the loading capacitance between the neighboring conductive structures 15 may be sufficiently reduced.

Embodiment II

Figure 6:
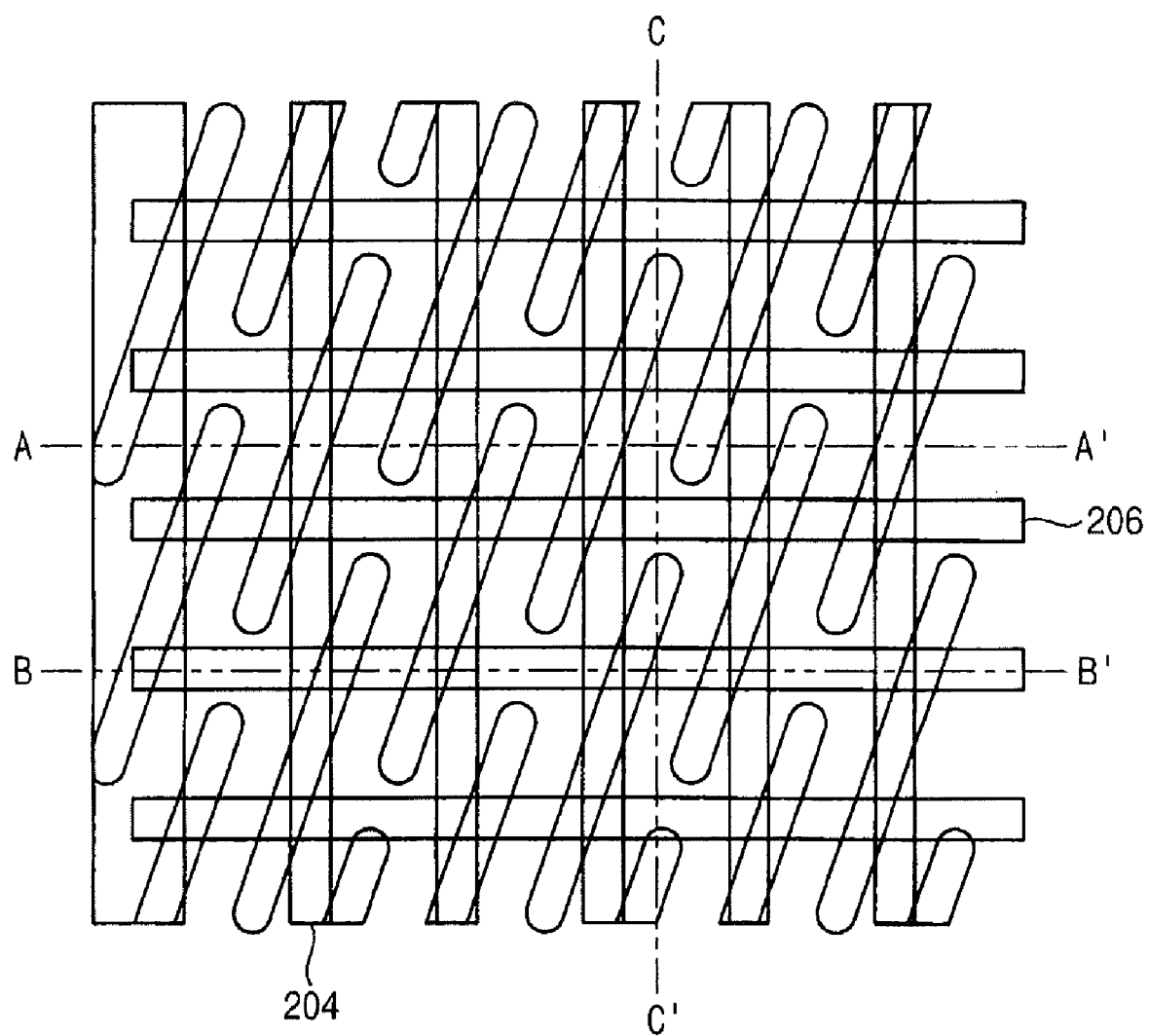
FIG. 6 is plan a view illustrating of a dynamic random access memory (DRAM) device in accordance with further embodiments of the present inventive concept.
Figure 7A:
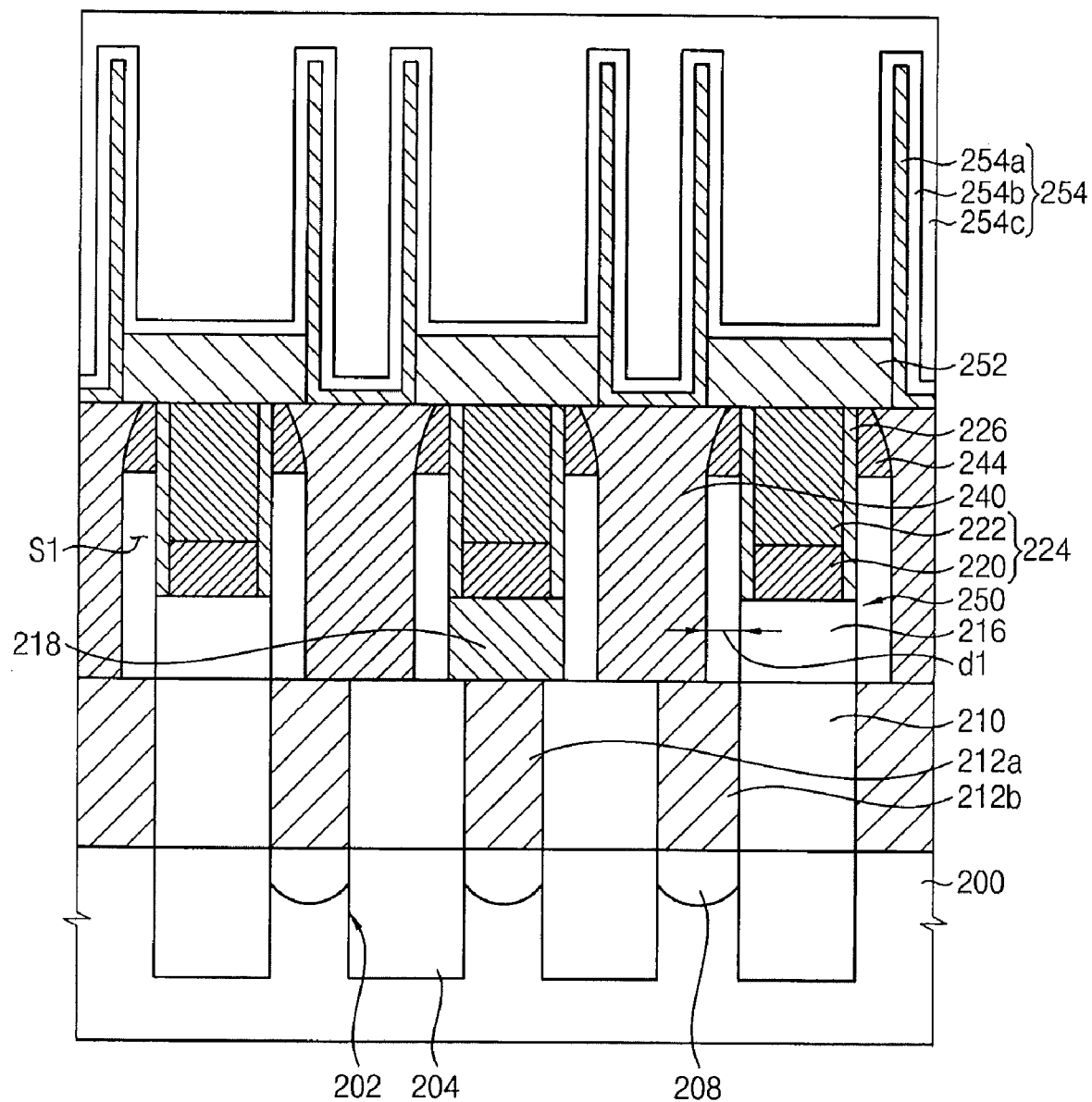
FIG. 7A is a cross-sectional view take along a line A-A' in FIG. 6.
Figure 7B:
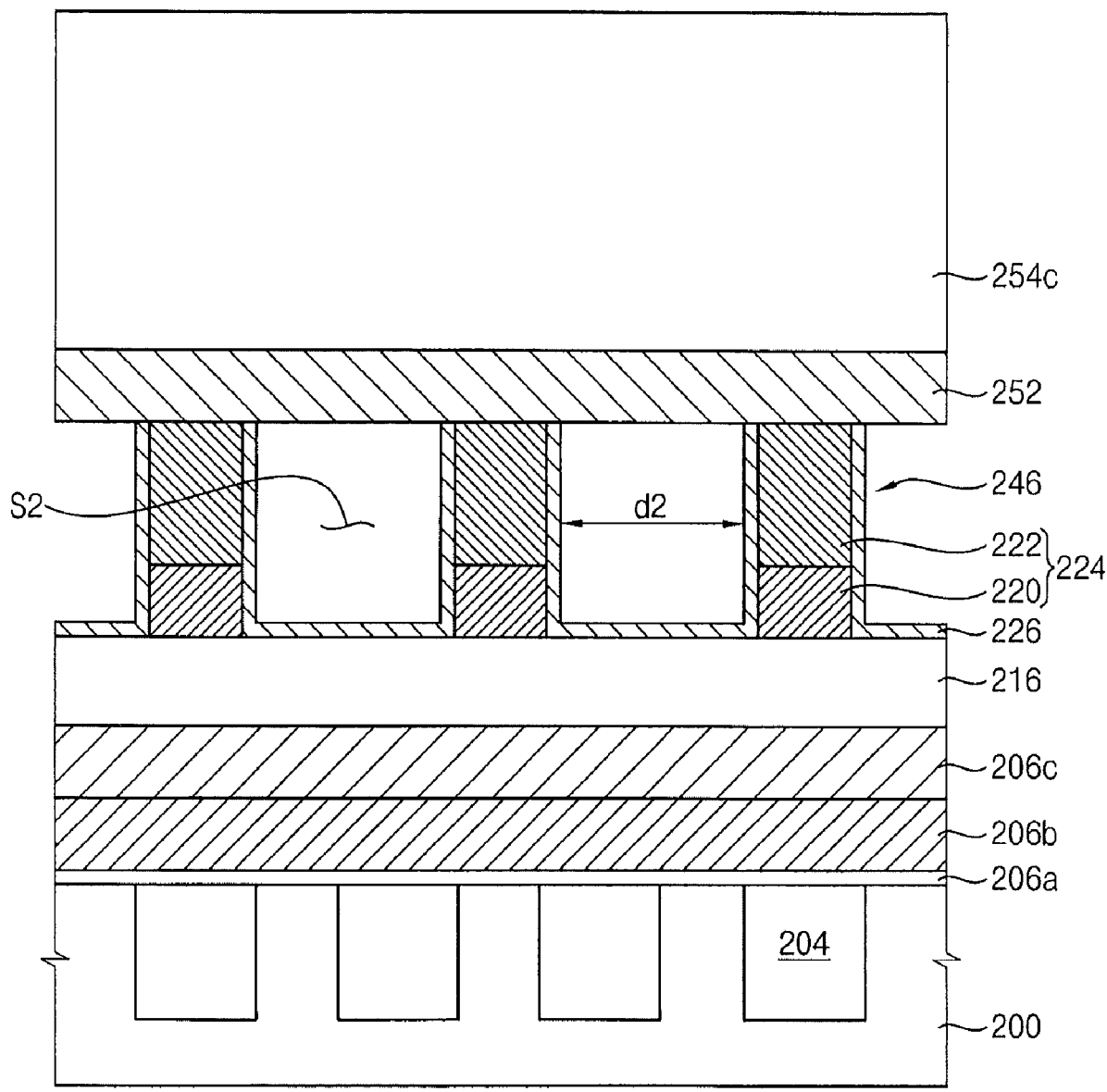
FIG. 7B is a cross-sectional view taken along a line B-B' in FIG. 6.
Figure 7C:
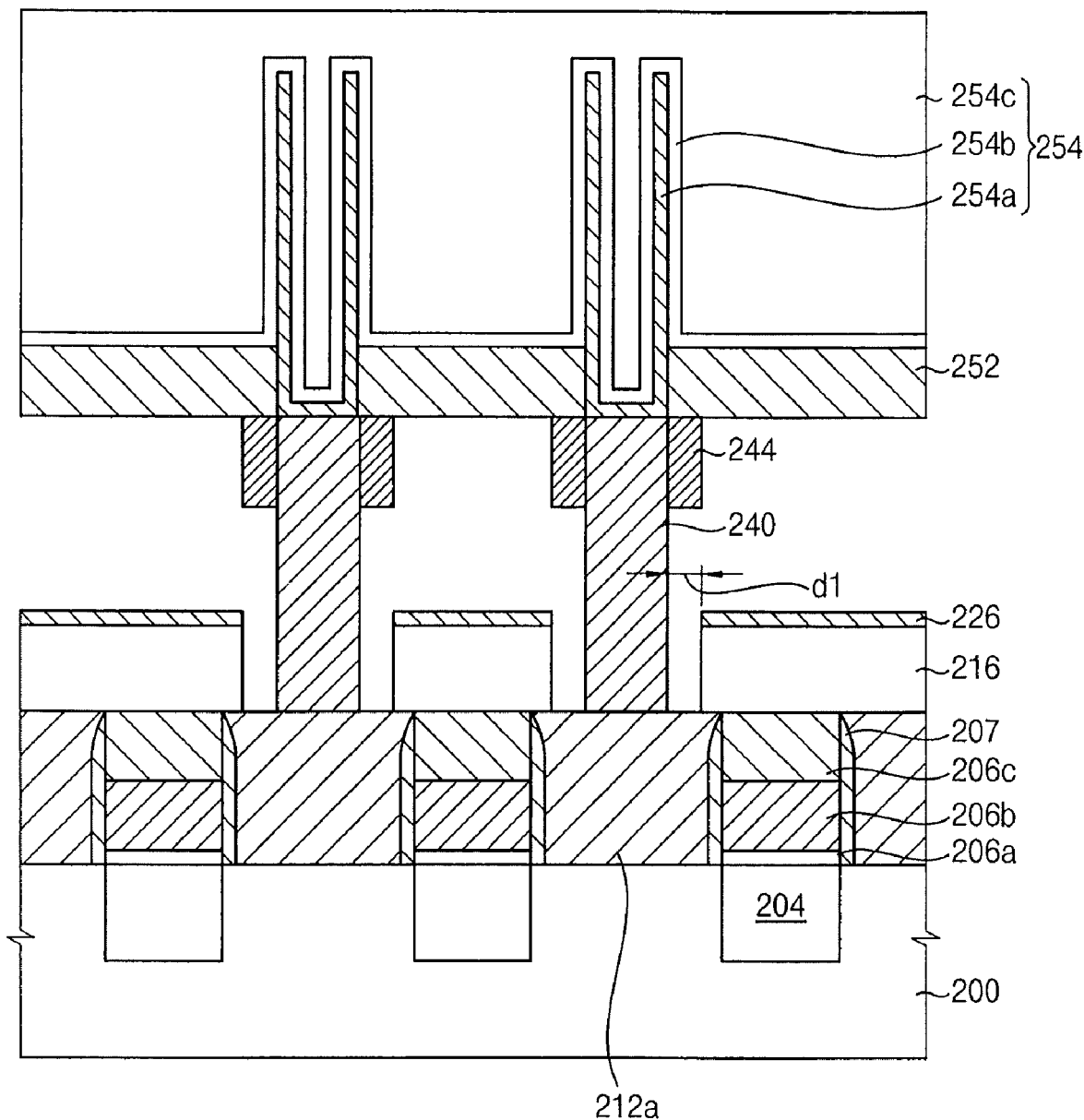
FIG. 7C is a cross-sectional view taken along a line C-C' in FIG. 6.
Figure 7D:
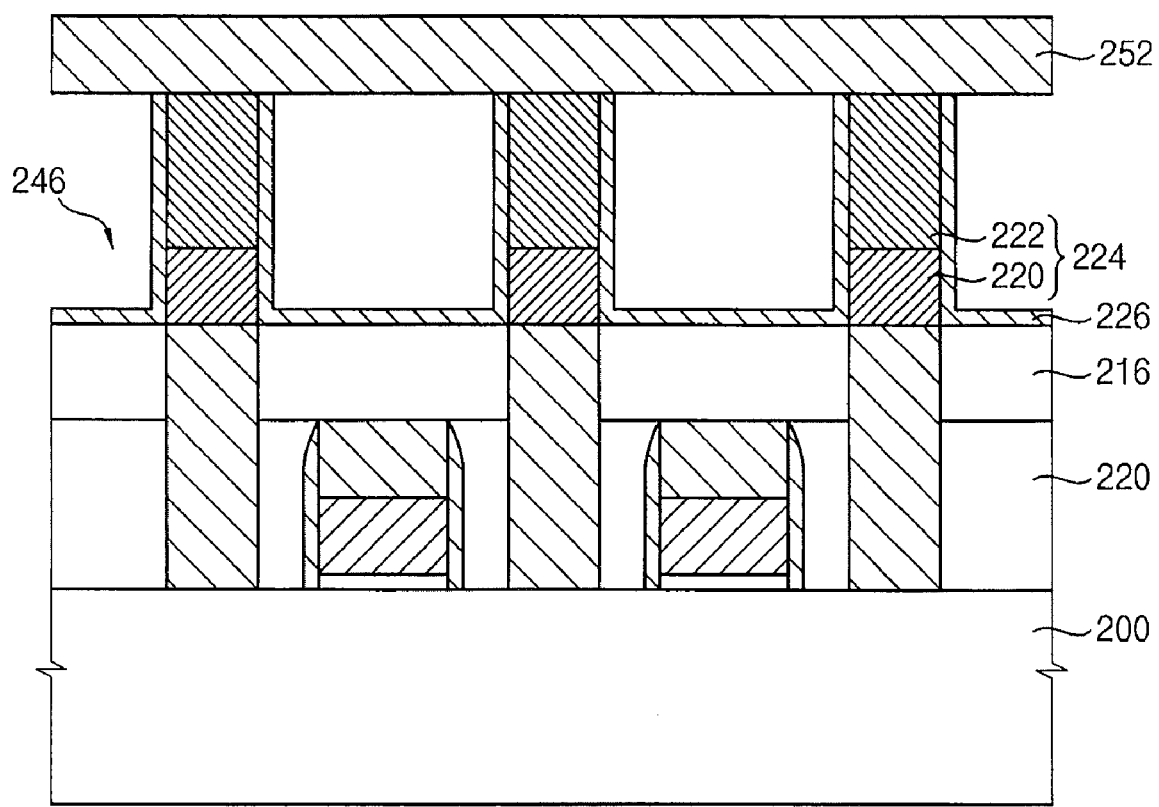
FIG. 7D is a cross-sectional view illustrating a peripheral circuit region of the DRAM device shown in FIG. 6.
Figure 8:
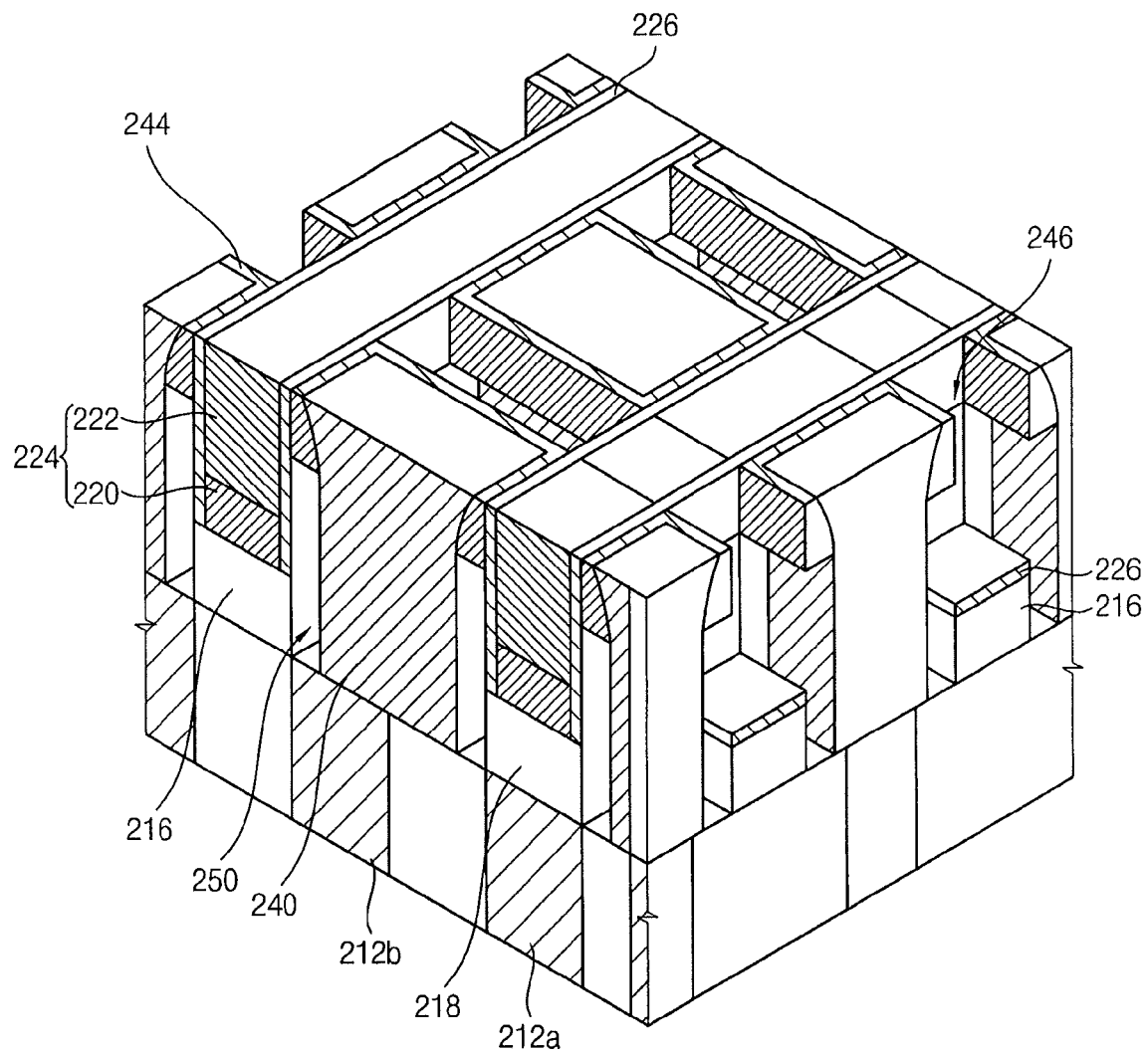
FIG. 8 is a perspective view illustrating a bit line portion of the DRAM device shown in FIG. 6.

FIG. 6 is a plan view illustrating a lay out of a dynamic random access memory (DRAM) device in accordance with further embodiments of the present inventive concept. FIG. 7A is a cross-sectional view taken along a line A-A' in FIG. 6 and FIG. 7B is a cross-sectional view taken along a line B-B' in FIG. 6. FIG. 7C is a cross-sectional view taken along a line C-C' in FIG. 6 and FIG. 7D is a cross-sectional view illustrating a peripheral circuit region of the DRAM device shown in FIG. 6. FIG. 8 is a perspective view illustrating a bit line portion of the DRAM device shown in FIG. 6. The DRAM devices in accordance with the remaining example embodiments of the present inventive concept, which will be described hereinafter, may have the same layout of the DRAM device shown in FIG. 6.

Referring to FIGS. 6 to 8, a substrate 200 including a plurality of active regions and a plurality of device isolation regions 204 may be prepared. Each of the active regions may be defined by the device isolation region 204 and thus may be isolated from each other on the substrate 200. The substrate 200 may be divided into cell regions in which memory cell structures may be positioned and peripheral regions in which various peripheral circuit patterns may be positioned.

MOS transistors may be arranged on the cell region of the substrate 200 and each of the MOS transistors may include a gate insulation layer 206a, a gate electrode 206b and source and drain regions or electrodes 208. In the present example embodiment, a hard mask pattern 206c may be positioned on the gate electrode 206b.

The gate electrode 206b may be shaped into a line extending in a first direction and may function as a word line 206 in the MOS transistor.

A first insulation interlayer 210 may be formed on the substrate 200 to a sufficient thickness to cover the MOS transistors. First and second pad contacts 212a and 212b may make contact with the source and drain electrodes 208, respectively, penetrating through the first insulation interlayer 210.

A second insulation layer 216 may be positioned on the first insulation layer 210. A bit line contact 218 may make contact with the first pad contact 212a in the second insulation layer 216.

A bit line 220 may be positioned on the second insulation layer 216 and may make contact with the bit line contact 218. The bit line may extend in a second direction perpendicular to the first direction and may comprise at least one of a semiconductor material doped with impurities, a metal, a metal nitride, a metal silicide and compositions thereof. For example, the bit line 220 may include a multi-layered structure in which a polysilicon layer, a tungsten nitride layer and a tungsten layer may be sequentially stacked on the second insulation layer 216.

A hard mask pattern 222 may be positioned on the bit line 220 and may have a line width that is substantially the same as that of the bit line 220. Thus, the hard mask pattern 222 may function as a mask pattern for patterning the bit line 220. For example, the hard mask pattern 222 may comprise silicon nitride and may have a height greater than that of the bit line 220. Thus, a bit line structure 224 including the bit line 220 and the hard mask pattern 222 may positioned on the second insulation layer 216.

An etch protection layer 226 may be arranged on a sidewall of the bit line 220, a surface of the hard mask pattern 222 and an upper surface of the second insulation interlayer 216. Thus, the sidewall of the bit line 220 may be protected from being etched in a subsequent process by the etch protection layer 226. For example, the etch protection layer 226 may have a thickness of about 300 Å or less and may comprise a material having etching selectivity with respect to the first and second insulation interlayers such as silicon nitride.

A storage node contact plug 240 may be positioned between neighboring bit line structures 224. That is, the storage node contact plug 240 may contact the second pad contact 212b penetrating through the second insulation interlayer 216 and may be spaced apart from the bit line structure 224 by a first gap distance d1.

An upper spacer 244 may be interposed between the upper sidewall of the hard mask pattern 222 of the bit line structure 224 and an upper sidewall of the storage node contact plug 240. As similarly described with reference to FIG. 5, the upper spacer 244 may enclose the upper portion of the storage node contact plug 240 and make contact with the upper sidewall of the hard mask pattern 222. Thus, the upper spacers 244 may be isolated from each other to thereby be electrically insulated from each other.

The upper spacer 244 may comprise an insulation material or a conductive material. For example, the upper spacer 244 may comprise silicon nitride or polysilicon. When the upper spacer 244 may comprise polysilicon, the upper spacer 244 may also function as a supplementary contact and thus a surface area of the storage node contact plug 240 may be enlarged at an upper portion thereof since the upper spacer 244 may electrically contact the upper portion of the storage node contact plug 240.

A lower surface of the upper spacer 244 may be higher than an upper surface of the bit line 220 of the bit line structure 224, and thus the upper spacer 244 may not be positioned on a sidewall of the bit line 220.

A first space S1 positioned below the upper spacer 244 and defined between the storage node contact 240 and the bit line structure 224 may provide a void (e.g., without any kind of thin layers and merely filled with air), to thereby form an air spacer 250 under the upper spacer 244. That is, spacer materials other than air may not be positioned on the sidewall of the bit line structure 224 in the first space S1 below the upper spacer 244. In the present example embodiment, the air spacer 250 may vertically extend from a lower surface of the upper spacer 244 to a lower portion of the storage node contact plug 240.

The bit line structure 224 may extend to a first length in the second direction, and the storage node contact 240 may have a second length smaller than the first length. Thus, some portions of the bit line structure 224 may face the storage node contact plug 240 and may be spaced apart therefrom by the first gap distance d1, while the other portions of the bit line structure 224 may directly face the neighboring bit line structure 224 without the storage node contact plug 240 therebetween, and may be spaced apart by a second gap distance d2. Thus, a second space or gap S2 defined between the neighboring bit line structures 224 and the storage node contact 240 may provide a void without any kind of thin layers and merely filled with air, to thereby form an air gap 246 between the neighboring bit line structures 224. Thus, the air spacer 250 and the air gap 246 may be interconnected to each other.

Accordingly, the air spacer 250 and the air gap 246 may be interposed between the neighboring bit line structures 224, and thus the storage node contact plug 240 and a pair of the neighboring bit line structures 224 may be separated from each other by a medium of air having a relatively low dielectric constant. Thus, the potential for a first parasitic capacitor to be formed between the bit line structure 224 and the storage node contact plug 240 and/or the potential for a second parasitic capacitor to be formed between the neighboring bit line structures 224 may be reduced. As a result, the components of the loading capacitance due to the first parasitic capacitor between the bit line structure 224 and the storage node contact 240 and/or the second parasitic capacitor between the neighboring bit line structures 224 may also be reduced.

In addition, the upper spacer 244 may be positioned on the sidewall of the hard mask pattern 222 of the bit line structure 224 but not on the sidewall of the bit line 220 of the bit line structure 224. Therefore, the upper spacer 244 may have little to no effect on the loading capacitance. Furthermore, the upper spacer 244 may improve stability of the DRAM cell structure in the MOS transistor.

As shown in FIG. 7D, the bit line structure 224 including the bit line 220 and the hard mask pattern 222 may also be positioned in the peripheral region of the substrate 200. A spacer (not shown) or no spacer may be positioned on a sidewall of the bit line structure 224 in the peripheral region of the substrate 200. Since contact plugs may not be arranged between the neighboring bit line structures 224 on the peripheral region of the substrate 200, upper spacers may not be provided in the peripheral region of the substrate 200, and thus air spacers may not be provided in the peripheral region of the substrate 200. That is, the air gap 246 (without the air spacer 250) may be provided between the neighboring bit line structures 224 in the peripheral region of the substrate 200.

An upper insulation layer 252 may be positioned on the storage node contact 240, the upper spacer 244, the hard mask pattern 222 and the air gap 246. The upper insulation layer 252 may not fill or otherwise extend into the air gap 246, to thereby maintain the air gap 246 as confined by the upper insulation layer 252. For example, the upper insulation layer 252 may comprise silicon nitride in some embodiments.

A capacitor 254 may penetrate through the upper insulation layer 242 and may make electrical contact with the storage node contact 240. For example, the capacitor 254 may be shaped into a cylinder and include a cylindrical lower electrode 254a, a dielectric layer 254b on a surface of the lower electrode 254a and an upper electrode 254c.

According to an example embodiment of the DRAM device shown in FIGS. 6 to 8, the first space between the bit line 220 and the storage node contact 240 may be filled up with a low-k material having a lower dielectric constant, such as air, in place of a high-k material having a higher dielectric constant. Thus, the loading capacitance may be reduced between the bit line 220 and the storage node contact 240. Further, the air gap 246 may be interposed between the neighboring bit lines 220 in the cell region and/or in the peripheral region of the substrate 200, to thereby reduce the loading capacitance between the neighboring bit lines in the DRAM device.

Accordingly, the loading capacitance may be significantly reduced in the DRAM device without increasing the gap distance between the bit line 220 and the storage node contact plug 240, to thereby efficiently increase the integration degree of the DRAM device. The reduction of the loading capacitance may improve the electronic characteristics of the DRAM device, such as the refresh period and/or the operational speed.

FIGS. 9A to 15D illustrate processing steps for a method of manufacturing the DRAM device shown in FIGS. 6 to 8.

Figure 13A:
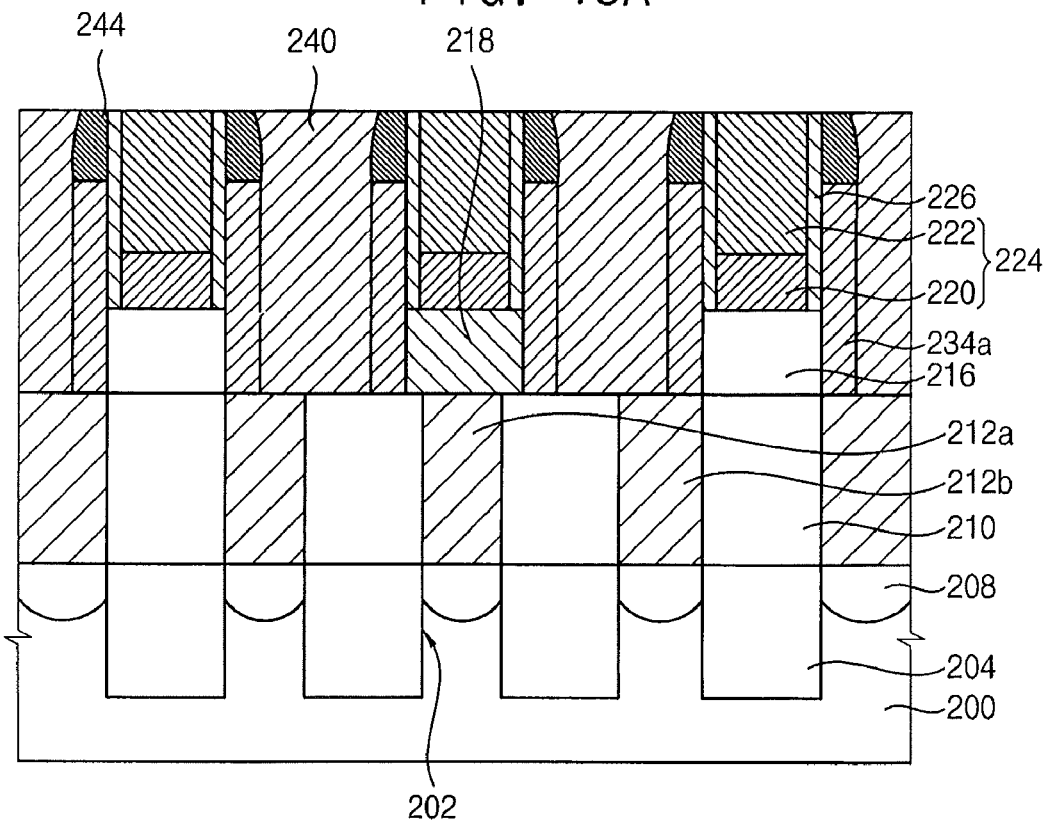
Figure 13B:
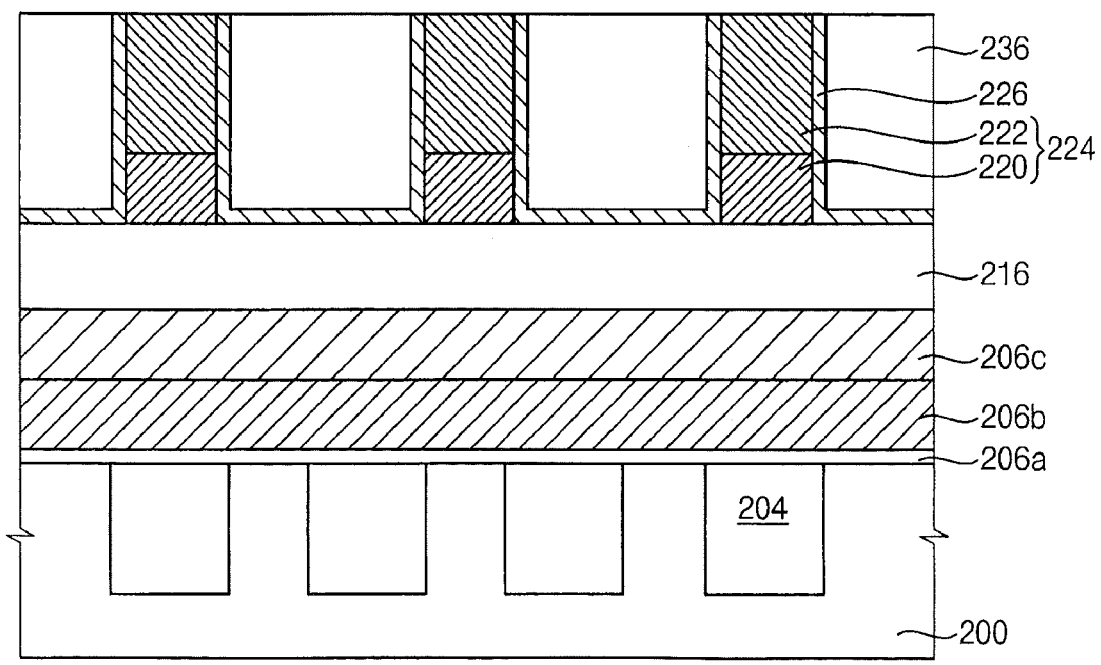
Figure 13C:
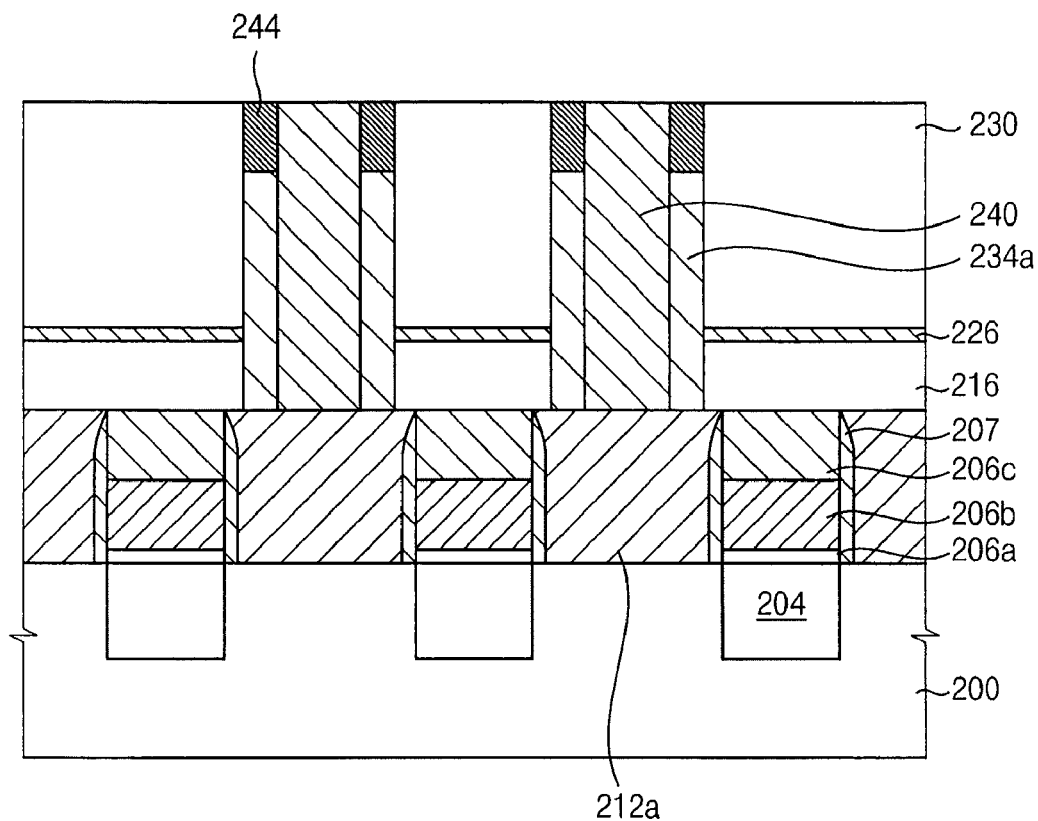
Figure 14:
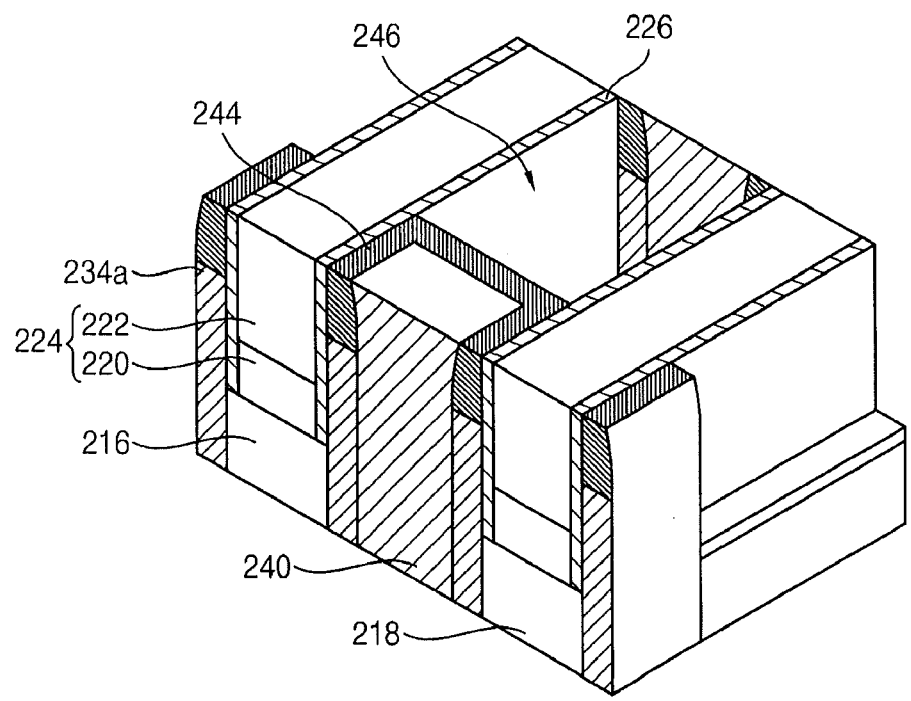
Figure 15A:
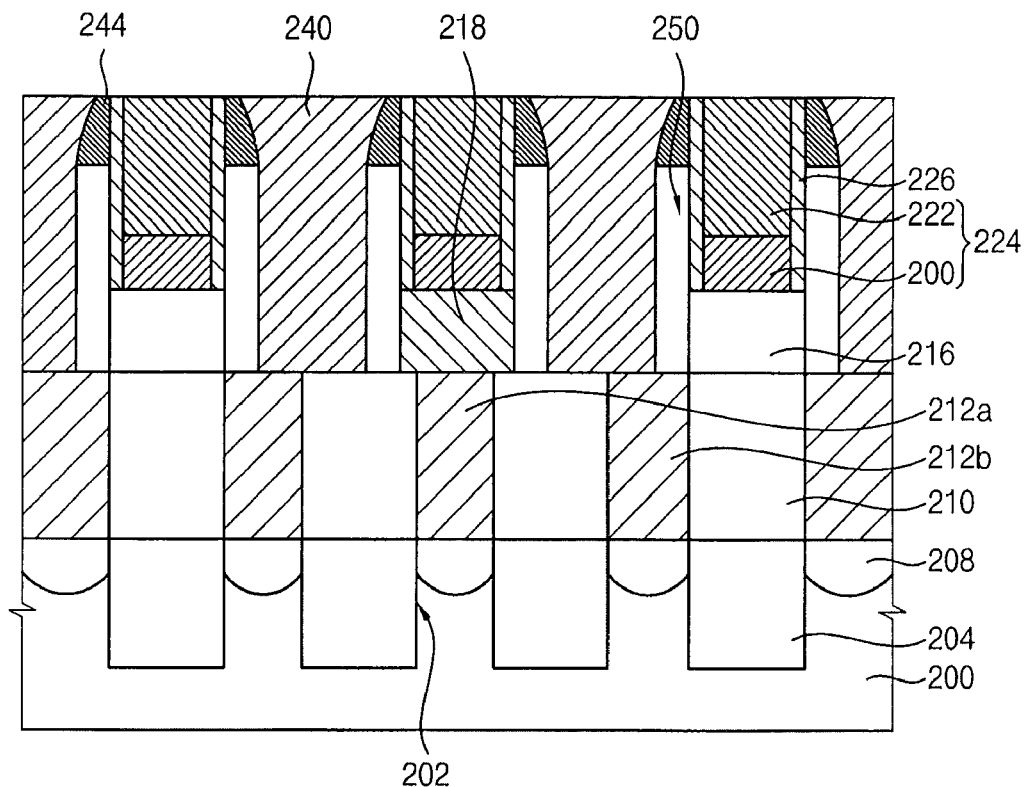
Figure 15B:
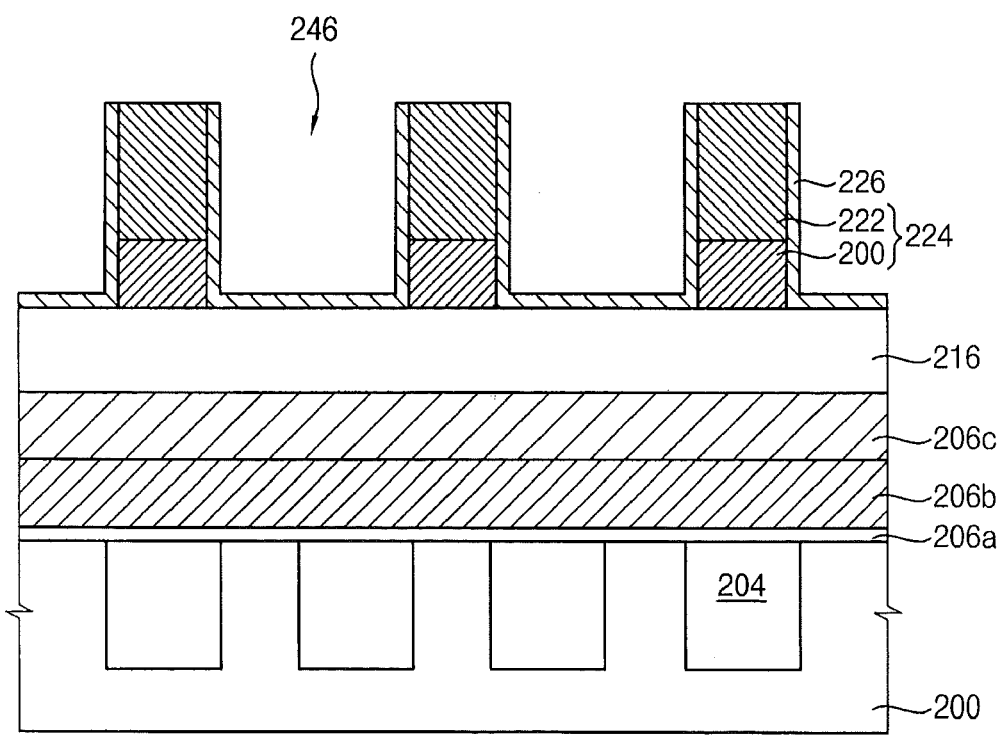
Figure 15C:
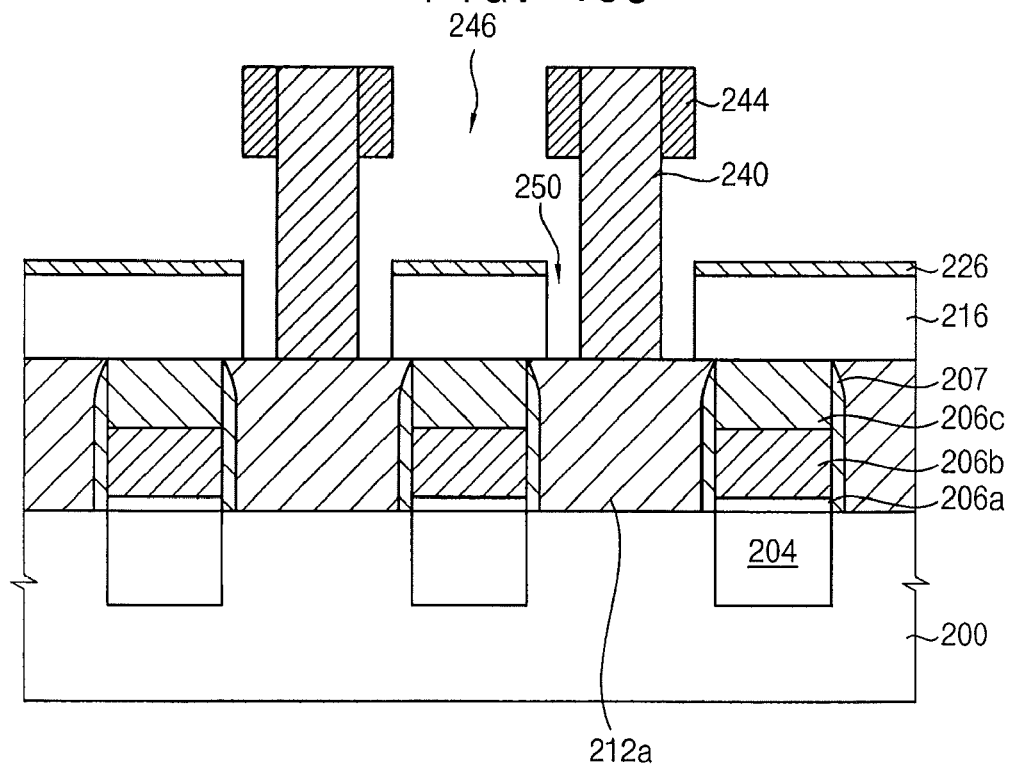
Figure 15D:
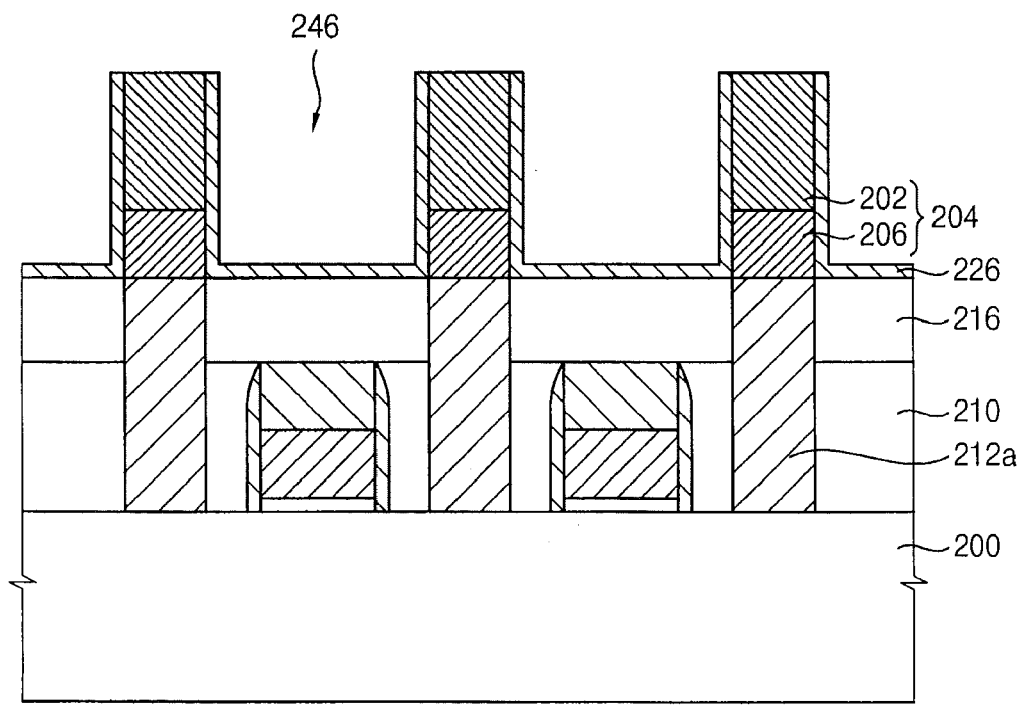

In FIGS. 9A to 15D, the capital letter 'A' in each FIG. number indicates a cross-sectional view cut along the line A-A' in FIG. 6 and the capital letter 'B' in each FIG. number indicates a cross-sectional view cut along the line B-B' in FIG. 6. In addition, the capital letter 'C' in each FIG. number indicates a cross-sectional view cut along the line C-C' in FIG. 6 and the capital letter 'D' in each FIG. number indicates a cross-sectional view illustrating a peripheral circuit region of the DRAM device. FIG. 14 is a perspective view illustrating the bit line of the DRAM device including the air gap.

Figure 9A:
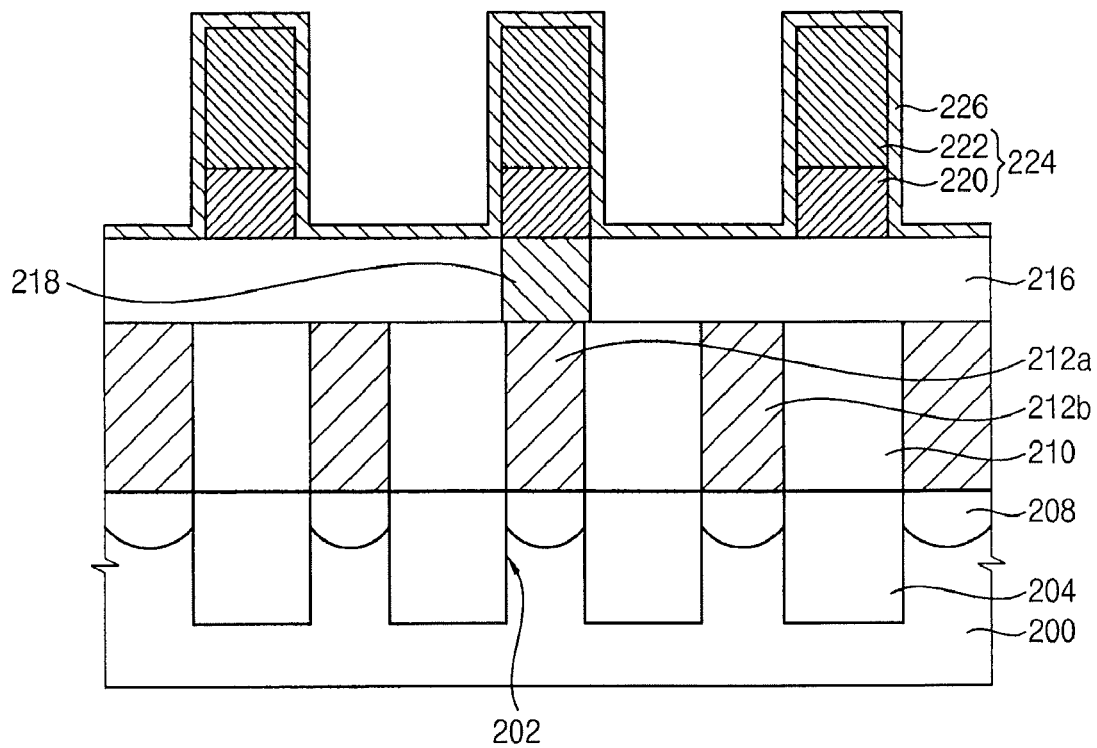
FIGS. 9A to 15D illustrate processing steps for a method of fabricating the DRAM device shown in FIGS. 6 to 8.
Figure 9B:
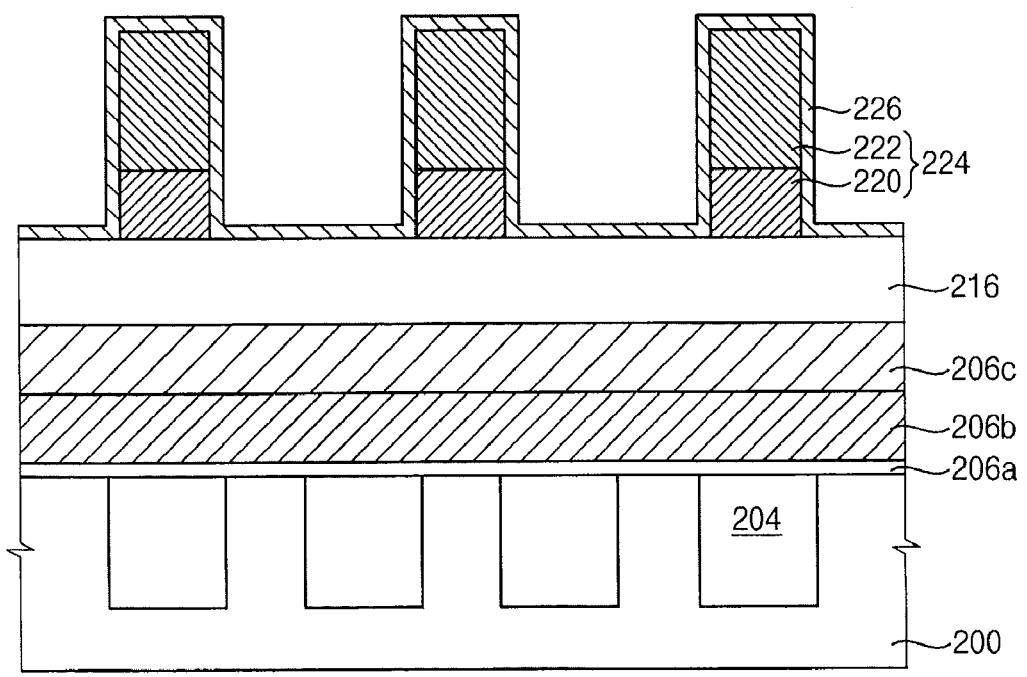
Figure 9C:
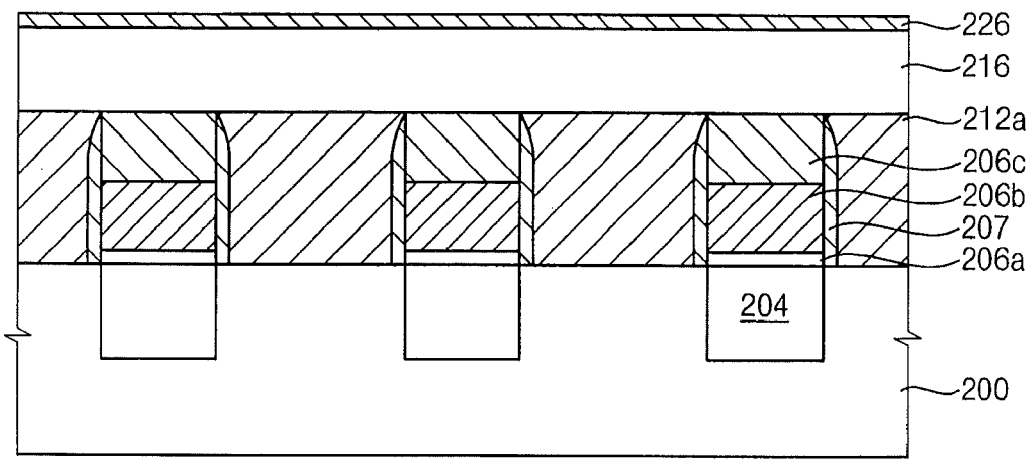

Referring to FIGS. 9A to 9C, a pad oxide layer (not shown) and a first hard mask layer (not shown) may be formed on the substrate 200. Then, the pad oxide layer and the first hard mask layer may be patterned into a pad oxide pattern (not shown) and a first hard mask pattern (not shown). The substrate 200 may be partially etched by an etching process using the first hard mask pattern as an etching mask, to thereby form a device isolation trench 202 on the substrate 200.

An insulation layer (not shown) may be formed on the substrate 200 to a sufficient thickness to fill up the device isolation trench 202 and may be polished by a planarization process, to thereby by form a device isolation pattern 204. Accordingly, an active region on which various conductive structures may be defined by the device isolation pattern 204 and isolated from each other on the substrate 200. Accordingly, the substrate 200 may be divided into the active region and a device isolation region on which the device isolation pattern 204 may be formed.

A gate structure including a gate insulation layer 206a, a gate electrode 206b and a hard mask pattern 206c may be formed on the active region of the substrate 200. Then, a spacer (not shown) may be formed on the sidewalls of the gate structure. Impurities may be implanted into surface portions of the substrate 200 adjacent to the gage electrode 206b, to thereby form the source and drain electrodes or regions 208 around the gate electrode 206b. Thus, a plurality of MOS transistors may be arranged on the substrate 200. The gate electrode 206b may be formed into a line extending in the first direction and may function as a word line of the MOS transistor.

A first insulation interlayer 210 may be formed on the substrate 200 to a sufficient thickness to cover the MOS transistors. The first insulation interlayer 210 may be partially removed from the substrate 200 by an etching process, to thereby form a first contact hole (not shown) through which the source and drain electrodes 208 may be exposed. Conductive materials may be filled into the first contact holes, to thereby form first and second pad contacts 212a and 212b making contact with the source and drain electrodes 208, respectively.

The second insulation interlayer 216 may be formed on the first insulation interlayer 210. Then, the second insulation interlayer 216 may be partially removed from the first insulation interlayer 210 by an etching process, to thereby form a second contact hole (not shown) through which the first pad contact 212a may be exposed. Conductive materials may be filled into the second contact holes, to thereby form the bit line contact pad 218 making electrical contact with the first pad contact 212a.

The bit line structure 224 in which the bit line 220 and the hard mask pattern 222 may be stacked may be formed on the second insulation interlayer 216 in such a manner that the bit line 220 may make electrical contact with the bit line contact pad 218. More particularly, a bit line conductive layer (not shown) and a hard mask layer (not shown) may be sequentially formed on the second insulation interlayer 216. For example, the hard mask layer may be formed by a chemical vapor deposition process and may comprise silicon nitride.

For example, the hard mask layer may be formed to be thicker than the bit line conductive layer. The hard mask layer may be patterned into a hard mask pattern 222 extending in a second direction substantially perpendicular to the first direction. Then, the bit line conductive layer may be partially removed from the second insulation interlayer 216 by an etching process using the hard mask pattern as an etching mask, to thereby form the bit line 220 on the second insulation interlayer 216. Therefore, the bit line 220 and the hard mask pattern 222 may be sequentially stacked on the second insulation interlayer 216, to thereby form the bit line structure 224 on the second insulation interlayer 216. Although not shown in figures, the bit line structure 224 may also be formed on the peripheral region of the substrate 200.

The etch protection layer 226 may be formed on an upper surface of the second insulation interlayer 216 and on sidewalls and an upper surface of the bit line structure 224. The sidewalls of the bit line structure 224 may thereby be sufficiently protected from being etched in a subsequent process by the etch protection layer 226. The etch protection layer 226 may comprise a material having etch selectivity with respect to the second insulation interlayer 216 such as silicon nitride. However, in some embodiments, the etch protection layer may not be provided around the bit line structure 224 and on the second insulation interlayer 216 for process simplification.

Figure 10A:
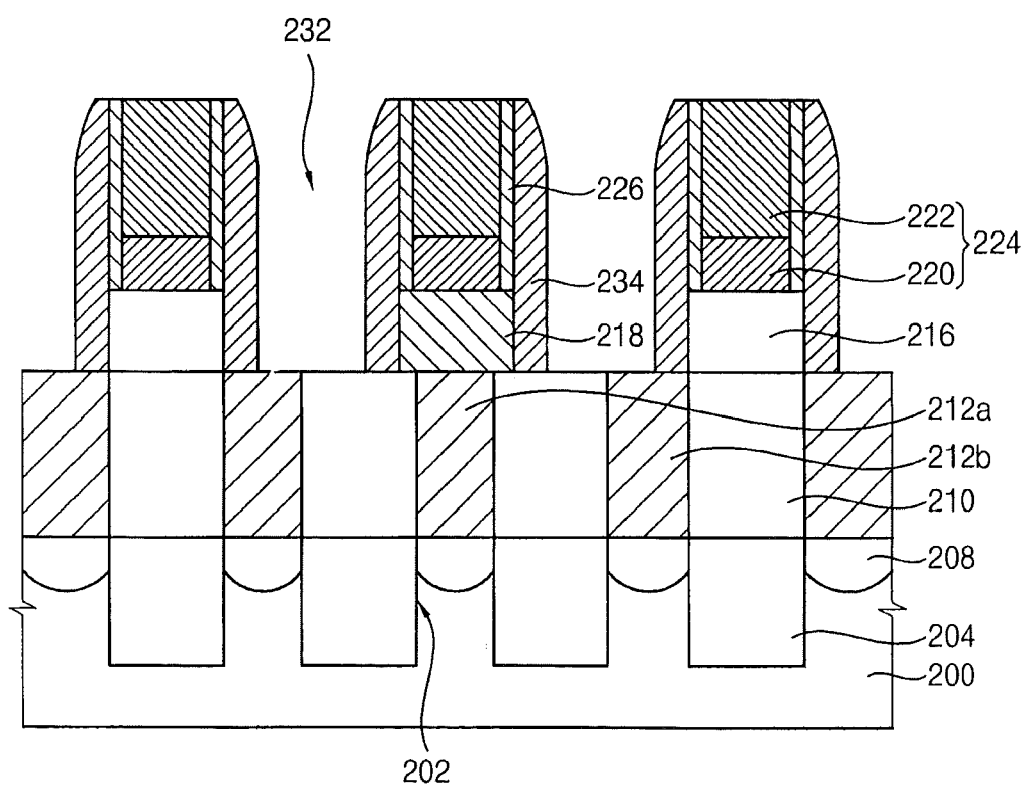
Figure 10B:
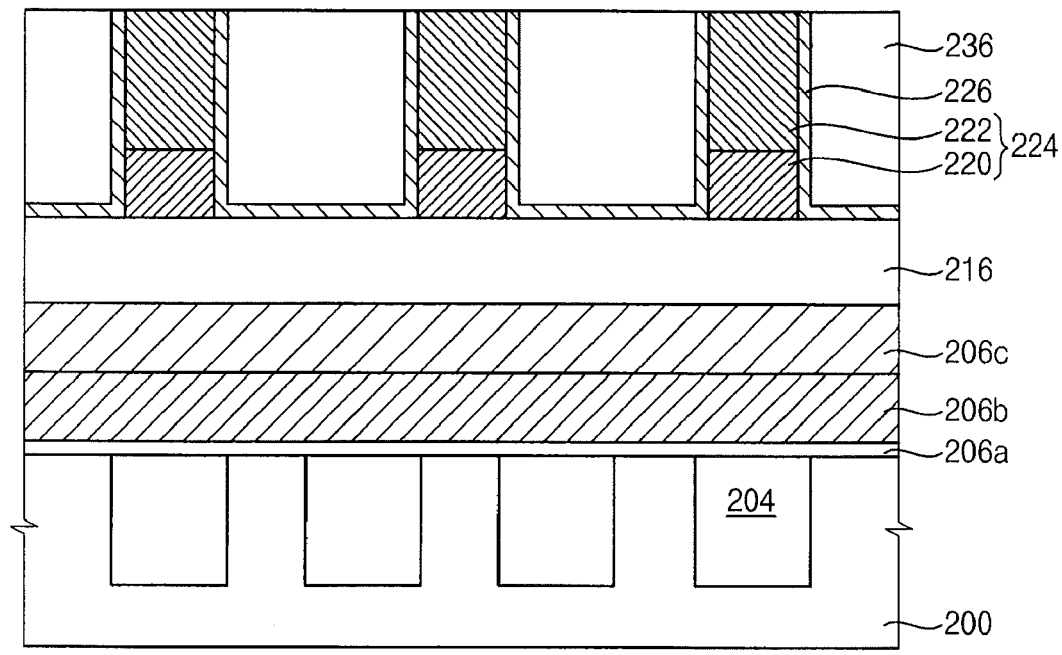
Figure 10C:
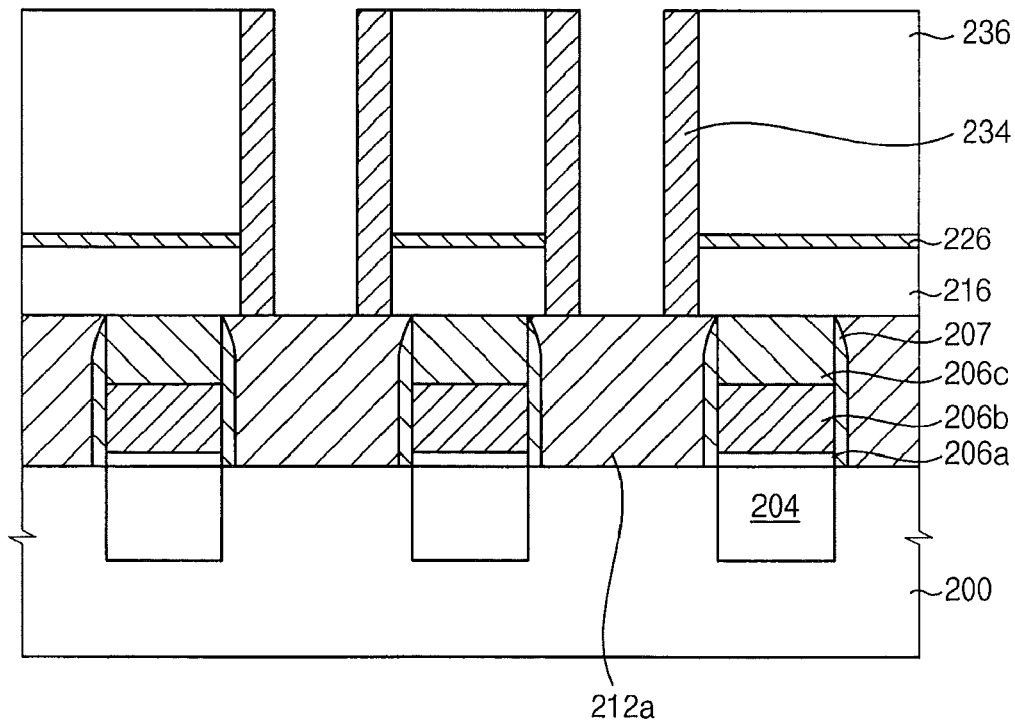

Referring to FIGS. 10A to 10C, a third insulation interlayer 236 may be formed on the second insulation interlayer 216 to a sufficient thickness to cover the bit line structure 224.

Then, the third insulation interlayer 236, the etch protection layer 226 and the second insulation interlayer 216 may be sequentially removed from the substrate 200 by a photolithography process, to thereby form a third contact hole 232 through which the second pad contact 212b may be exposed between the bit line structures 224. However, the third contact hole 232 may not be formed on the peripheral region of the substrate 200.

More particularly, a photo mask pattern for the photolithography process for forming the third contact hole 232 may be formed into a line having a length different from that of the bit line structure 224 in the second direction, and thus a first portion of the sidewall of the bit line structure 224, which may be covered with the etch protection layer 226, may be exposed through the third contact hole 232 after the photolithography process. In contrast, a second portion of the sidewall of the bit line structure 224 may still be covered with the third insulation interlayer as shown in FIGS. 10B and 10C.

Then, a sacrificial layer (not shown) may be formed on sidewall and bottom of the third contact hole 232, an upper surface of the bit line structure 224 and on an upper surface of the third insulation interlayer 236. For example, the sacrificial layer may comprise a material having etching selectivity with respect to the etch protection layer 226 and the hard mask pattern 222 as well as with respect to the second and third insulation interlayers 216 and 236. The sacrificial layer may comprise a material that may be easily dissolved in an etchant for a wet etching process. For example, the sacrificial layer may comprise silicon germanium.

The sacrificial layer may be partially removed by an anisotropic etching process, to thereby form a preliminary sacrificial spacer 234 on the sidewalls of the third contact hole 232. A thickness of the preliminary sacrificial spacer 234 may define the thickness of an air spacer in a subsequent process between the bit line structure 224 and the storage node contact 240, and thus the preliminary sacrificial spacer 234 may be formed to have a sufficient thickness in view of the thickness of the air spacer to be formed.

Figure 11A:
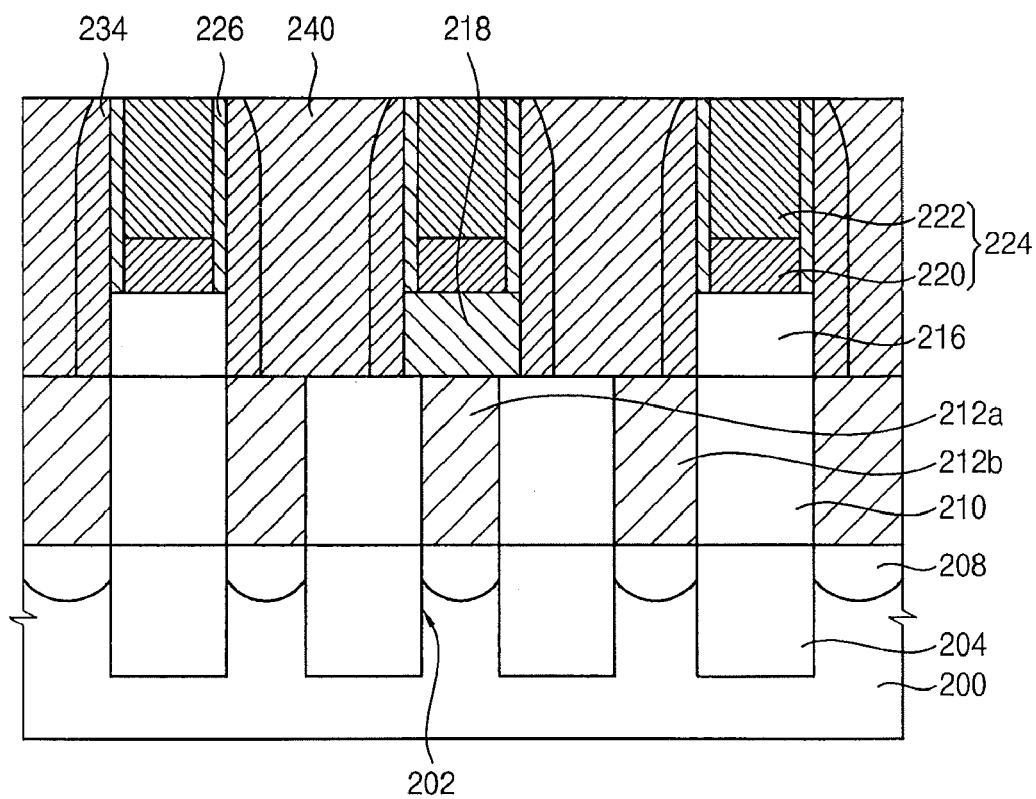
Figure 11B:
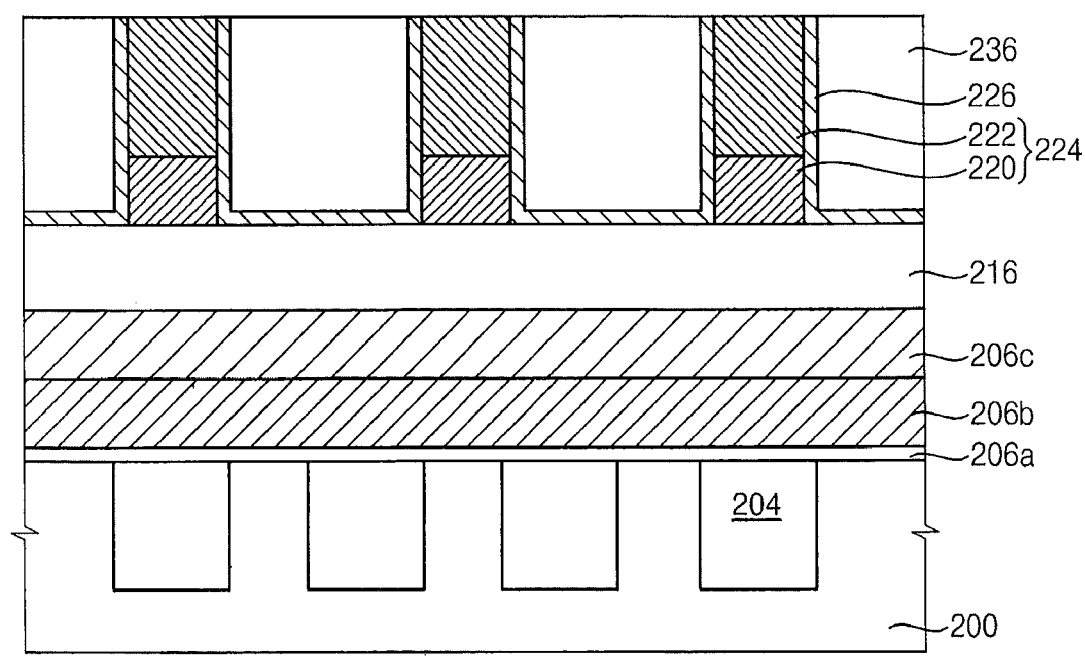
Figure 11C:
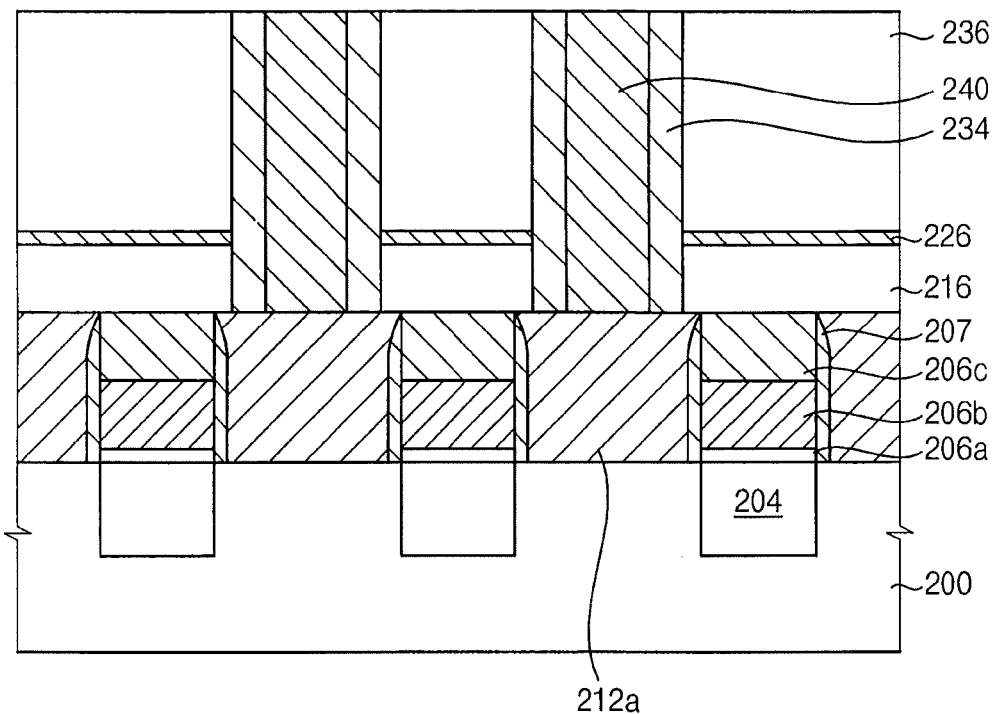

Referring to FIGS. 11A to 11C, a conductive layer (not shown) may be formed on the third insulation interlayer 236 to a sufficient thickness to fill up the third contact hole 232. Then, the conductive layer may be partially removed from the third insulation interlayer 236 by a planarization process until the upper surface of the third insulation interlayer 236 may be exposed.

Therefore, the conductive layer merely remains in the third contact hole 232, to thereby form the storage node contact 240 making contact with the second pad contact 212b in the third contact hole 232. That is, the preliminary sacrificial spacer 234 may be interposed between the bit line structure 224 and the storage node contact 240 while an upper surface of the preliminary sacrificial spacer 234 may exposed.

Figure 12A:
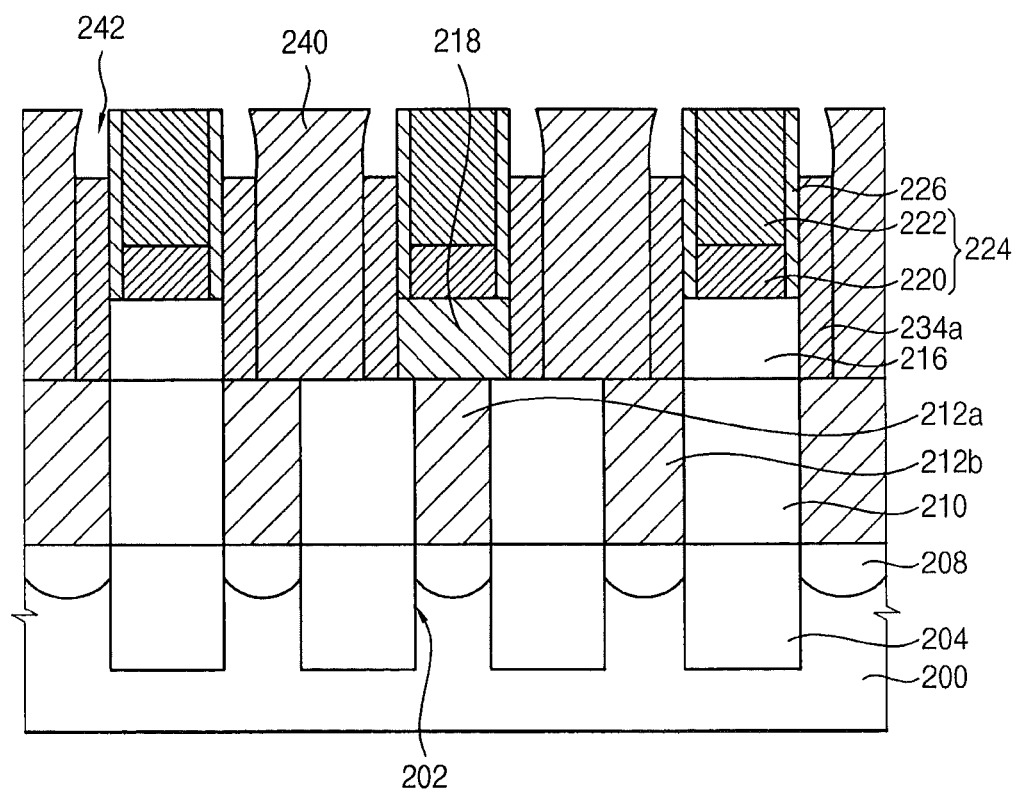
Figure 12B:
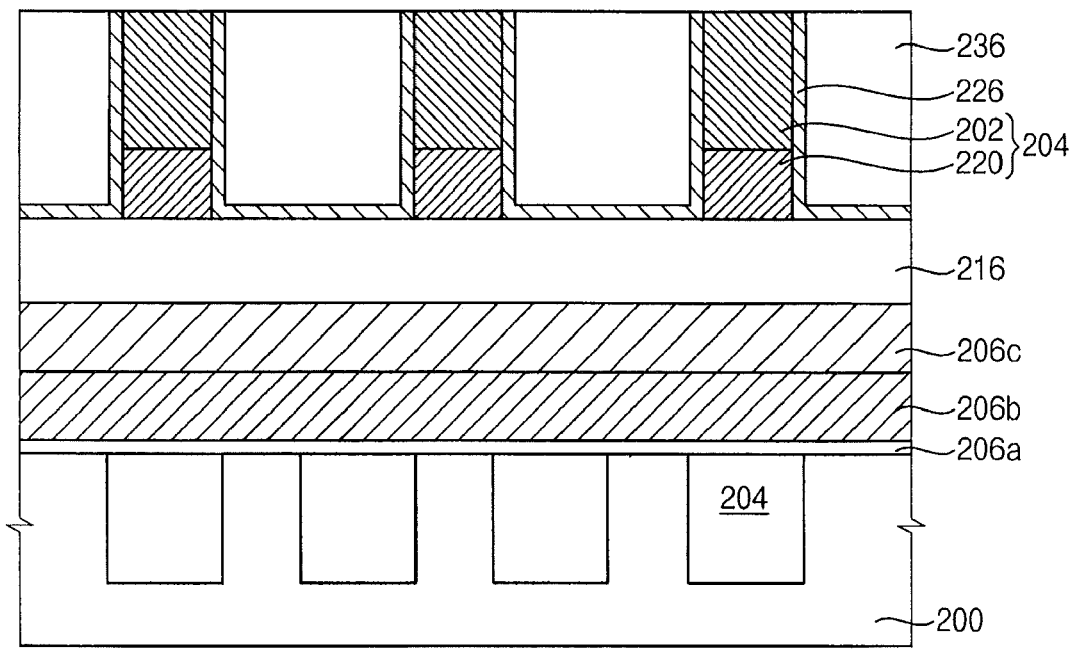
Figure 12C:
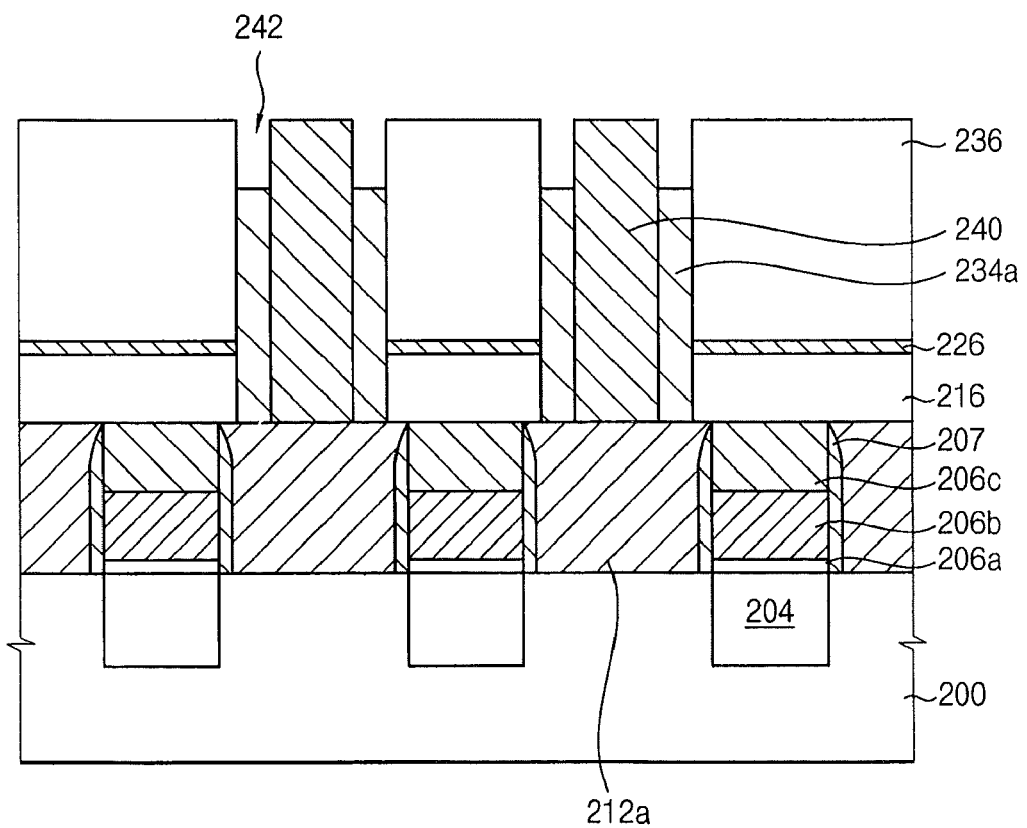

Referring to FIGS. 12A to 12C, an upper portion of the preliminary sacrificial layer 234 may be removed downward to a depth, to thereby form a sacrificial spacer 234a interposed between the bit line structure 224 and the storage node contact 240. Thus, a gap space 242 may be formed between an upper portion of the bit line structure 224 and an upper portion of the storage node contact 240 and between the upper portion of the storage node contact 240 and the third insulation interlayer 236. That is, an upper surface of the sacrificial spacer 234a may be exposed through the gap space 242. In the present example embodiment, the removal of the preliminary sacrificial layer 234 may be performed by a wet etching process, thereby reducing and/or minimizing damage to neighboring structures and patterns around the preliminary sacrificial layer 234.

For example, the upper surface of the sacrificial spacer 234a may be higher than the upper surface of the bit line 220. Since the upper spacer may be formed in the gap space 242 of which the bottom corresponds to the upper surface of the sacrificial spacer 234a in a subsequent process, the bottom of the upper spacer may be formed to be higher than the upper surface of the bit line 220.

Referring to FIGS. 13A to 13C, an upper spacer layer (not shown) may be formed on the third insulation interlayer 236, the storage node contact 240 and the bit line structure 224. The upper spacer layer may comprise a material having etching selectivity with respect to the sacrificial spacer 234a and the third insulation interlayer 236. For example, the upper spacer layer may comprise an insulation material such as silicon nitride or a conductive material such as polysilicon.

Then, the upper spacer layer may be planarized by a planarization process such as a chemical mechanical polishing (CMP) process or an etch-back process until the storage node contact 240, the bit line structure 224 and the third insulation interlayer 236 may be exposed. Thus, the upper spacer layer may remain in the gap space 242, to thereby form the upper spacer 244 between the upper portion of the bit line structure 224 and the storage node contact 240 and between the upper portion of the bit line structure 224 and the third insulation interlayer 236. That is, the upper spacer 244 may be shaped into a ring enclosing or surrounding the upper portion of the storage node contact 240. In addition, the upper spacer 244 may be interposed between the upper sidewall of the hard mask pattern 222 and the upper sidewall of the storage node contact 240, and thus the upper spacer 244 may contact both the hard mask pattern 222 and the storage node contact 240 at the first portion of the sidewall of the bit line structure 224. In contrast, since the second portion of the sidewall of the bit line structure 224 extending beyond the storage node contact 240 may still be covered with the third insulation interlayer, the upper spacer may not be formed between the neighboring bit line structures 224. Therefore, the upper spacer 244 may be discontinuously formed on the upper sidewall of the hard mask pattern 222 of the bit line structure 224 in the second direction.

In case that the upper spacer 244 may comprise an insulation material, the upper spacer 244 may fill up the gap space 242 between the upper portion of the storage node contact 240 and the upper portion of the bit line structure 224. In contrast, in case that the upper spacer 244 may comprise a conductive material such as polysilicon, the upper spacer 244 may also function as a supplementary contact and thus a surface area of the storage node contact 240 may be enlarged at an upper portion thereof since the upper spacer 244 may electrically contact the upper portion of the storage node contact 240.

FIG. 14 is a perspective view illustrating the bit lines of a DRAM device including an air gap according to some embodiments.

Referring to FIG. 14, the third insulation interlayer 236 may be removed from the substrate 200 by a dry etching process or a wet etching process, to thereby form the air gap 246 between the neighboring conductive structures 224. When the third insulation interlayer 236 may be removed by a dry etching process, the plasma process for the dry etching process may cause damage to the bit line structure 224. For that reason, the third insulation interlayer 236 may be removed from the second insulation interlayer 216 by a wet etching process in some embodiments. In the above wet etching process, the etch protection layer 226 may function as an etch stop layer and thus the third insulation interlayer 236 may be removed from the substrate 200 without substantial removal of the second insulation interlayer 216.

As a result of the removal of the third insulation interlayer 236, the sacrificial spacer 234a may be exposed to the air gap 246. In other words, the sacrificial spacer 234a may define a boundary of the air gap 246.

Referring to FIGS. 15A to 15D, the sacrificial spacer 234a may be removed from the substrate 200 by a wet etching process, to thereby form the air spacer 250 between the storage node contact 240 and the bit line structure 224. The air spacer 250 may be connected to (e.g., in fluid communication with) the air gap 246.

Accordingly, the air spacer 250 may be interposed between the storage node contact 240 and the first portion of the sidewall of the bit line structure 224 and between the storage node contact 240 and the second insulation interlayer 216. The air gap 246 may be interposed between the second portions of the sidewalls of the neighboring bit line structures 224 that extend beyond the storage node contact 240 in the second direction.

The air gap 246 may also be interposed between the neighboring bit line structures 224 in the peripheral region of the substrate 200. However, contact plugs may not be formed in the peripheral region of the substrate 200, and thus air spacers may not be formed in the peripheral region of the substrate 200.

Referring again to FIGS. 7A to 7D, an upper insulation interlayer 252 may be formed on the storage node contact 240, the bit line structure 224 and the upper spacer 250 in such a manner that that the air gap 246 is not filled by the upper insulation interlayer 252. Therefore, the air gap 246 may still be maintained between the neighboring bit line structures 224 although the bit line structures 224 may be covered with the upper insulation interlayer 252. For example, the upper insulation interlayer may comprise silicon nitride.

Thereafter, the capacitor 254 may be formed to penetrate through the upper insulation interlayer 252 and make contact with storage node contact 240. For example, the capacitor 254 may be shaped into a cylinder and may include a cylindrical lower electrode 254a, a dielectric layer 254b on a surface of the lower electrode 254a and an upper electrode 254c.

More particularly, a mold layer (not shown) may be formed on the upper insulation interlayer 254. The mold layer and the upper insulation interlayer 254 may be sequentially removed partially by an etching process, to thereby form an opening (not shown) through which the storage node contact may be exposed. Then, the cylindrical lower electrode 254a may be formed on bottom and inner surfaces of the opening. The mold layer may be removed from the upper insulation interlayer 254 after formation of the lower electrode 254a.

The upper spacer may improve an allowable error range, i.e., a process margin, of the process for formation of the opening. If the opening is misaligned with the storage node contact 240, the opening may not expose the air spacer 250 because the air spacer 250 may be covered with the upper spacer 244. Thus, the lower electrode 254a may be formed on the storage node contact 240 despite the misalignment.

In contrast, if the opening is misaligned with the storage node contact 240 and no upper spacer is present between the storage node contact 240 and the bit line structure 224, the opening may expose the air spacer 250 and thus the lower electrode 254a may formed in the air spacer 250 and make contact with the bit line 220 rather than the storage node contact 240. That is, the lower electrode 254a may be incorrectly formed at a point at which the opening and the air spacer may be connected to each other.

Embodiment III

Figure 16:
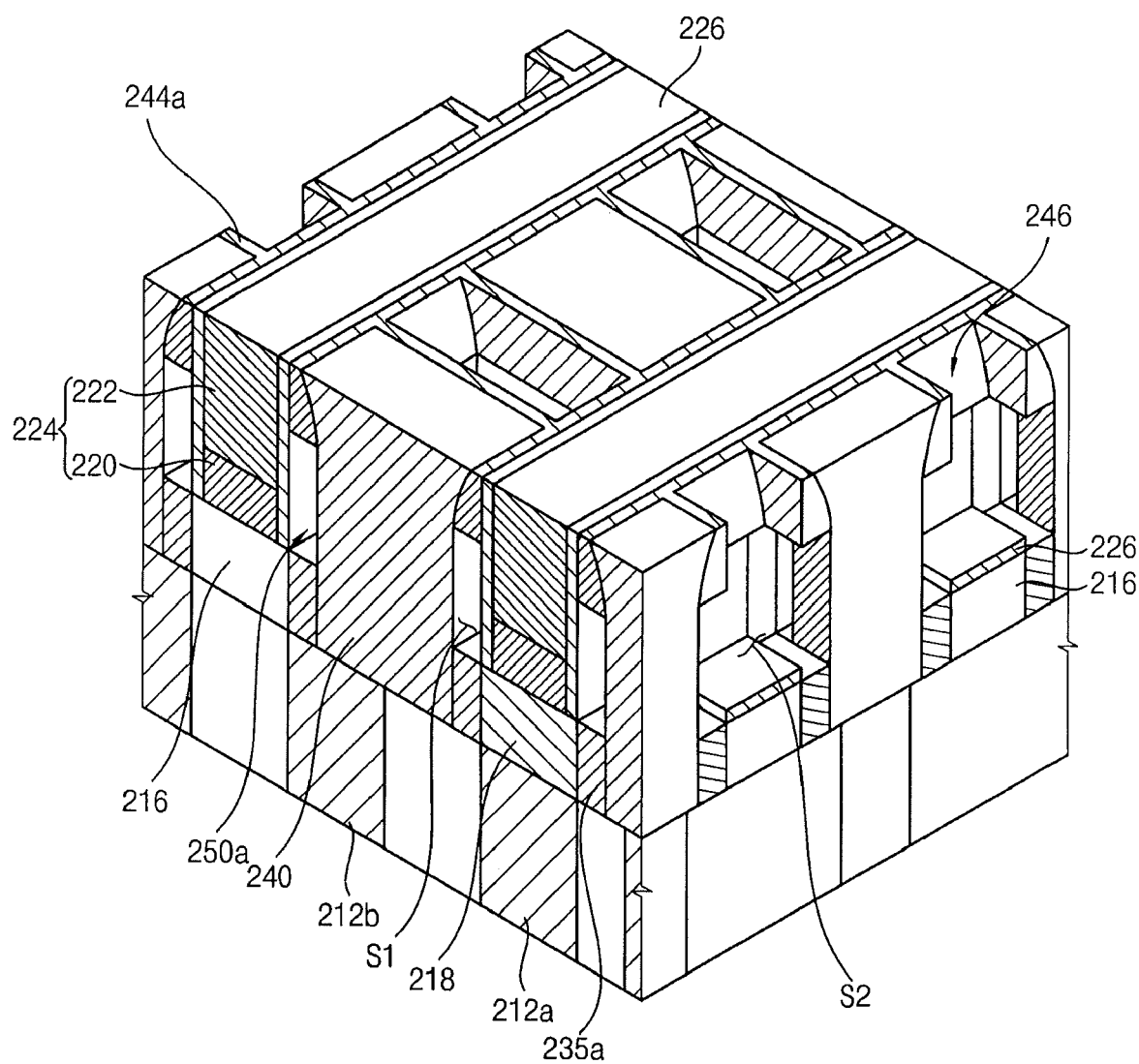
FIG. 16 is a perspective view illustrating bit line portion of a dynamic random access memory (DRAM) device in accordance with still further embodiments of the present inventive concept.
Figure 17A:
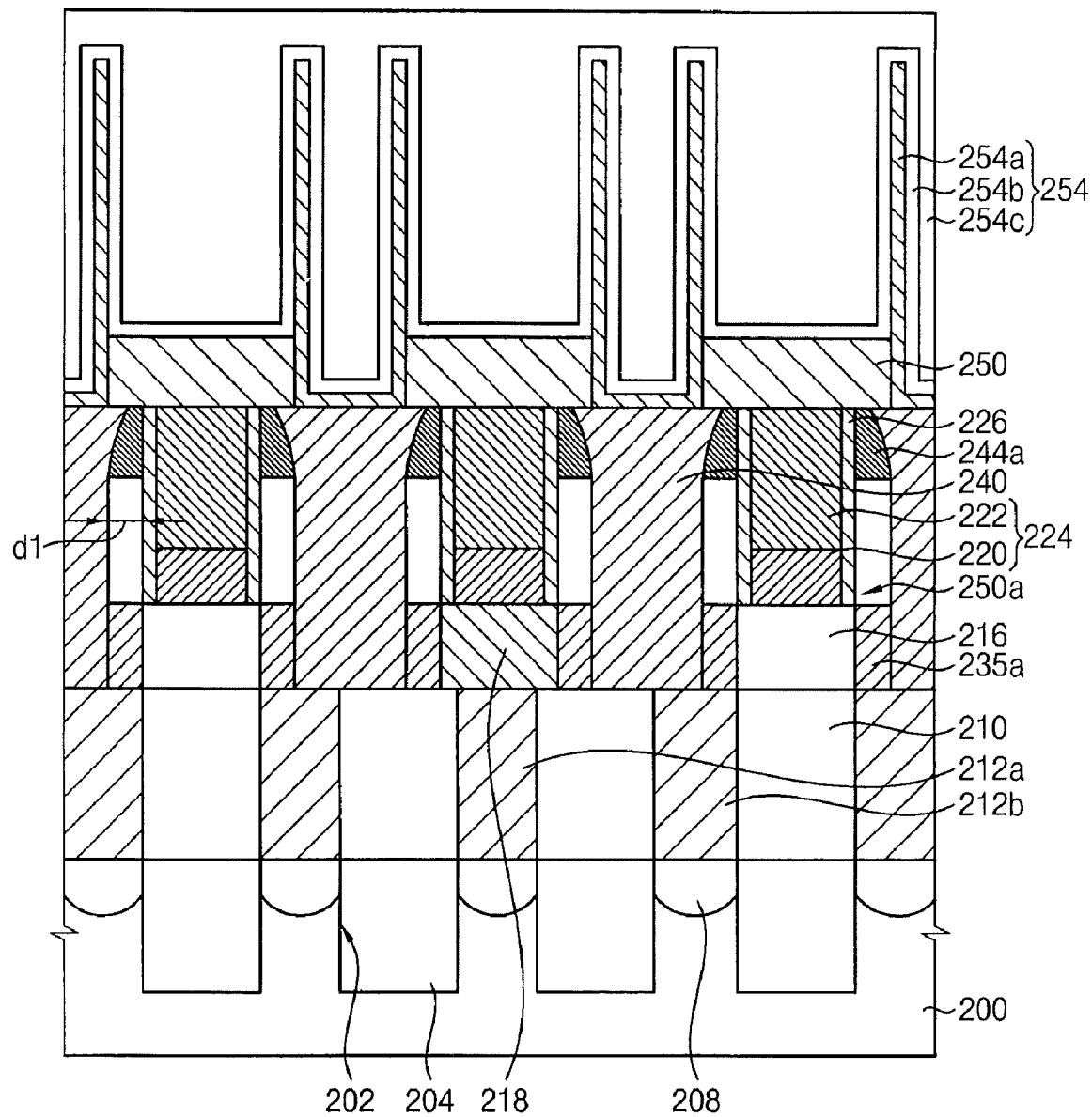
FIG. 17A is a cross-sectional view of the DRAM device shown in FIG. 16 taken along a line A-A' in FIG. 6.
Figure 17B:
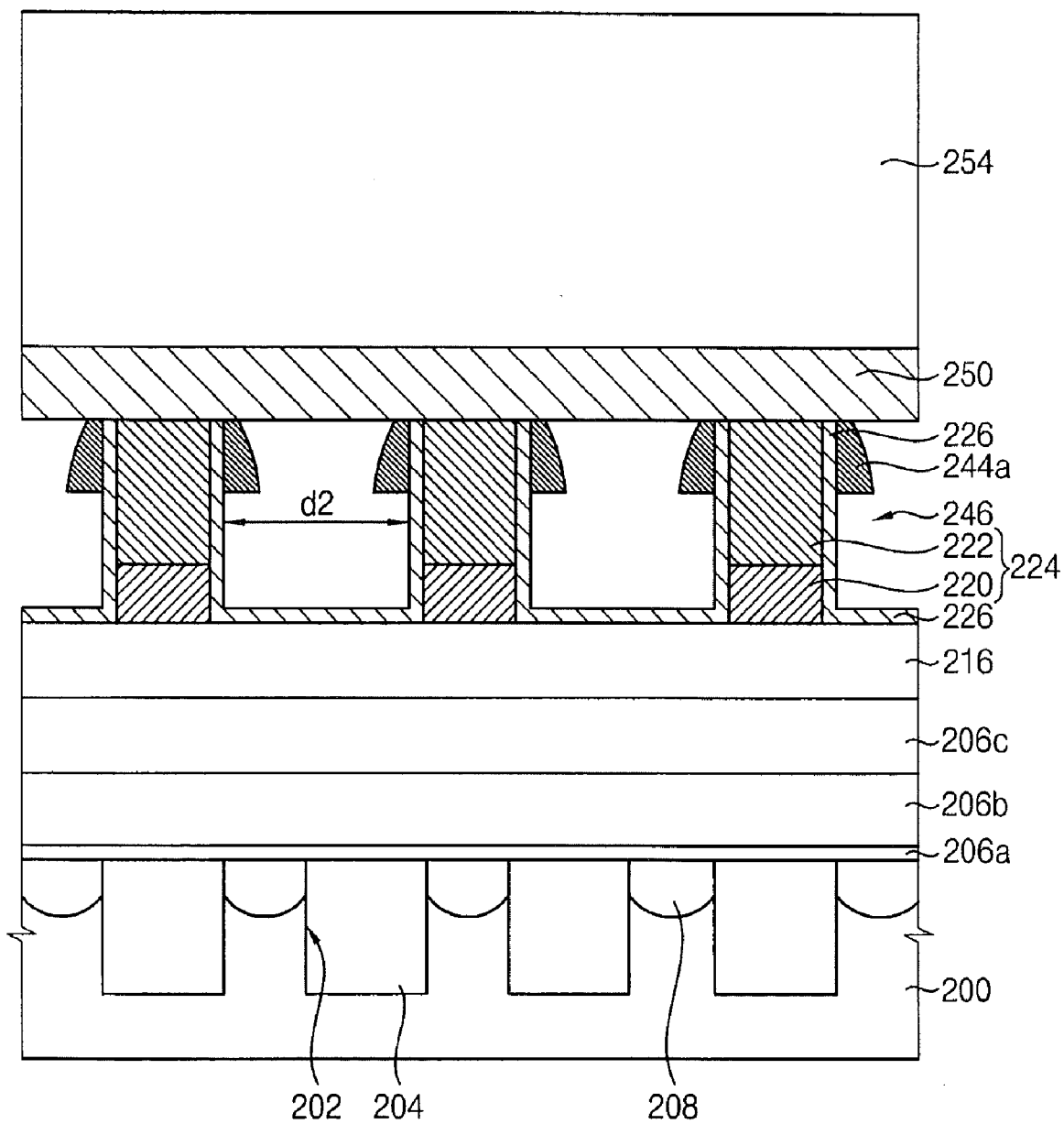
FIG. 17B is a cross-sectional view of the DRAM device shown in FIG. 16 taken along a line B-B' in FIG. 6.
Figure 17C:
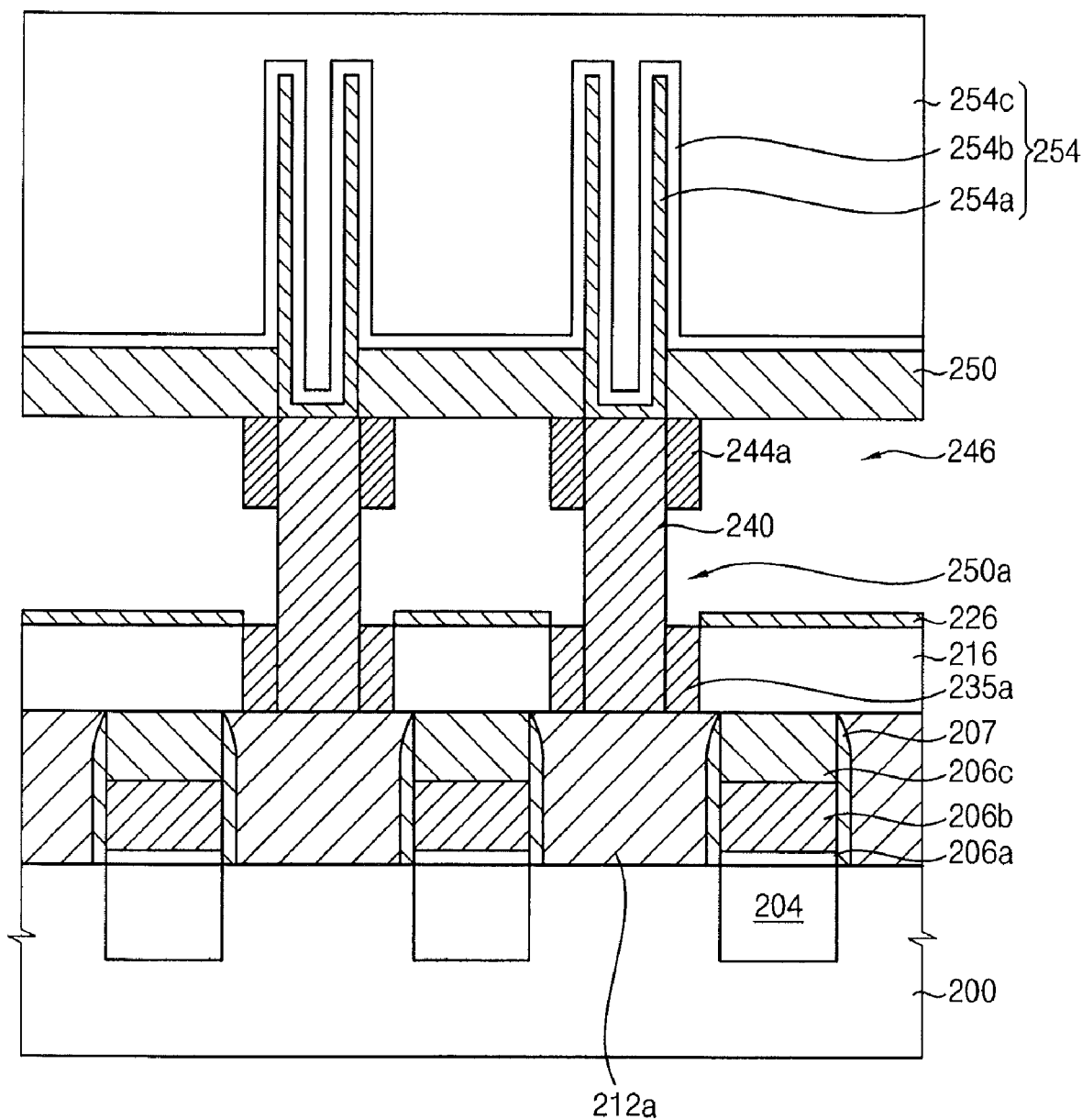
FIG. 17C is a cross-sectional view of the DRAM device shown in FIG. 16 taken along a line C-C' in FIG. 6.

FIG. 16 is a perspective view illustrating bit line portion of a dynamic random access memory (DRAM) device in accordance with still further embodiments of the present inventive concept. The layout of the. DRAM device shown in FIG. 16 is the same as the layout shown in FIG. 6. FIG. 17A is a cross-sectional view of the DRAM device shown in FIG. 16 cut along a line A-A' in FIG. 6 and FIG. 17B is a cross-sectional view of the DRAM device shown in FIG. 16 cut along a line B-B' in FIG. 6. FIG. 17C is a cross-sectional view of the DRAM device shown in FIG. 16 cut along a line C-C' in FIG. 6.

The DRAM device in accordance with still further embodiments of the present inventive concept may have substantially the same structure and configuration as the DRAM device in accordance with previously described embodiments of the present inventive concept, except for the position of the air spacer and the shape of the upper spacer. Thus, in the following drawings the same reference numerals will be used to refer to the same or like parts as those shown in the previous drawings.

Referring to FIGS. 16 and 17A to 17C, a substrate 200 including a plurality of active regions and a plurality of device isolation regions may be prepared. MOS transistors may be arranged on the cell region of the substrate 200 and each of the MOS transistors may include a gate insulation layer 206a, a gate electrode 206b and source and drain electrodes or regions 208. The gate electrode 206b may be shaped into a line extending a first direction and may function as a word line 206 in the MOS transistor. A first insulation interlayer 210 may be foamed on the substrate 200 to a sufficient thickness to cover the MOS transistors. First and second pad contacts 212a and 212b may make contact with the source and drain electrodes 208, respectively, penetrating through the first insulation interlayer 210. A second insulation layer 216 may be positioned on the first insulation layer 210.

A bit line contact 218 may make contact with the first pad contact 212a in the second insulation layer 216. A bit line 220 may be positioned on the second insulation layer 216 and may make contact with the bit line contact 218. The bit line may be shaped into a line extending in a second direction perpendicular to the first direction. A hard mask pattern 222 may be positioned on the bit line 220 and an etch protection layer 226 may be arranged on a sidewall of the bit line 220, a surface of the hard mask pattern 222 and an upper surface of the second insulation interlayer 216. Thus, the sidewall of the bit line 220 may be protected from being etched in a subsequent process by the etch protection layer 226.

A storage node contact 240 may be positioned between the neighboring bit line structures 224 in which the bit line 220 and the hard mask pattern 222 are stacked. That is, the storage node contact 240 may penetrate through the second insulation interlayer 216 and may make contact with the second pad contact 212b. The storage node contact 240 may have a length shorter than that of the bit line 220 in the second direction. Thus, a first sidewall portion of the bit line structure 224 may face the storage node contact 240 and a second sidewall portion of the bit line structure 224 that extends beyond the storage node contact 240 may face a sidewall of neighboring bit line structure 224. That is, the bit line structure 224 may be spaced apart from the storage node contact 240 by a first gap distance d1 at the first sidewall portion and may be spaced apart from the neighboring bit line structure by a second gap distance d2 at the second portion.

An upper spacer 244a may extend on an upper sidewall of the hard mask pattern 222 in the second direction in such a configuration that an upper sidewall of the storage node contact 240 may be enclosed by the upper spacer 244a. That is, the upper spacer 244a may be positioned on the second sidewall portion of the bit line structure 224 as well as the first sidewall portion of the bit line structure 224 as shown in FIG. 16 and FIG. 17B. For that reason, the upper spacer 224a may be an insulation material such as silicon nitride.

A lower surface of the upper spacer 244a may be higher than an upper surface of the bit line 220 of the bit line structure 224, and thus the upper spacer 244a may not be positioned on a sidewall of the bit line 220.

A first space S1 positioned below the upper spacer 244a and defined by the storage node contact 240 and the bit line structure 224 may provide a void without any kind of thin layers and merely filled with air, to thereby form an air spacer 250a under the upper spacer 244a.

In the present example embodiment, the air spacer 250 may vertically extend from a lower surface of the upper spacer 244 to a lower portion of the bit line structure 224 and a residual or remaining insulation pattern 235a may be positioned between the second insulation interlayer 216 and the storage node contact 240 rather than the air spacer 250. For example, the residual insulation pattern 235a may comprise silicon oxide. An upper surface of the residual insulation pattern 235a may be coplanar with a lower surface of the bit line 220 and may be confined below the lower surface of the bit line 220. Therefore, the residual insulation pattern 235a, which may make contact with the storage node contact 240, may not increase the loading capacitance between the storage node contact 240 and the bit line 220.

The second sidewall portion of the bit line structure 224 may extend beyond the storage node contact 240 and may face a sidewall of neighboring bit line structure 224 and may be spaced apart from the neighboring bit line structure by a second gap distance d2. Thus, a second space S2 defined by the neighboring bit line structures 224 and the storage node contact 240 may provide a void without any kind of thin layers and merely filled with air, to thereby form an air gap 246 between the neighboring bit line structures 224. Thus, the air spacer 250a and the air gap 246 may be interconnected to each other.

In addition, the air gap 246 may also be interposed between the neighboring bit line structures 224 in the peripheral region of the substrate 200, although not shown in figures.

An upper insulation layer 250 may be positioned on the storage node contact 240, the upper spacer 244a, the hard mask pattern 222 and the air gap 246. The air gap 246 may not be filled with the upper insulation layer 250, to thereby maintain the air gap 246 with the upper insulation layer 250 thereon. A capacitor 254 may penetrate through the upper insulation layer 250 and may make electrical contact with the storage node contact 240. For example, the capacitor 254 may be shaped into a cylinder and include a cylindrical lower electrode 254a, a dielectric layer 254b on a surface of the lower electrode 254a and an upper electrode 254c.

FIGS. 18A to 20C illustrate processing steps for a method of manufacturing the DRAM device shown in FIGS. 16 and 17A to 17C.

In FIGS. 18A to 20C, the capital letter 'A' in each FIG. number indicates a cross-sectional view cut along the line A-A' in FIG. 6 and the capital letter 'B' in each FIG. number indicates a cross-sectional view cut along the line B-B' in FIG. 6. In addition, the capital letter 'C' in each FIG. number indicates a cross-sectional view cut along the line C-C' in FIG. 6.

A similar process as described with reference to FIGS. 9A to 9C may be performed on the substrate 200, and thus a transistor, a first insulation interlayer 210, first and second pad contacts 212a and 212b, a second insulation interlayer 216, a bit line structure 224 and a third insulation interlayer 236 may be formed on the substrate 200. Thereafter, a similar process as described with reference to FIGS. 10A to 10C may be performed on the resultant structure of the substrate 200, to thereby form a third contact hole 232 penetrating through the third and second insulation interlayers 236 and 216.

Then, a sacrificial layer may be formed on a bottom and an inner sidewall of the third contact hole 232, on an upper surface of the bit line structure 224, and on the upper surface of the third insulation interlayer 236. In the present example embodiment, the sacrificial layer may comprise the same material as the third insulation interlayer 236 such as silicon nitride.

The sacrificial layer may be partially etched by an anisotropic etching process, to thereby form a preliminary sacrificial spacer 234 on the inner sidewall of the third contact hole 232.

A storage node contact 240 may be formed in the third contact hole 232 in which the preliminary sacrificial spacer 234 may be formed, and thus the preliminary sacrificial spacer 234 may be interposed between the storage node contact 240 and the bit line structure 224. Therefore, the storage node contact 240 and the bit line 220 of the bit line structure 224 may be electrically insulated from each other by the preliminary sacrificial spacer 234.

As a result of the above processes, a similar structure as illustrated in FIGS. 11A to 11C may be formed on the substrate 200, except that the preliminary sacrificial spacer 234 may comprise silicon oxide.

Figure 18A:
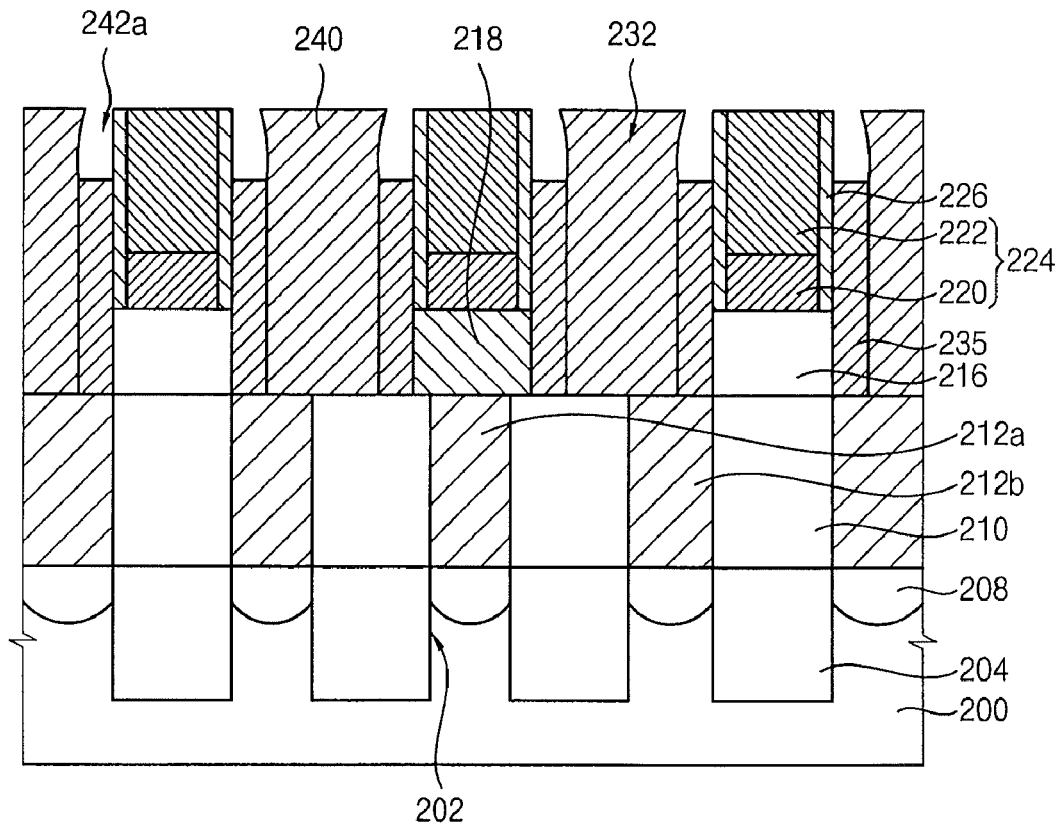
FIGS. 18A to 20C illustrate processing steps for a method of fabricating the DRAM device shown in FIGS. 16 and 17A to 17C.
Figure 18B:
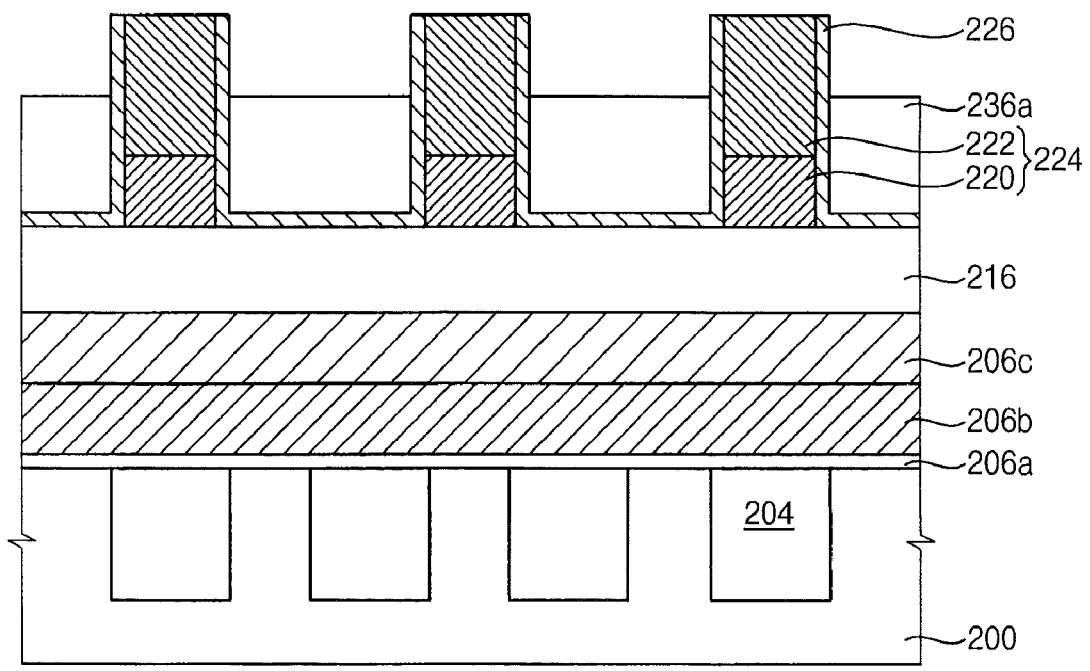
Figure 18C:
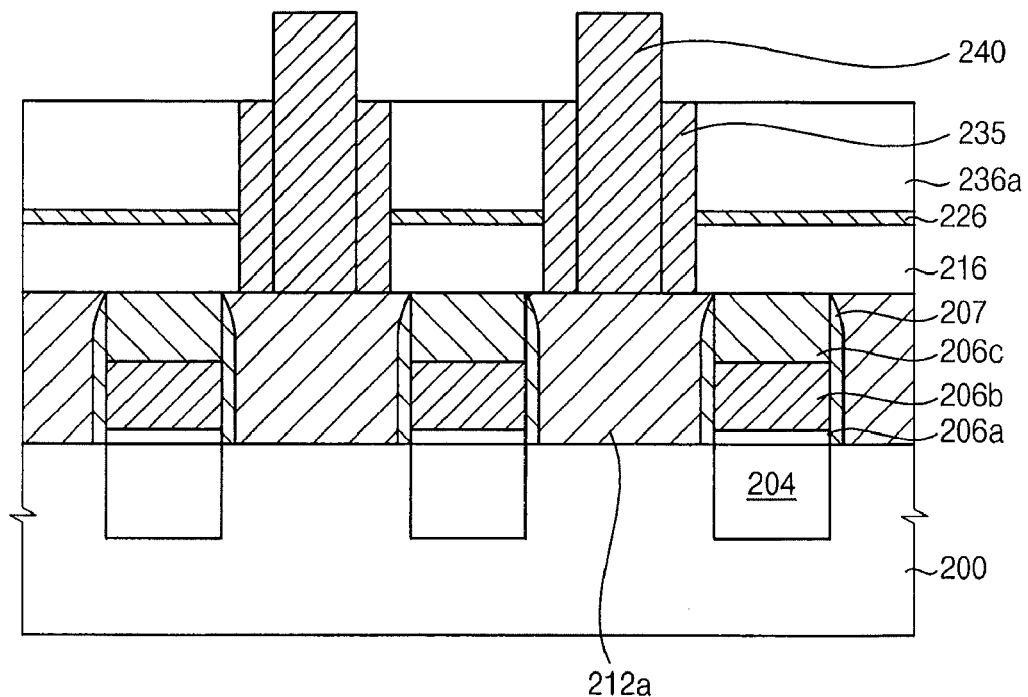

Referring to FIGS. 18A to 18C, an upper portion of the preliminary sacrificial layer 234 may be removed downward to a depth, to thereby form a sacrificial spacer 235 interposed between the bit line structure 224 and the storage node contact 240. Thus, a gap space 242a may be formed between an upper portion of the bit line structure 224 and an upper portion of the storage node contact 240. That is, an upper surface of the sacrificial spacer 235 may be exposed through the gap space 242a. In the present example embodiment, the removal of the preliminary sacrificial layer 234 may be performed by a wet etching process, thereby reducing and/or minimizing damage to neighboring structures and patterns around the preliminary sacrificial layer 235.

When the upper portion of the preliminary sacrificial spacer 234 is etched, the third insulation interlayer 236 comprising silicon oxide may also be etched simultaneously with the preliminary sacrificial spacer 234. Hereinafter, the third insulation interlayer 236 that is partially etched will be designated as a new reference numeral 236a so as to differentiate the original layer and the etched layer. Thus, the upper portion of the bit line structure 224 may protrude from the etched third insulation interlayer 236a, as shown in FIG. 18B. In such a case, the upper surface of the third insulation interlayer 236a may be higher than the upper surface of the bit line 220 of the bit line structure 224.

Therefore, the upper portion of the bit line structure 224 may be spaced apart from the upper portion of the storage node contact 240 by the gap space 242a. In a subsequent process, the upper spacer 244a may be formed in the gap space 242a and thus the preliminary sacrificial layer 234 may be deeply etched to a point at which a lower surface of the upper spacer 244a may be positioned.

Figure 19A:
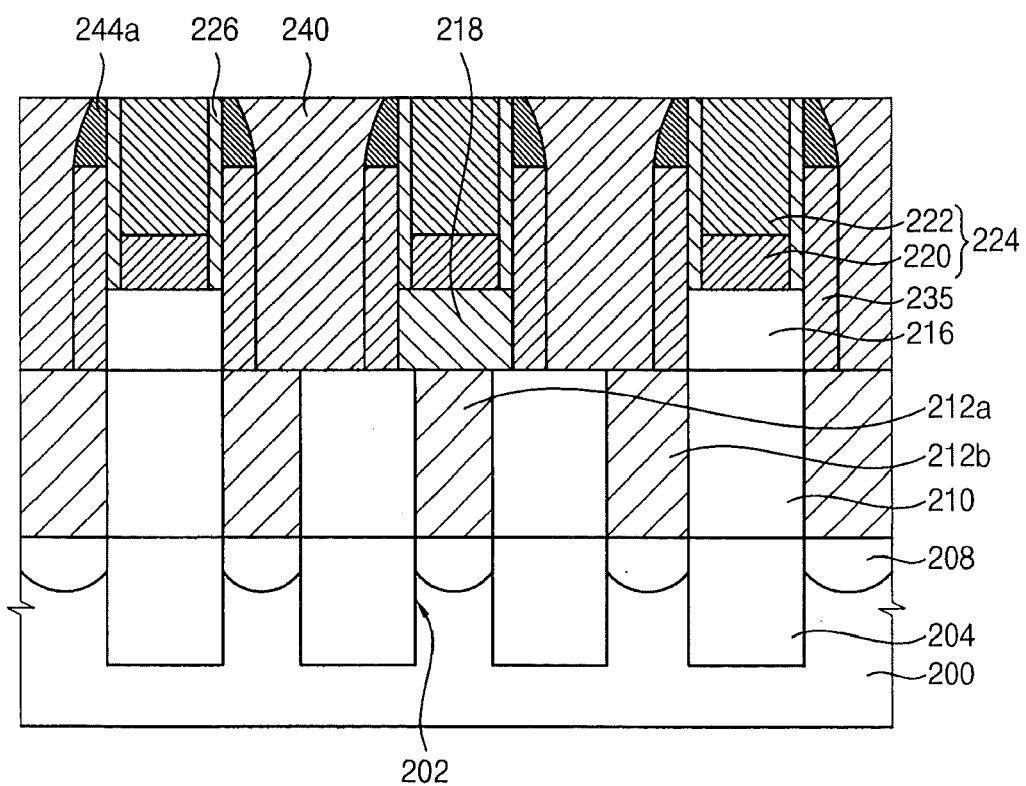
Figure 19B:
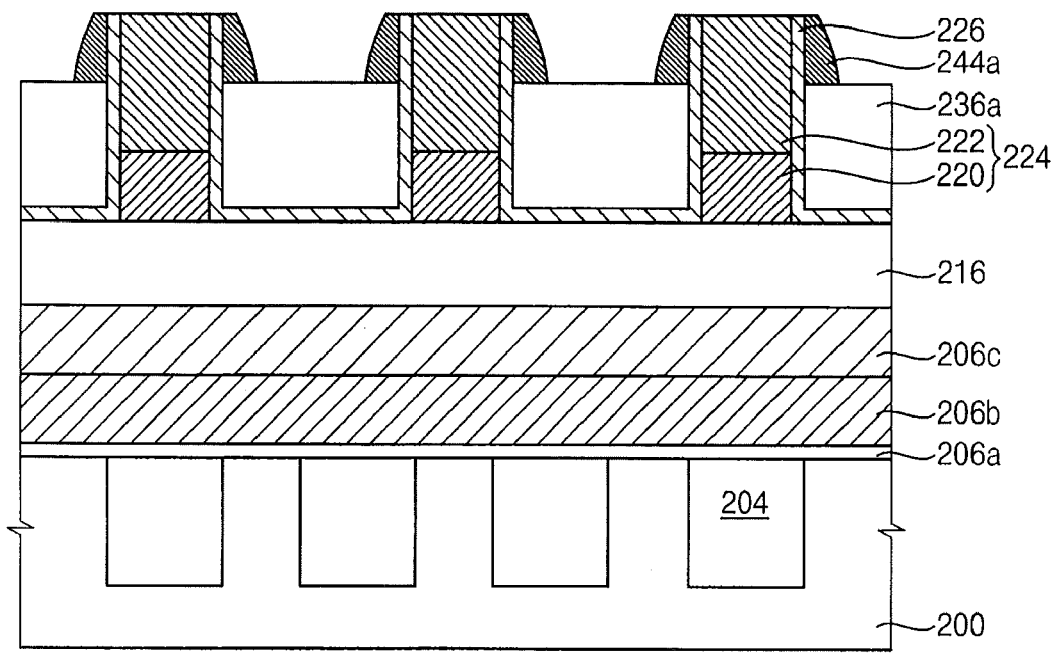
Figure 19C:
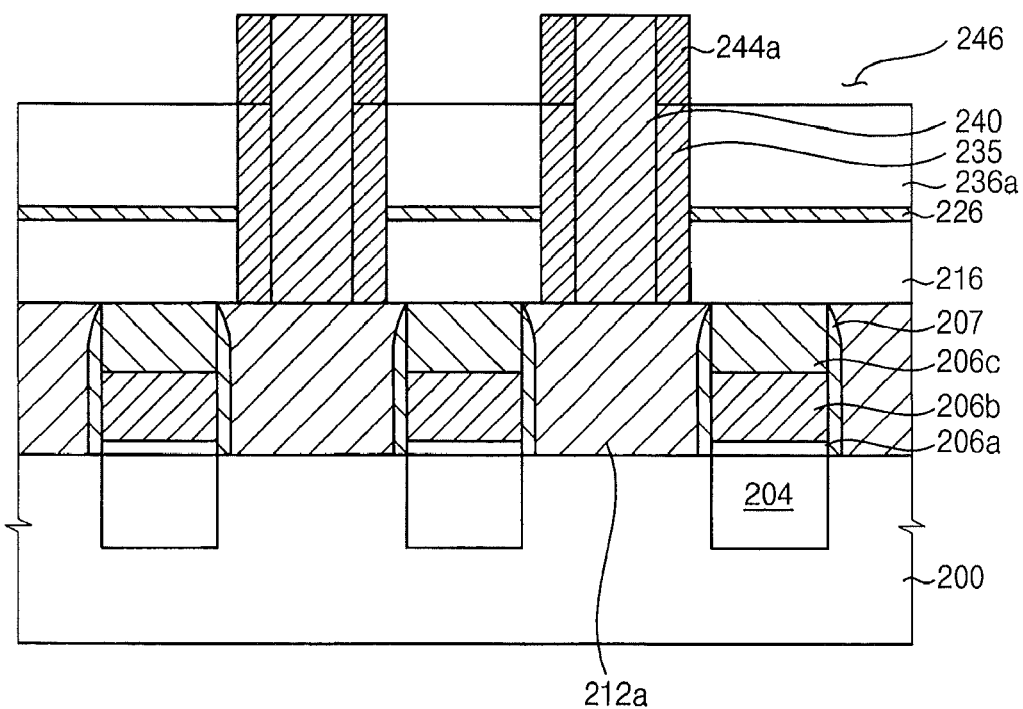

Referring to FIGS. 19A to 19C, an upper spacer layer (not shown) may be formed on the third insulation interlayer 236a to a sufficient thickness to fill up the gap space 242a. The upper spacer layer may comprise a material having etching selectivity with respect to the sacrificial spacer 235 and the third insulation interlayer 236a. For example, the upper spacer layer may comprise an insulation material such as silicon nitride.

Then, the upper spacer layer may be planarized by a planarization process such as a chemical mechanical polishing (CMP) process or an etch-back process to expose the storage node contact 240, to thereby form the upper spacer 244a on the upper portion of the hard mask pattern 222 of the bit line structure 224 in such a manner that the upper spacer 244a may enclose the upper portion of the storage node contact 240.

In the present example embodiment, the upper spacer 244a may continuously extend on the upper sidewall of the hard mask pattern 222 along the second direction. Thus, if the upper spacer 244a was formed of a conductive material, the neighboring storage node contacts 240 adjacent to each other in the second direction would be electrically connected with each other. Therefore, the upper spacer 244a comprises an insulation material.

Figure 20A:
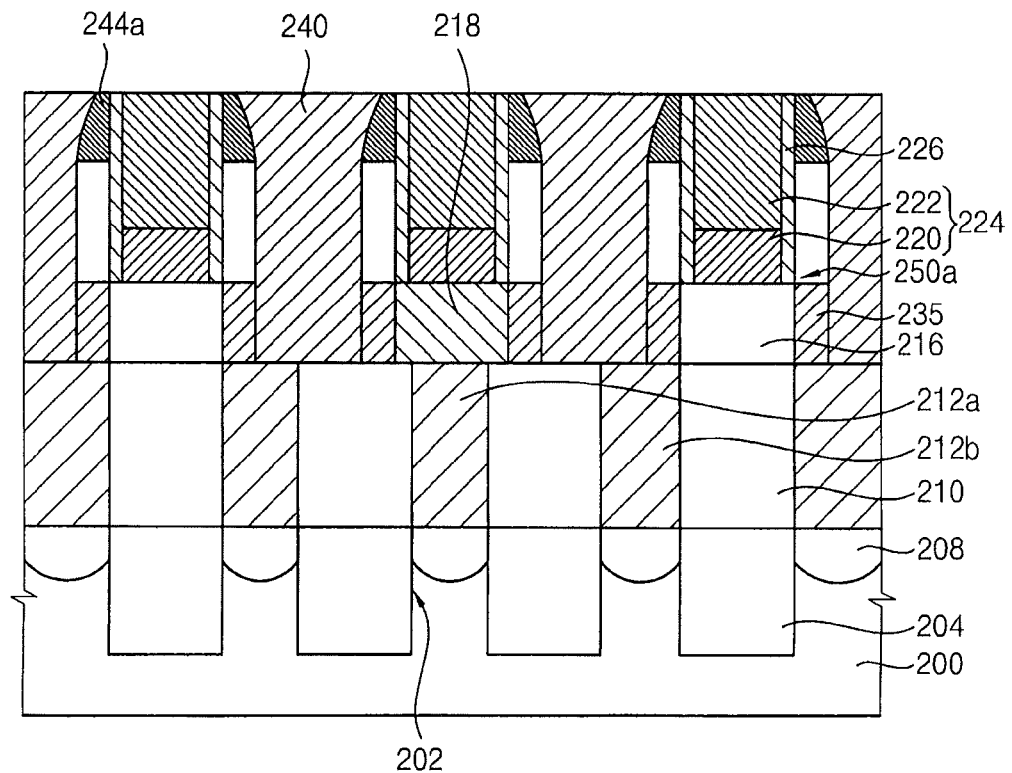
Figure 20B:
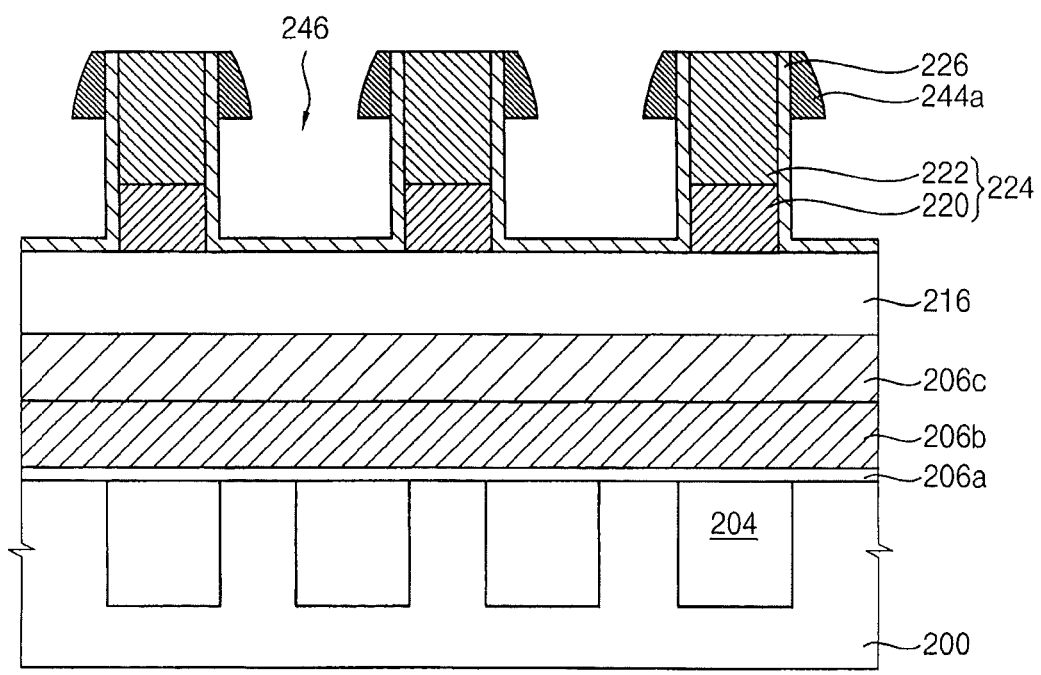
Figure 20C:
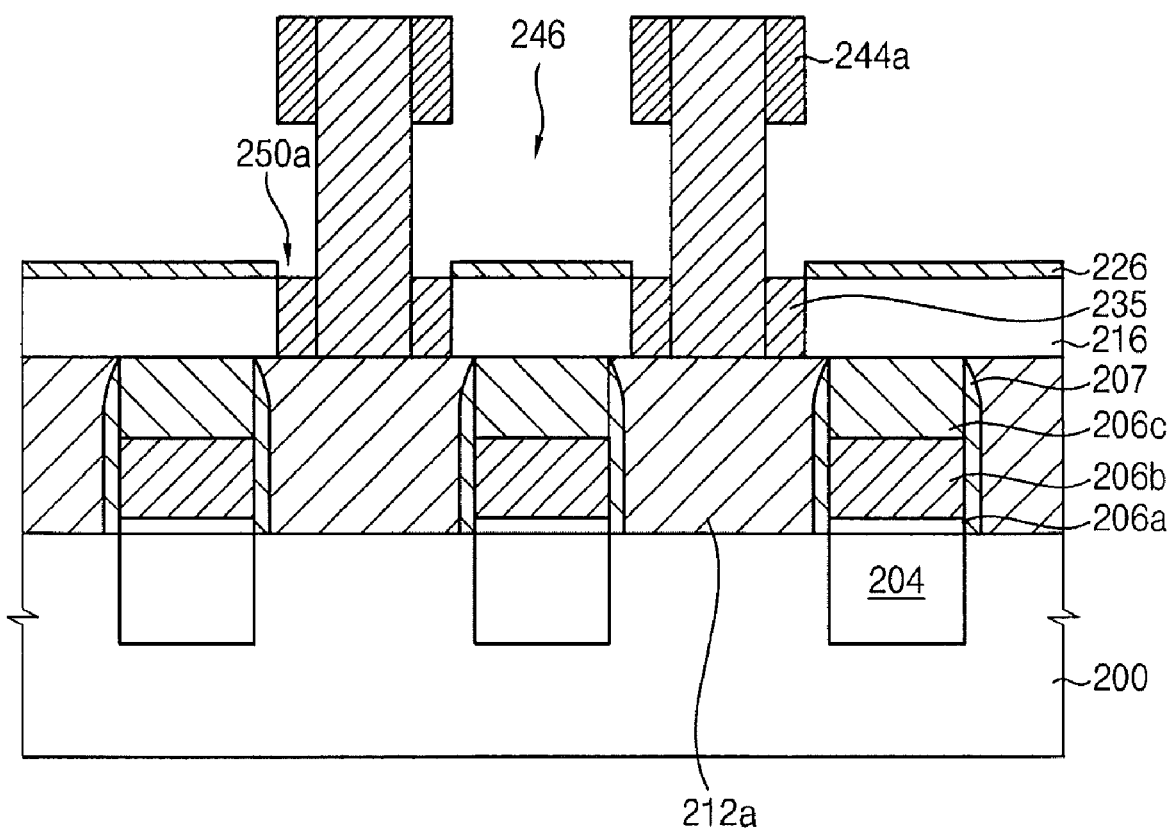

Referring to FIGS. 20A to 20C, the third insulation interlayer 236a and the sacrificial spacer 235 may be further etched from the substrate 200 in an etching process, preferably a wet etching process. The third insulation interlayer 236a and the sacrificial spacer 235 may comprise the same material such as silicon oxide, and thus may be removed by the same etching process.

In an example embodiment, the third insulation interlayer 236a may be fully removed from the substrate 200 and the sacrificial spacer 235 may be partially removed from the substrate 200. That is, the sacrificial spacer 235 may remain in a space between the second insulation interlayer 216 and the storage node contact 240 and between the bit line contact 218 and the storage node contact 240, to thereby form the residual insulation pattern 235a at a lower portion of the storage node contact 240. The residual insulation pattern 235a may improve stability of the storage node contact 240.

As a result of the etching process for removal of the sacrificial spacer 235 and the third insulation interlayer 236a, an air spacer may be formed in a first space between the bit line structure 224 and the storage node contact 240 below the upper spacer 244a. In addition, a second space may be formed between second portions of the sidewalls of the bit line structures adjacent to each other, to thereby form an air gap 246 between the portions of the neighboring bit line structures 224 facing each other and extending beyond the storage node contact 240.

Accordingly, the air spacer 250a may be interposed between the storage node contact 240 and the first portion of the sidewall of the bit line structure 224 and the air gap 246 may be interposed between the second portions of the sidewalls of the neighboring bit line structures 224 extending beyond the storage node contact 240.

The air gap 246 may also be interposed between the neighboring bit line structures 224 in the peripheral region of the substrate 200. However, contact plugs may not be formed in the peripheral region of the substrate 200, and thus the air spacers may not be formed in the peripheral region of the substrate 200.

Referring again to FIGS. 17A to 17C, an upper insulation interlayer 250 may be formed on the storage node contact 240, the upper spacer 244a, the hard mask pattern 222 and the air gap 246 in such a manner that that the air gap 246 is not filled with the upper insulation interlayer 250. Thereafter, the capacitor 254 may penetrate through the upper insulation interlayer 250 and may make contact with storage node contact 240. For example, the capacitor 254 may be shaped into a cylinder and include a cylindrical lower electrode 254a, a dielectric layer 254b on a surface of the lower electrode 254a and an upper electrode 254c that may be formed substantially by the same process as previously described.

Embodiment IV

Figure 21A:
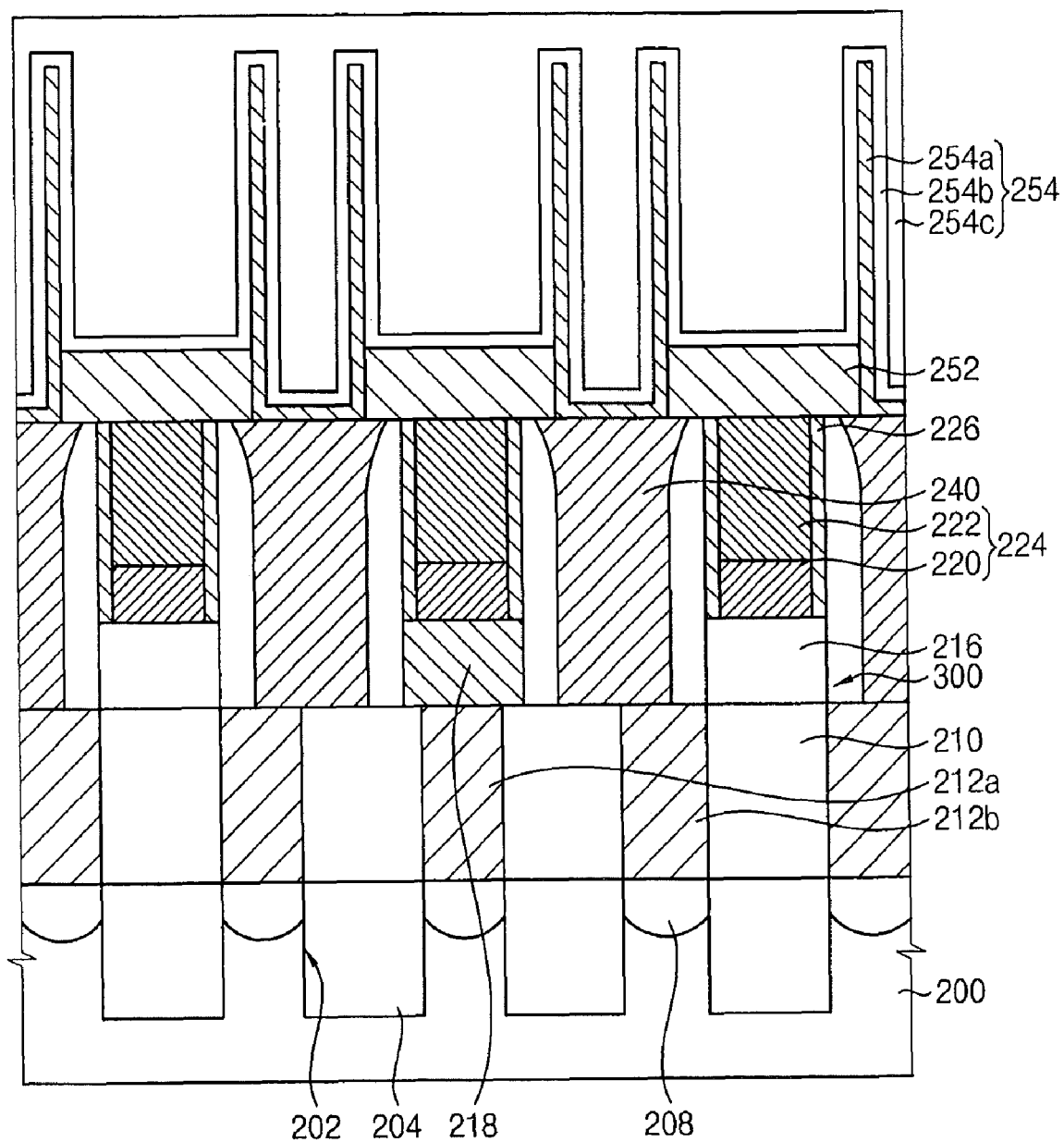
FIGS. 21A and 21B are cross-sectional views illustrating a dynamic random access memory (DRAM) device in accordance with yet further embodiments of the present inventive concept.
Figure 21B:
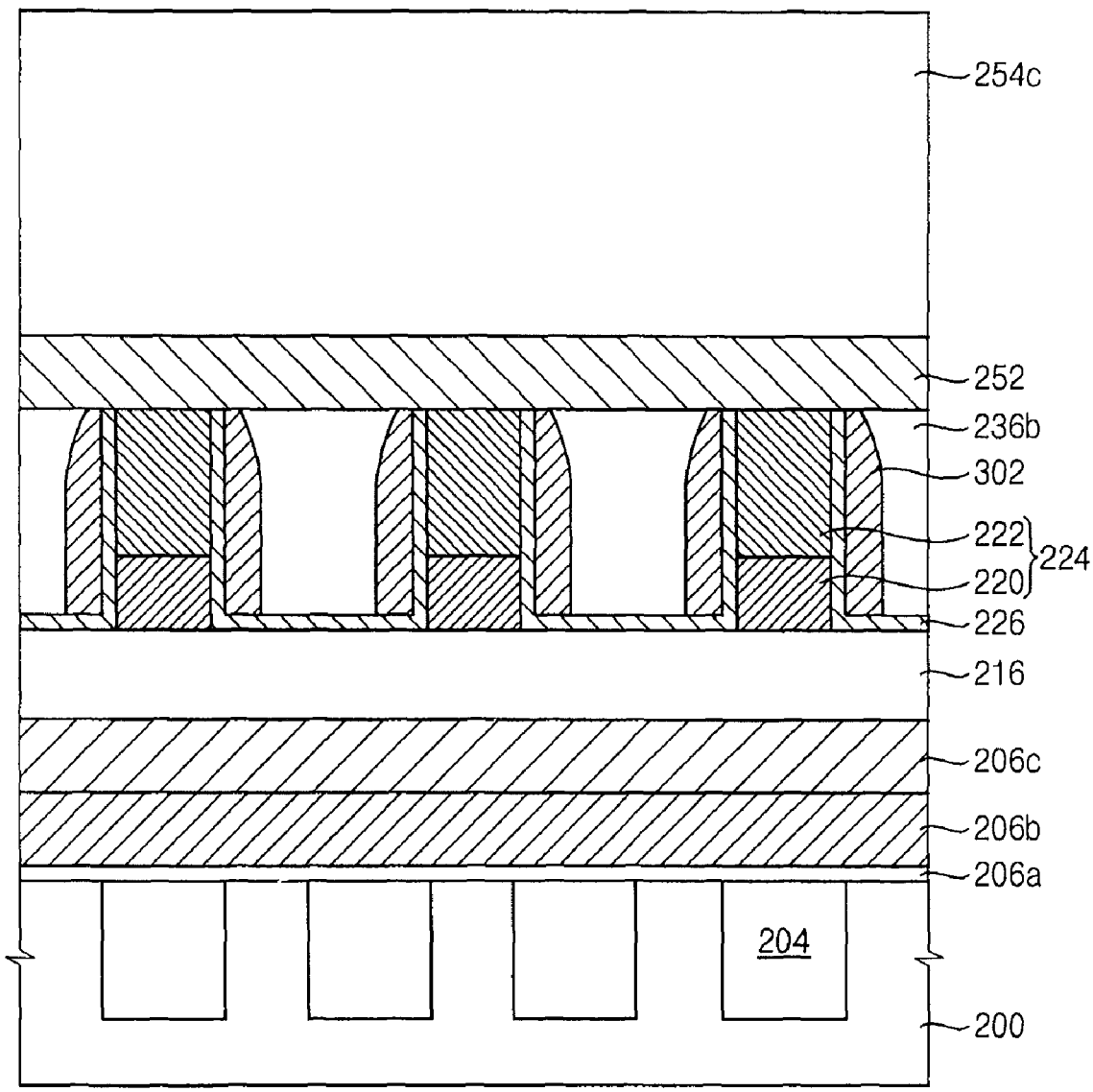
Figure 22:
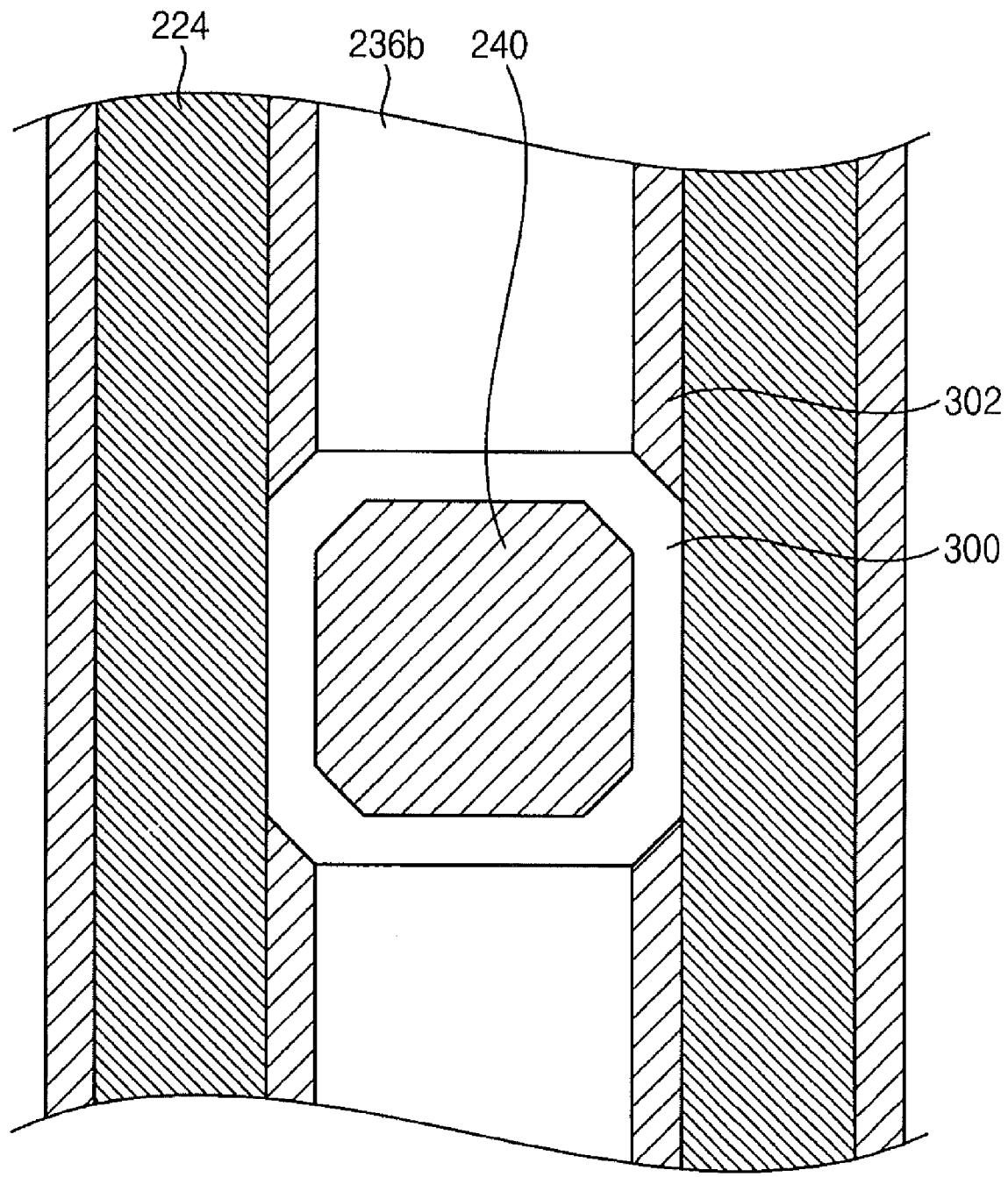
FIG. 22 is a plan view of the DRAM device shown in FIGS. 21A and 21B.

FIGS. 21A and 21B are cross-sectional views illustrating a dynamic random access memory (DRAM) device in accordance with yet further embodiments of the present inventive concept. FIG. 22 is a plan view of the DRAM device shown in FIGS. 21A and 21B.

The DRAM device in accordance with yet further embodiments of the present inventive concept may have substantially the same structure and configuration as the DRAM device in accordance with the previously described embodiments of the present inventive concept, except for the shape of the air spacer and the lack of an upper spacer. Thus, in the following drawings, the same reference numerals will be used to refer to the same or like parts as those shown in the previous drawings.

Referring to FIGS. 21A to 21B and 22, a substrate 200 including a plurality of active regions and a plurality of device isolation regions may be prepared. MOS transistors may be arranged on the cell region of the substrate 200 and each of the MOS transistors may include a gate insulation layer 206a, a gate electrode 206b and source and drain electrodes or regions 208. The gate electrode 206b may be shaped into a line extending a first direction and may function as a word line 206 in the MOS transistor. A first insulation interlayer 210 may be formed on the substrate 200 to a sufficient thickness to cover the MOS transistors. First and second pad contacts 212a and 212b may make contact with the source and drain electrodes 208, respectively, penetrating through the first insulation interlayer 210. A second insulation layer 216 may be positioned on the first insulation layer 210.

A bit line contact 218 may make contact with the first pad contact 212a in the second insulation layer 216. A bit line 220 may be positioned on the second insulation layer 216 and may make contact with the bit line contact 218. The bit line may be shaped into a line extending in a second direction perpendicular to the first direction. A hard mask pattern 222 may be positioned on the bit line 220 and an etch protection layer 226 may be arranged on a sidewall of the bit line 220, a surface of the hard mask pattern 222 and an upper surface of the second insulation interlayer 216. Thus, the sidewall of the bit line 220 may be protected from being etched in a subsequent process by the etch protection layer 226.

A storage node contact 240 may be positioned between the neighboring bit line structures 224 in which the bit line 220 and the hard mask pattern 222 may be stacked. The storage node contact 240 may have a length shorter than that of the bit line 220 in the second direction. Thus, a first portion of the sidewall of the bit line structure 224 may face the storage node contact 240 and a second portion of the sidewall of the bit line structure 224 may face a sidewall of neighboring bit line structure 224 and extend beyond the storage node contact 240. That is, the bit line structure 224 may be spaced apart from the storage node contact 240 by a first gap distance at the first sidewall portion and may be spaced apart from the neighboring bit line structure by a second gap distance at the second sidewall portion. A spacer 302 may be formed on the second portion of the sidewalls of the bit line structure 224. The storage node contact 240 may penetrate through the third insulation interlayer 236b and the second insulation interlayer 216 and may make contact with the second pad contact 212b.

In the present example embodiment, the storage node contact 240 may be interposed between the first portions of the sidewalls of the neighboring bit line structures 224 and a third insulation interlayer 236b may be interposed between the second portions of the sidewalls of the neighboring bit line structures 224. That is, an air gap may not be provided between the second portions of the sidewalls of the neighboring bit line structures 224.

Therefore, the storage node contact 240 may be spaced apart from the bit line structure 224 and simultaneously be spaced apart from both of the third and second insulation interlayers 236b and 216. That is, the storage node contact 240 may be spaced apart from surrounding layers by a distance, to thereby form a node gap space enclosing or surrounding the storage node contact 240. The node gap space may provide a void without any kind of thin spacer materials except for air, to thereby define an air spacer 300 enclosing the storage node contact 240, as shown in FIG. 22.

More particularly, the air spacer 300 may enclose an upper sidewall of the storage node contact 240 and may extend from the upper sidewall to a lower sidewall of the storage node contact 240. Therefore, an upper spacer may not be provided with the upper portion of the storage node contact 240.

According to the present example embodiment, the air spacer 300 may be positioned between the first portion of the sidewall of the bit line structure 224 and the storage node contact 240, and no air gap may be provided between the second portions of the sidewalls of the bit line structures 224. In addition, the air gap may not be provided in the peripheral region of the substrate 200.

An upper insulation interlayer 252 may be positioned on the storage node contact 240, the hard mask pattern 222 and the air spacer 300. A capacitor 254 may penetrate through the upper insulation layer 252 and may make electrical contact with the storage node contact 240. For example, the capacitor 254 may be shaped into a cylinder and include a cylindrical lower electrode 254a, a dielectric layer 254b on a surface of the lower electrode 254a and an upper electrode 254c.

FIGS. 23A to 24A illustrate processing steps for a method of manufacturing the DRAM device shown in FIGS. 21A and 21B. In FIGS. 23A to 24A, the capital letter 'A' in each FIG. number indicates a cross-sectional view cut along the line A-A' in FIG. 6.

A similar process as described with reference to FIGS. 9A to 9C may be performed on the substrate 200, and thus a transistor, a first insulation interlayer 210, first and second pad contacts 212a and 212b, a second insulation interlayer 216 and a bit line structure 224 may be formed on the substrate 200.

Although not shown in the figures, a bit line spacer may be further formed on both sidewalls of the bit line structure 224 after formation of the bit line structure 224.

Thereafter, a third insulation interlayer may be formed on the second insulation interlayer 216 to a sufficient thickness to cover the bit line structure 224. The third insulation interlayer and the second insulation interlayer 216 may be partially etched, to thereby form an opening through which the second pad contact 212b may be exposed. More particularly, the bit line spacer exposed through the opening may be removed from the substrate 200, to thereby form a third contact hole (not shown) penetrating through the third and second insulation interlayers. Thus, the sidewall of the bit line structure 224 and/or the etch protection layer 226 covering the sidewall of the bit line structure 224 may be exposed through the third contact hole.

Figure 23A:
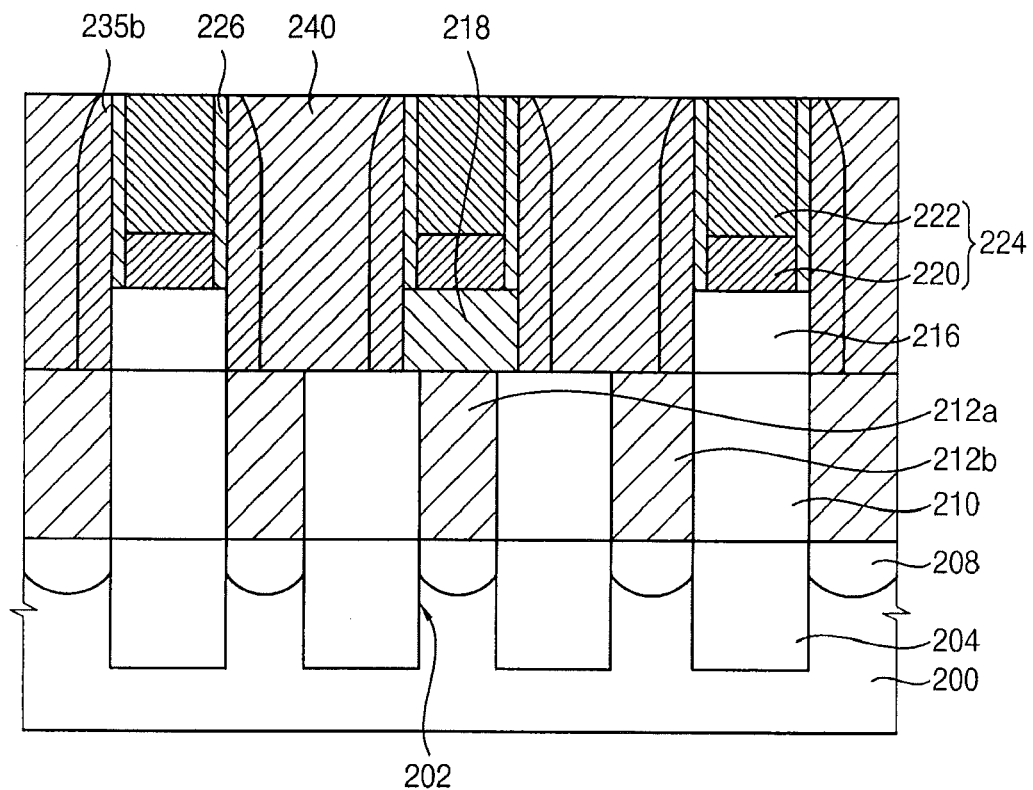

Referring to FIG. 23A, a sacrificial layer (not shown) may be formed on a bottom and an inner sidewall of the third contact hole, on an upper surface of the bit line structure 224 and on the upper surface of the third insulation interlayer 236. In the present example embodiment, the sacrificial layer may comprise a material having etching selectivity with both silicon nitride and silicon oxide. Examples of the material for the sacrificial layer may include silicon germanium and polysilicon. The sacrificial layer may be partially removed from the substrate 200 by an anisotropic etching process, to thereby form a sacrificial spacer 235b on the inner sidewall of the third contact hole.

Further, an upper surface of the second pad contact 212b defining a bottom surface of the third contact hole may be partially recessed after the formation of the sacrificial spacer 235b. The recesses of the second pad contact 212b may improve contact characteristics between the second pad contact 212b and the storage node contact 240.

A conductive layer (not shown) may be formed on the third insulation interlayer and the hard mask pattern 222 to a sufficient thickness to fill up the third contact hole in which the sacrificial spacer 235b may be formed. Then, the conductive layer may be planarized by a planarization process such as a chemical mechanical polishing (CMP) process and an etch-back process until an upper surface of the third insulation interlayer and an upper surface of the hard mask pattern may be exposed, to thereby form a storage node contact 240 making contact with the second pad contact 212b. Thus, the sacrificial spacer 235b may be interposed between the storage node contact 240 and the bit line structure 224.

Figure 24A:
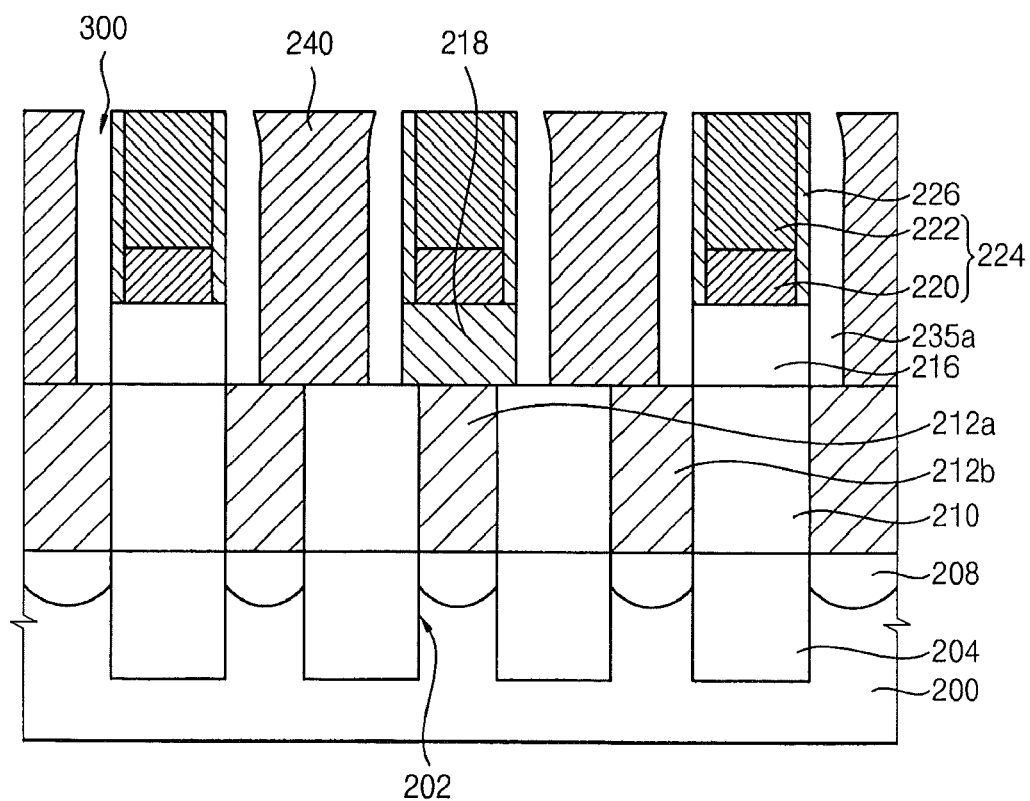

Referring to FIG. 24A, the sacrificial spacer 235b may be removed from the substrate 200 by a wet etch process, to thereby form the node gap space between the storage node contact 240 and the bit line structure 224. In the present example embodiment, the third insulation interlayer may remain on the substrate 200 in the above wet etch process for removing the sacrificial spacer 235b.

The node gap space may provide a void without any kind of thin layers and merely filled with air, to thereby form an air spacer 300 surrounding or enclosing the storage node contact 240. Thus, the loading capacitance may be reduced between the storage node contact 240 and the bit line structure 224. However, the third insulation interlayer may still remain in an area between the second portions of the sidewalls of the neighboring bit line structures 224, and thus no air gap may be formed between portions of the neighboring bit line structures 224 extending beyond the storage node contact 240. In the same way, the air gap may not be formed between the neighboring bit line structures 224 in the peripheral region of the substrate 200.

Thereafter, as described above with reference to FIGS. 21A, 21B and 22, an upper insulation interlayer 250 may be formed on the storage node contact 240, the hard mask pattern 222 and the air spacer 250. Then, the capacitor 254 may penetrate through the upper insulation interlayer 250 and may make contact with storage node contact 240. For example, the capacitor 254 may be shaped into a cylinder and include a cylindrical lower electrode 254a, a dielectric layer 254b on a surface of the lower electrode 254a and an upper electrode 254c that may be formed substantially by the same process as described above.

Embodiment V

Figure 25A:
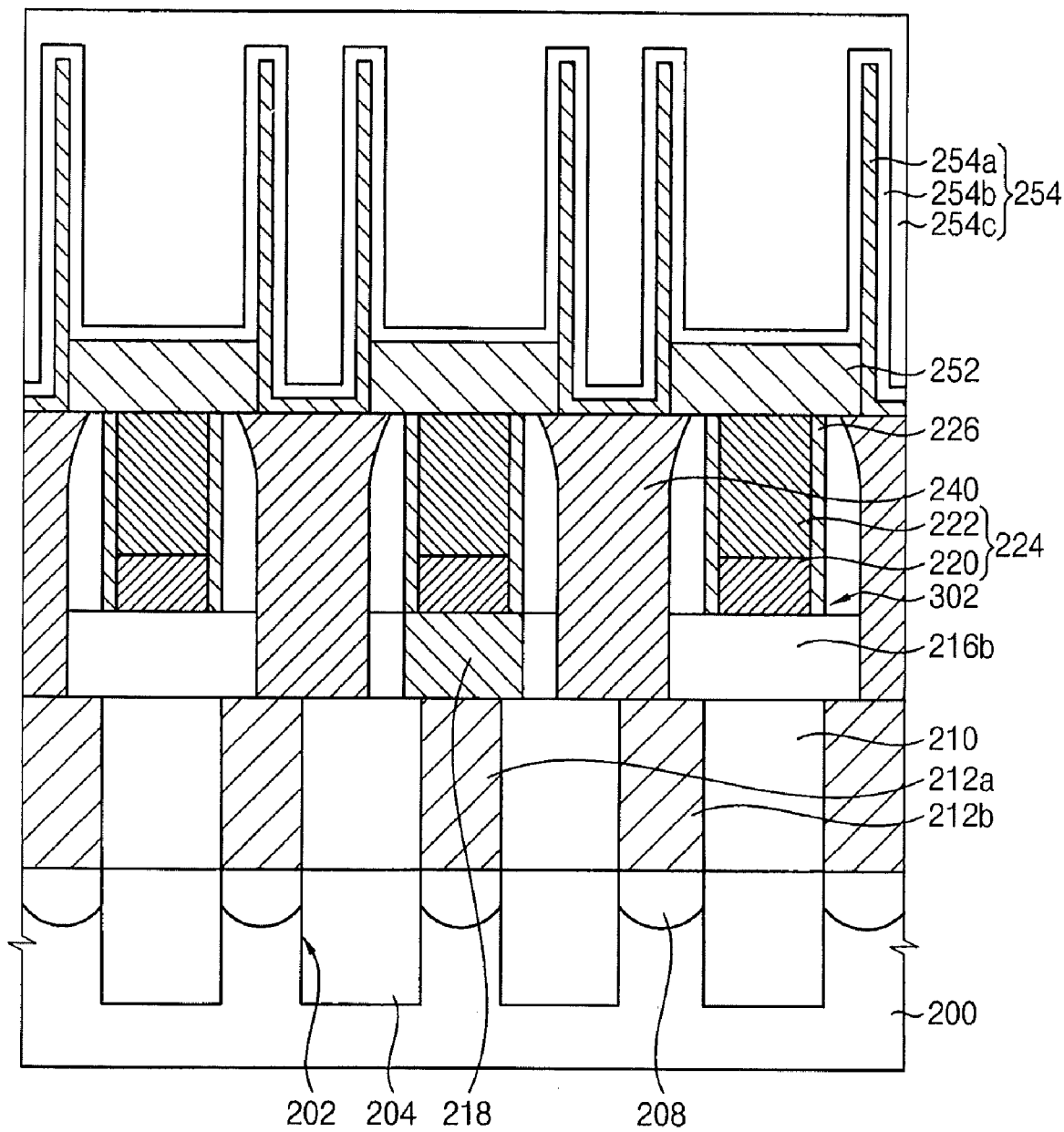
FIG. 25A is cross-sectional view illustrating a dynamic random access memory (DRAM) device in accordance with other embodiments of the present inventive concept.
Figure 26:
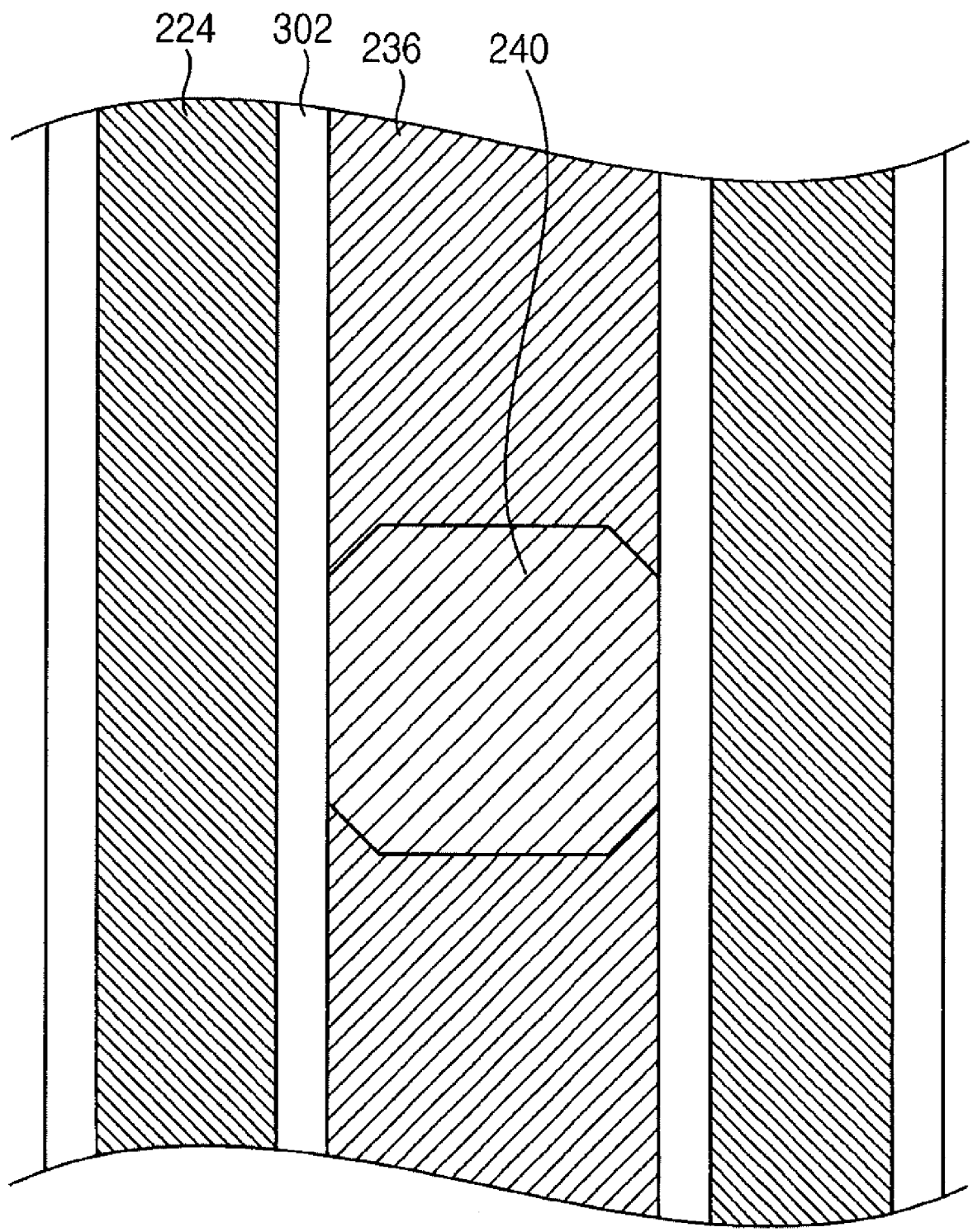
FIG. 26 is a plan view illustrating the DRAM device shown in FIG. 25A.

FIG. 25A is cross-sectional view illustrating a dynamic random access memory (DRAM) device in accordance with other embodiments of the present inventive concept. FIG. 26 is a plan view illustrating the DRAM device shown in FIG. 25A. In FIG. 25A, the capital letter 'A' in the FIG. number indicates a cross-sectional view cut along the line A-A' in FIG. 6.

The DRAM device in accordance with other embodiments of the present inventive concept may have substantially the same structure and configuration as the DRAM device in accordance with the previously described embodiments of the present inventive concept, except for the position and shape of the air spacer and the lack of an upper spacer. Thus, in the following drawings, the same reference numerals will be used to refer to the same or like parts as those shown in the previous drawings.

Referring to FIGS. 25A and 26, a substrate 200 including a plurality of active regions and a plurality of device isolation regions may be prepared. MOS transistors may be arranged on the cell region of the substrate 200 and each of the MOS transistors may include a gate insulation layer 206a, a gate electrode 206b and source and drain regions and/or electrodes 208. The gate electrode 206b may be shaped into a line extending a first direction and may function as a word line 206 in the MOS transistor. A first insulation interlayer 210 may be formed on the substrate 200 to a sufficient thickness to cover the MOS transistors. First and second pad contacts 212a and 212b may make contact with the source and drain electrodes 208, respectively, penetrating through the first insulation interlayer 210. A second insulation layer 216 may be positioned on the first insulation layer 210.

A bit line contact 218 may make contact with the first pad contact 212a in the second insulation layer 216. A bit line 220 may be positioned on the second insulation layer 216 and may make contact with the bit line contact 218. The bit line 220 may be shaped into a line extending in a second direction substantially perpendicular to the first direction. A hard mask pattern 222 may be positioned on the bit line 220 and an etch protection layer 226 may be arranged on a sidewall of the bit line 220, a surface of the hard mask pattern 222 and an upper surface of the second insulation interlayer 216. Thus, the sidewall of the bit line 220 may be protected from being etched in a subsequent process by the etch protection layer 226.

A storage node contact 240 may be positioned between the neighboring bit line structures 224 in which the bit line 220 and the hard mask pattern 222 may be stacked. The storage node contact 240 may have a length shorter than that of the bit line 220 in the second direction. Thus, a first portion of the sidewall of the bit line structure 224 may face the storage node contact 240 and a second portion of the sidewall of the bit line structure 224 may extend beyond the storage node contact 240 and may face a sidewall of neighboring bit line structure 224. That is, the bit line structure 224 may be spaced apart from the storage node contact 240 by a first gap distance at the first sidewall portion and may be spaced apart from the neighboring bit line structure by a second gap distance at the second sidewall portion.

The storage node contact 240 may be interposed between the first portions of the sidewalls of the neighboring bit line structures 224 and a third insulation interlayer 236b may be interposed between the second portions of the sidewalls of the neighboring bit line structures 224 that extend beyond the storage node contact 240. That is, no air gap may be provided between the second portions of the sidewalls of the neighboring bit line structures 224.

As shown in FIG. 26, the storage node contact 240 may be separated and spaced apart from the sidewalls of the neighboring bit line structures 224 in the first direction while making contact with the second and third insulation interlayers 216 and 236 in the second direction. That is, the storage node contact 240 may be spaced apart from the bit line structure 224 by a distance, to thereby form a gap space between the storage node contact 240 and the bit line structure 224. The gap space may provide a void without any kind of thin spacer materials except for air, to thereby form an air spacer 302 that separates and electrically insulates the storage node contact 240 from the bit line structure 224 and extends in the second direction. The air spacer 302 may extend from the upper sidewall to a lower sidewall of the storage node contact 240, and thus no upper spacer may be provided with the upper portion of the storage node contact 240. In other words, the air spacer 302 may extend along an entirety of the sidewalls of the storage node contact 240 (e.g., from top to bottom) in some embodiments.

Also, the air spacer 302 may be interposed between the storage node contact 240 and the bit line structure 224 and may extend along a length on the sidewall of the bit line structure in the second direction. In addition, the air spacer 302 may vertically extend from the upper sidewall to a lower sidewall of the storage node contact 240.

Thus, the DRAM devices according to other embodiments of the present inventive concept may include the air spacer interposed between the bit line structure and the storage node contact, and may not include an air gap between the neighboring bit line structures.

The air spacer may also be interposed between the neighboring bit line structures in the peripheral region of the substrate, while no air gap may be provided between the neighboring bit line structures in the peripheral region of the substrate.

An upper insulation interlayer 252 may be positioned on the storage node contact 240, the hard mask pattern 222 and the air spacer 300. A capacitor 254 may penetrate through the upper insulation layer 252 and may make electrical contact with the storage node contact 240. For example, the capacitor 254 may be shaped into a cylinder and include a cylindrical lower electrode 254a, a dielectric layer 254b on a surface of the lower electrode 254a and an upper electrode 254c.

FIGS. 27A to 29A illustrate processing steps for a method of manufacturing the DRAM device shown in FIG. 25A. In FIGS. 23A to 29A, the capital letter 'A' in each FIG. number indicates a cross-sectional view cut along the line A-A' in FIG. 6.

The same process as described with reference to FIGS. 9A to 9C may be performed on the substrate 200, and thus a transistor, a first insulation interlayer 210, first and second pad contacts 212a and 212b, a second insulation interlayer 216 and a bit line structure 224 may be formed on the substrate 200.

Figure 27A:
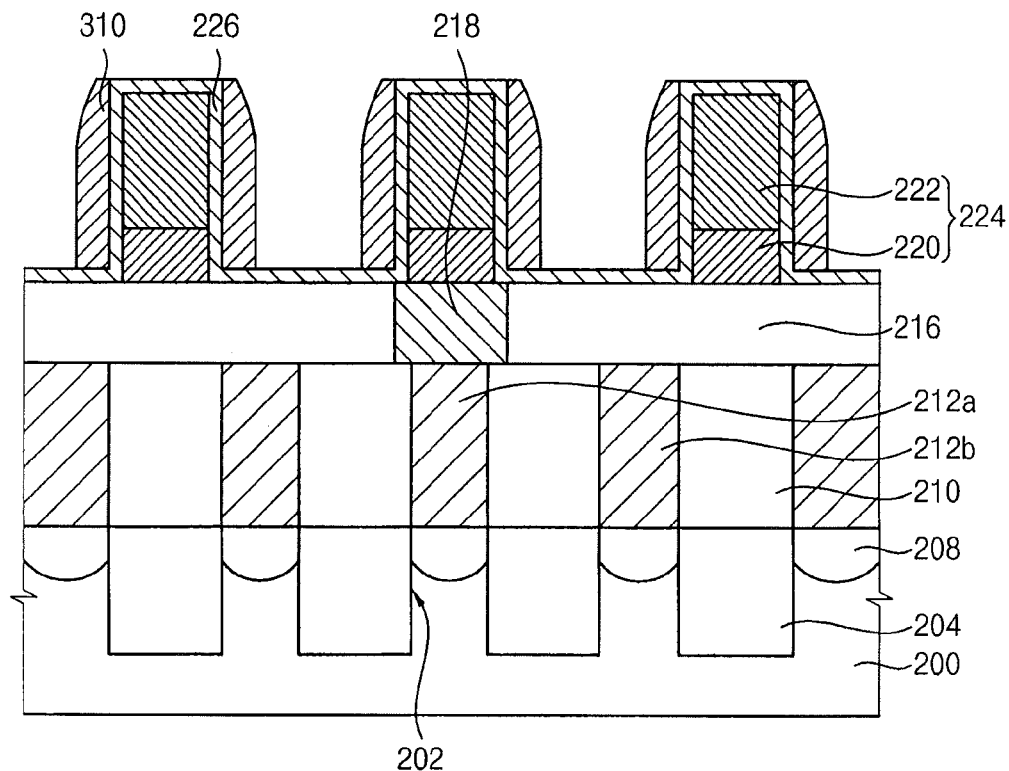

Referring to FIG. 27A, a sacrificial layer (not shown) may be formed on the sidewall of the bit line structure 224 and on the second insulation interlayer 216. The sacrificial layer may comprise a material having etching selectivity with respect to both of silicon nitride and silicon oxide such as silicon germanium or polysilicon.

The sacrificial layer may be partially removed from the second insulation interlayer by an anisotropic etching process, to thereby form a sacrificial spacer 310 on the sidewall of the bit line structure 224. In the present example embodiment, the sacrificial spacer 310 may also be formed on the sidewall of the bit line structure 224 in the peripheral region of the substrate 200.

Figure 28A:
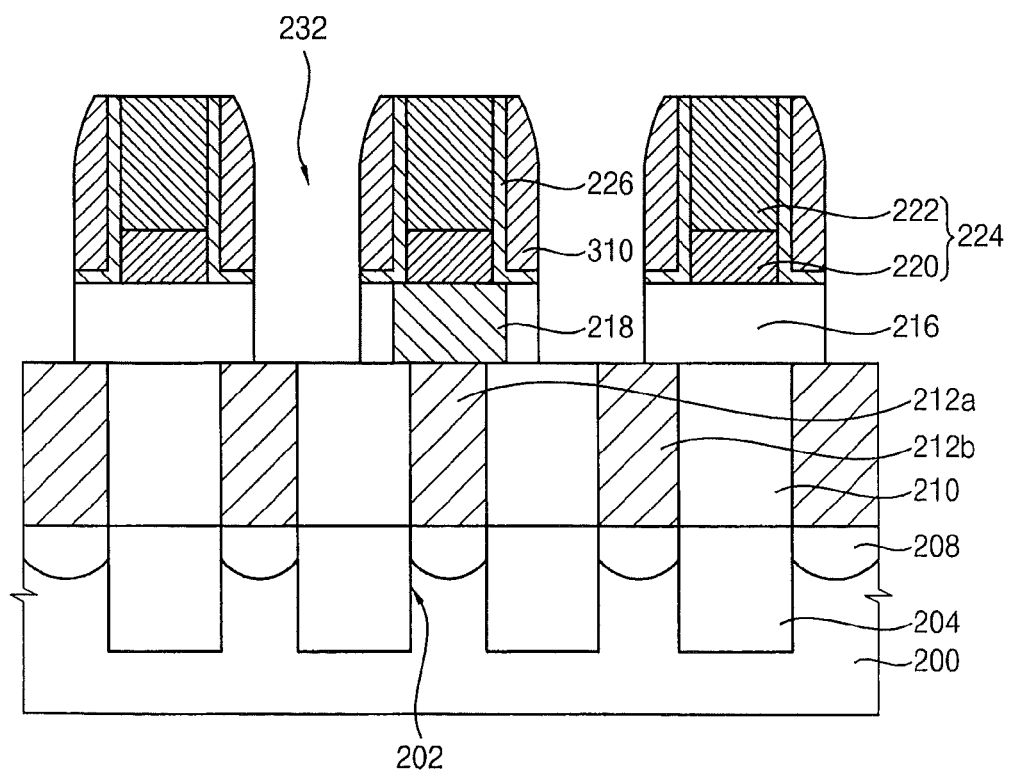

Referring to FIG. 28A, a third insulation interlayer may be formed on the second insulation interlayer 216 to a sufficient thickness to fill up the space between the sacrificial spacers 310. Then, the third insulation interlayer may be planarized by a planarization process such as a CMP process and an etch-back process until an upper surface of the bit line structure 224 may be exposed.

The third and second insulation interlayers may be partially and sequentially removed from the substrate 200, to thereby form a contact hole 232 through which the second pad contact 212b may be exposed. Thus, the sacrificial spacer 310 may be exposed through the contact hole 232.

Thereafter, an upper surface of the second pad contact 212b, which defines a bottom of the contact hole 232, may be partially recessed, to thereby improve contact characteristics between the second pad contact 212b and the storage node contact 240.

Figure 29A:
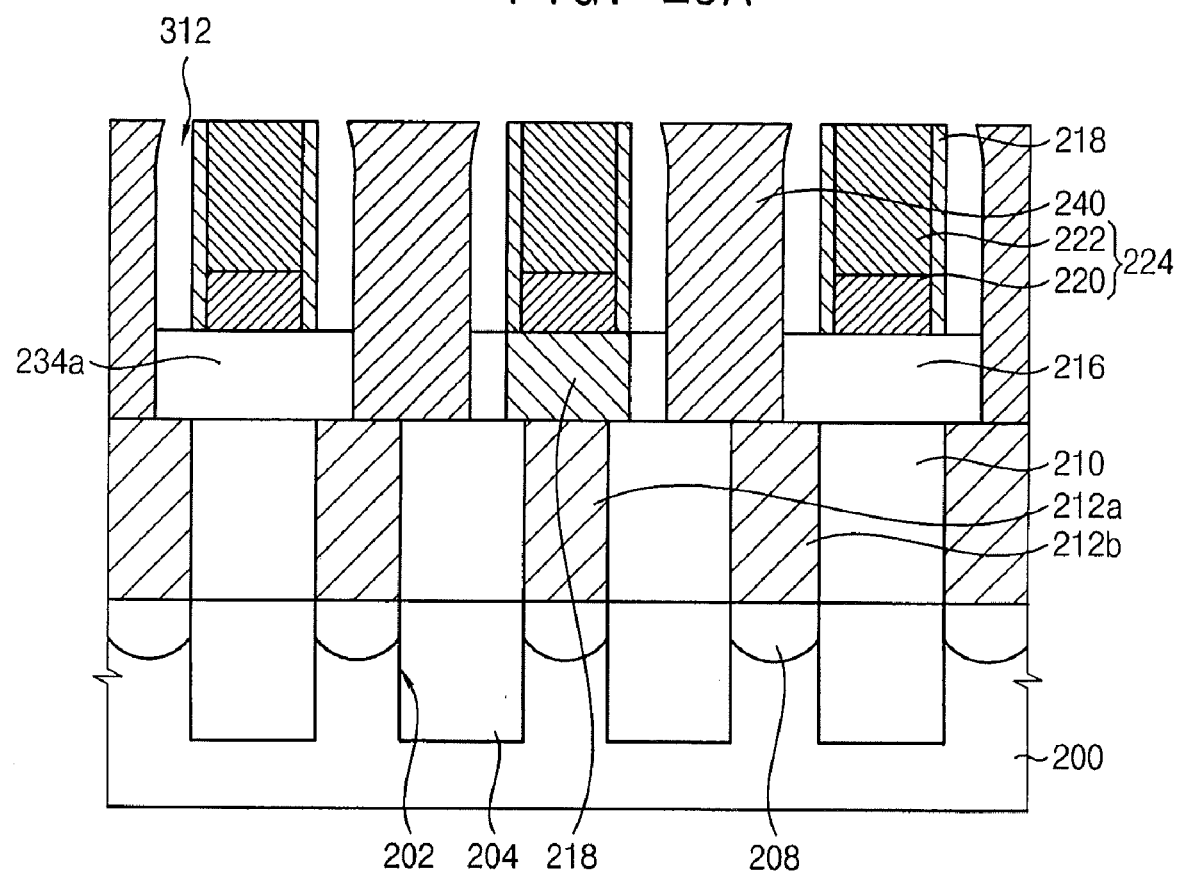

Referring to FIG. 29A, a conductive layer (not shown) may be formed on the third insulation interlayer and the hard mask pattern 222 to a sufficient thickness to fill up the contact hole 232 in which the sacrificial spacer 310 may be formed. Then, the conductive layer may be planarized by a planarization process such as a chemical mechanical polishing (CMP) process and an etch-back process until an upper surface of the third insulation interlayer and an upper surface of the hard mask pattern may be exposed, to thereby form a storage node contact 240 making contact with the second pad contact 212b. Thus, the sacrificial spacer 310 may be interposed between the storage node contact 240 and the bit line structure 224.

The sacrificial spacer 310 may be removed from the substrate 200 by a wet etch process, to thereby form a gap space between the storage node contact 240 and the bit line structure 224. In the present example embodiment, the third insulation interlayer may remain on the substrate 200 in the above wet etch process for removing the sacrificial spacer 310.

The gap space may provide a void without any kind of thin layers and merely filled with air, to thereby form an air spacer 312 interposed between the storage node contact 240 and the bit line structure 224. Thus, the loading capacitance may be sufficiently reduced between the storage node contact 240 and the bit line structure 224. In addition, the air spacer 312 may also be formed between the neighboring bit line structures 224 in the peripheral region of the substrate 200.

However, the third insulation interlayer may still remain in an area between the second portions of the sidewalls of the neighboring bit line structures 224, and thus no air gap may be formed between the portions of neighboring bit line structures 224 that extend beyond the storage node contact 240 in the second direction. In the same way, the air gap may not be formed between the neighboring bit line structures 224 in the peripheral region of the substrate 200.

Thereafter, as described above with reference to FIGS. 25A and 26, an upper insulation interlayer 252 may be formed on the storage node contact 240, the hard mask pattern 222 and the air spacer 312. Then, the capacitor 254 may penetrate through the upper insulation layer 252 and may make contact with storage node contact 240. For example, the capacitor 254 may be shaped into a cylinder and include a cylindrical lower electrode 254a, a dielectric layer 254b on a surface of the lower electrode 254a and an upper electrode 254c that may be formed substantially by the same process as described above.

Embodiment VI

Figure 30A:
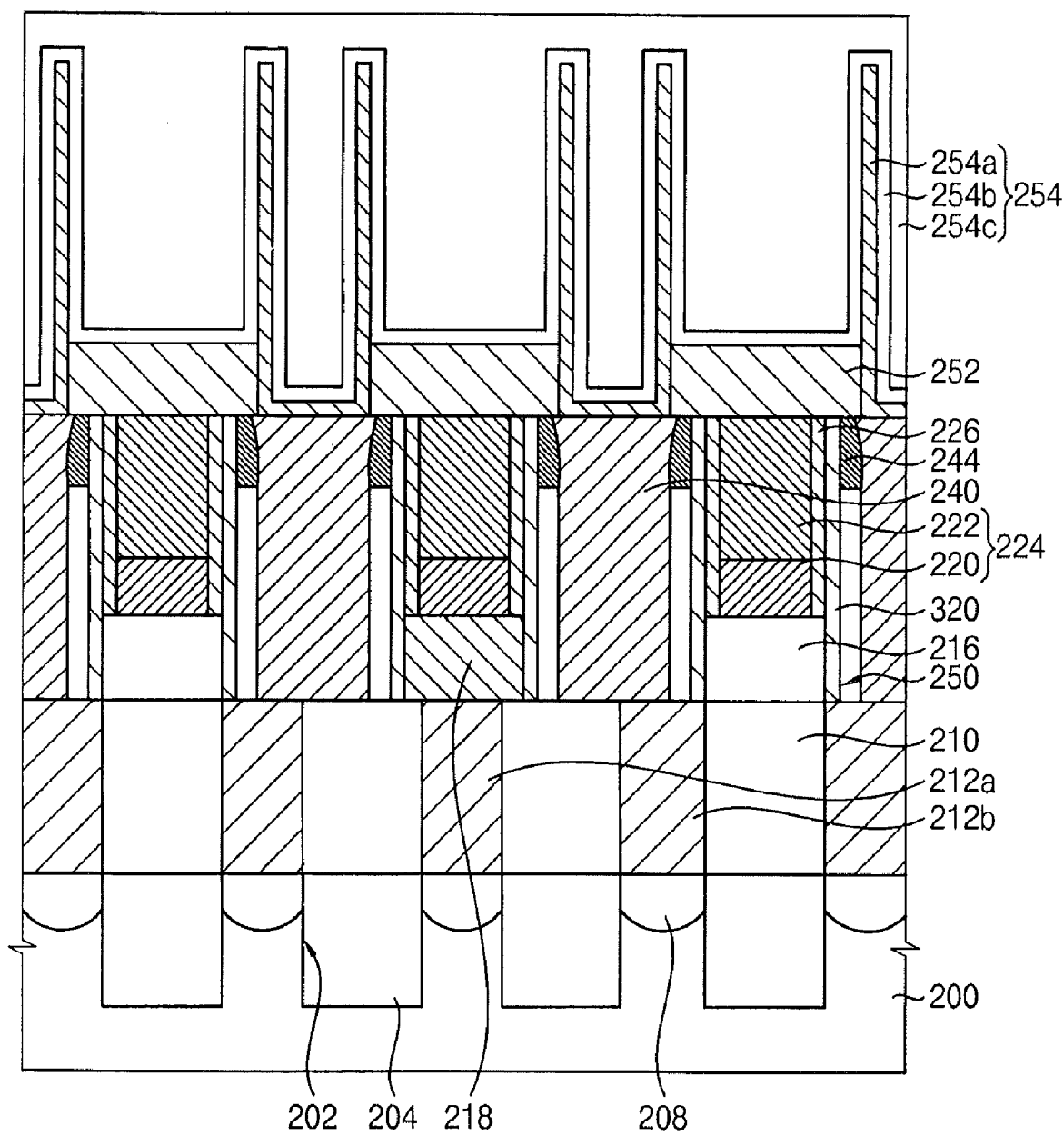
FIG. 30A is cross-sectional view illustrating a dynamic random access memory (DRAM) device in accordance with still other embodiments of the present inventive concept.

FIG. 30A is cross-sectional view illustrating a dynamic random access memory (DRAM) device in accordance with still other embodiments of the present inventive concept. The capital letter 'A' in the FIG. number indicates a cross-sectional view cut along the line A-A' in FIG. 6.

The DRAM device in accordance with still other embodiments of the present inventive concept may have substantially the same structure and configuration as the DRAM device in accordance with the previously described embodiments of the present inventive concept, except for the addition of an additional spacer 320 on the bit line structure 224, the second insulation interlayer 216, the bit line contact and the third insulation interlayer. Thus, in the following drawings, the same reference numerals will be used to refer to the same or like parts as those shown in the previous drawings.

Referring to FIG. 30A, the additional spacer 320 may face the storage node contact 240 and may surround and/or enclose a stacked structure including the second insulation interlayer 216, the bit line 220 and the hard mask pattern 222. The additional spacer 320 may comprise an insulation material such as silicon nitride.

The additional spacer 320 may have a relatively narrow thickness on the bit line structure 224, and an upper spacer 244 may be positioned on the upper sidewall of the addition spacer 320. An air spacer 250 may be provided below the upper spacer 244, such that the upper spacer 244 defines an upper boundary of the air spacer 250.

Hereinafter, the process steps for a method of manufacturing the DRAM device shown in FIG. 30A will be described.

The same process as described with reference to FIGS. 9A to 9C may be performed on the substrate 200, and thus a transistor, a first insulation interlayer 210, first and second pad contacts 212a and 212b, a second insulation interlayer 216 and a bit line structure 224 may be formed on the substrate 200. Then, a third insulation interlayer having a third contact hole may be formed on the second insulation interlayer 216. A spacer layer may be formed on the third insulation interlayer to a sufficient thickness to fill up the third contact hole. For example, the spacer layer may comprise silicon nitride. The spacer layer may be formed into a sacrificial spacer in the third contact hole by an anisotropic etching process.

Thereafter, the same process as described with reference to FIGS. 10A to 15D may be performed on the resultant structure on the substrate 200, to thereby form the DRAM device shown in FIG. 30A.

According to the present example embodiment, the thin additional spacer 320 may be further provided with the DRAM device and thus the additional spacer and the air spacer may function as a dielectric layer between the storage node contact and the bit line structure in the DRAM device.

Embodiment VII

Figure 31A:
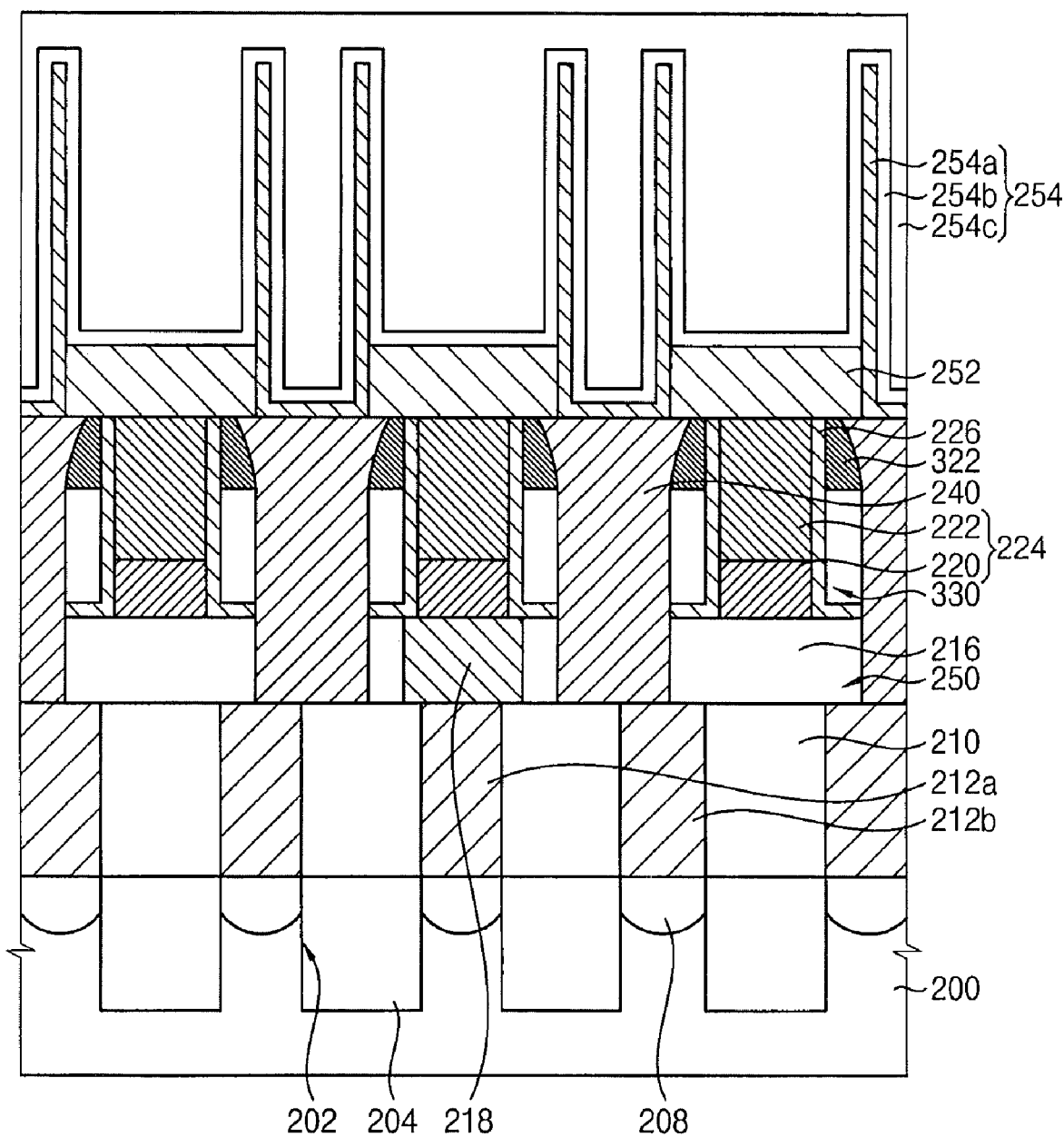
FIG. 31A is cross-sectional view illustrating a dynamic random access memory (DRAM) device in accordance with yet other embodiments of the present inventive concept.
Figure 32:
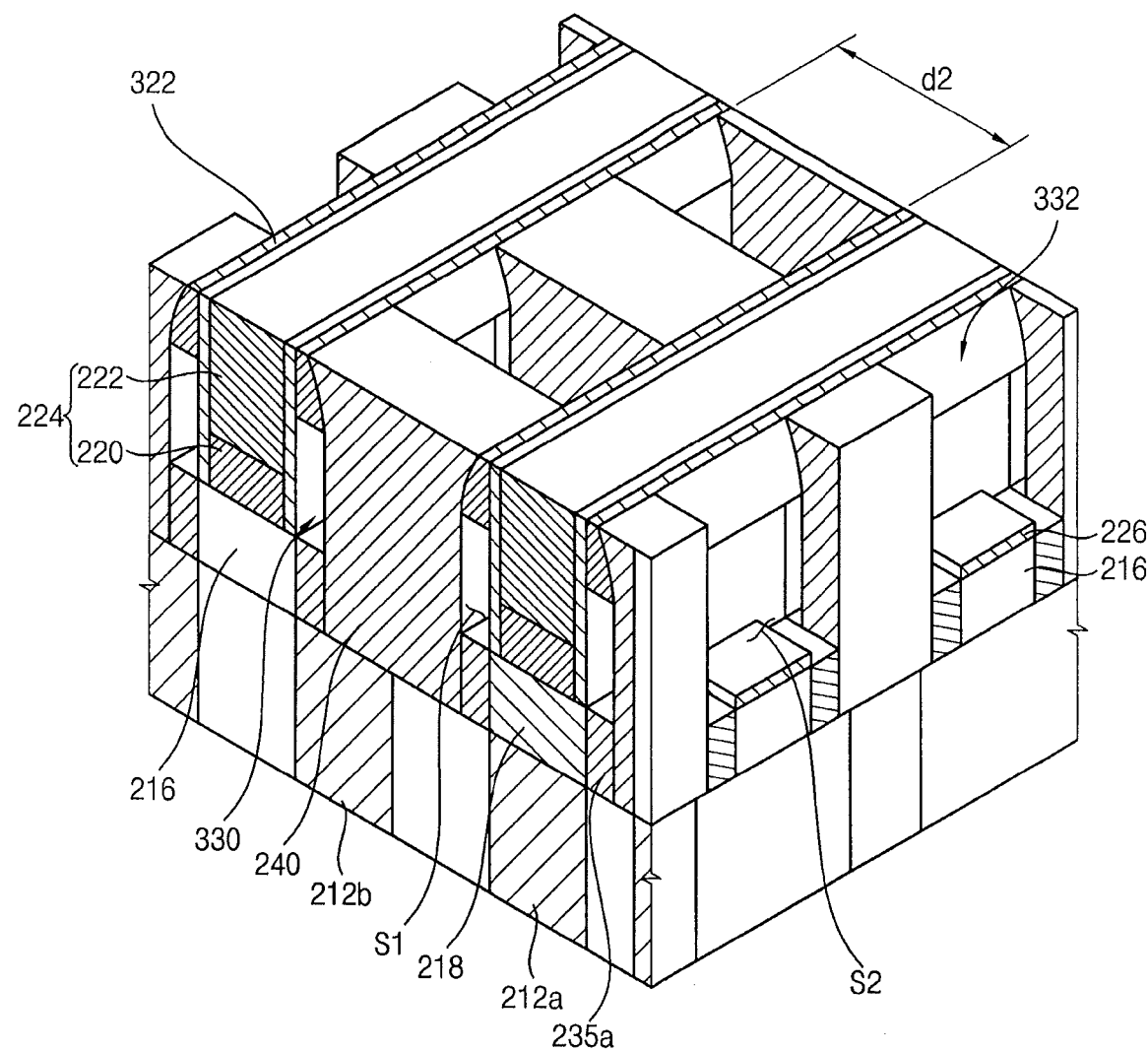
FIG. 32 is a perspective view illustrating a bit line structure of the DRAM device shown in FIG. 31A.

FIG. 31A is cross-sectional view illustrating a dynamic random access memory (DRAM) device in accordance with yet other embodiments of the present inventive concept. FIG. 32 is a perspective view illustrating a bit line structure of the DRAM device shown in FIG. 31A. In FIG. 31A, the capital letter 'A' in the FIG. number indicates a cross-sectional view cut along the line A-A' in FIG. 6.

The DRAM device in accordance with yet other embodiments of the present inventive concept may have substantially the same structure and configuration as the DRAM device in accordance with the previously described embodiments of the present inventive concept, except for the shape of the upper spacer. Thus, in the following drawings, the same reference numerals will be used to refer to the same or like parts as those shown in the previous drawings.

Referring to FIGS. 31A and 32, a substrate 200 including a plurality of active regions and a plurality of device isolation regions may be prepared. MOS transistors may be arranged on the cell region of the substrate 200 and each of the MOS transistors may include a gate insulation layer 206a, a gate electrode 206b and source and drain electrodes 208. The gate electrode 206b may be shaped into a line extending a first direction and may function as a word line 206 in the MOS transistor. A first insulation interlayer 210 may be formed on the substrate 200 to a sufficient thickness to cover the MOS transistors. First and second pad contacts 212a and 212b may make contact with the source and drain electrodes 208, respectively, penetrating through the first insulation interlayer 210. A second insulation layer 216 may be positioned on the first insulation layer 210.

A bit line contact 218 may make contact with the first pad contact 212a in the second insulation layer 216. A bit line 220 may be positioned on the second insulation layer 216 and may make contact with the bit line contact 218. The bit line may be shaped into a line extending in a second direction perpendicular to the first direction. A hard mask pattern 222 may be positioned on the bit line 220 and an etch protection layer 226 may be arranged on a sidewall of the bit line 220, a surface of the hard mask pattern 222 and an upper surface of the second insulation interlayer 216. Thus, the sidewall of the bit line 220 may be protected from being etched in a subsequent process by the etch protection layer 226.

A storage node contact 240 may be positioned between the neighboring bit line structures 224 in which the bit line 220 and the hard mask pattern 222 are sequentially stacked. The storage node contact 240 may penetrate through the second insulation interlayer 216 and may make contact with the second pad contact 212b. The storage node contact 240 may have a length shorter than that of the bit line structure 224 in the second direction. Thus, a first sidewall portion of the bit line structure 224 may face the storage node contact 240 and a second sidewall portion of the bit line structure 224 may extend beyond the storage node contact 240 and face a sidewall of neighboring bit line structure 224. That is, the bit line structure 224 may be spaced apart from the storage node contact 240 by a first gap distance d1 at the first sidewall portion and may be spaced apart from the neighboring bit line structure by a second gap distance d2 at the second sidewall portion. An upper sidewall of the storage node contact 240 may make contact with the upper spacer 322. That is, the upper spacer 322 may be interposed between the upper portion of the storage node contact 240 and the upper portion of the bit line structure 224.

An upper spacer 322 may extend along an upper sidewall of the hard mask pattern 222 that is covered with the etch protection layer 226 in the second direction. That is, the upper spacer 322 may be positioned on the second sidewall portions of the bit line structure 224 that extend beyond the storage node contact 240 as well as the first sidewall portions of the bit line structure 224 that are adjacent to the storage node contact 240. For that reason, the upper spacer 322 may be an insulation material such as silicon nitride. In contrast to the DRAM device shown in FIG. 16, the storage node contact 240 may not be enclosed or surrounded by the upper spacer 322.

A first space S1 positioned below the upper spacer 322 and defined by the storage node contact 240 and the bit line structure 224 may provide a void without any kind of thin layers and merely filled with air, to thereby form an air spacer 330 under the upper spacer 322. In the present example embodiment, the air spacer 330 may vertically extend from a lower surface of the upper spacer 244 to a lower portion of the bit line structure 224, and a residual insulation pattern 235a may be positioned between the second insulation interlayer 216 and the storage node contact 240 in place of the air spacer 330. For example, the residual insulation pattern 235a may comprise silicon oxide. An upper surface of the residual insulation pattern 235a may be coplanar with a lower surface of the bit line 220 and may be lower than the lower surface of the bit line 220. Therefore, the residual insulation pattern 235a, which may make contact with the storage node contact 240, may not increase the loading capacitance between the storage node contact 240 and the bit line 220.

The second sidewall portion of the bit line structure 224 may face a sidewall of a neighboring bit line structure 224 and may be spaced apart from the neighboring bit line structure by a second gap distance d2. Thus, a second space S2 defined by the neighboring bit line structures 224 and the storage node contact 240 may provide a void without any kind of thin layers and merely filled with air, to thereby form an air gap 332 between the neighboring bit line structures 224. Thus, the air spacer 330 and the air gap 332 may be interconnected to each other. Particularly, the upper spacer 322 may not be formed on the upper sidewall of the storage node contact 240 in the second space S2 as compared with the upper spacer 244a of the DRAM device shown in FIG. 16.

In addition, the air gap 332 may also be interposed between the neighboring bit line structures 224 in the peripheral region of the substrate 200, although not shown in figures.

An upper insulation layer (not shown) may be positioned on the storage node contact 240, the upper spacer 322, the hard mask pattern 222 and the air gap 332. The air gap 332 may not be filled with the upper insulation layer, to thereby maintain the air gap 332 despite of the upper insulation layer. As such, the upper insulation layer may define an upper boundary of the air gap between neighboring bit line structures. A capacitor (not shown) may penetrate through the upper insulation layer and may make electrical contact with the storage node contact 240. For example, the capacitor may be shaped into a cylinder and include a cylindrical lower electrode, a dielectric layer on a surface of the lower electrode and an upper electrode.

FIGS. 33A to 35A illustrate processing steps for a method of manufacturing the DRAM device shown in FIG. 31A. In FIGS. 33A to 35A, the capital letter 'A' in each FIG. number indicates a cross-sectional view cut along the line A-A' in FIG. 6.

The same process as described with reference to FIGS. 9A to 9C may be performed on the substrate 200, and thus a transistor, a first insulation interlayer 210, first and second pad contacts 212a and 212b, a second insulation interlayer 216 and a bit line structure 224 may be formed on the substrate 200.

Figure 33A:
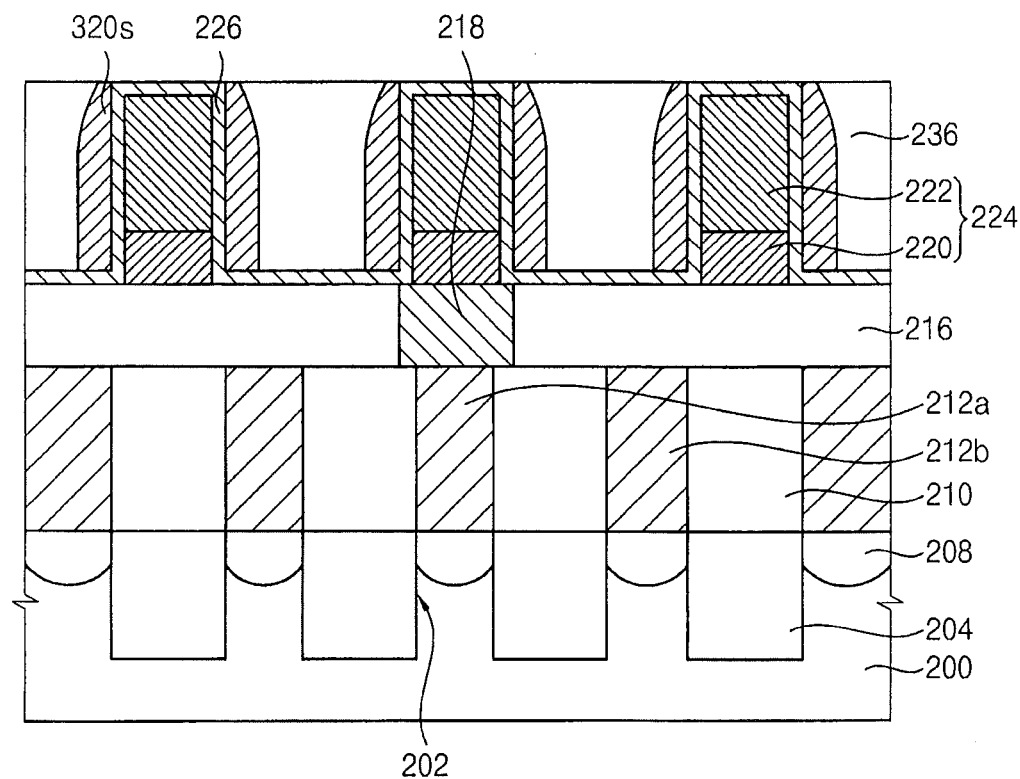

Referring to FIG. 33A, a preliminary sacrificial spacer 320s may be formed on the sidewall of the bit line structure 224. For example, the preliminary sacrificial spacer 320s may comprise silicon germanium or polysilicon. The preliminary sacrificial spacer 320s may be formed on the sidewall of the bit line structure 224 in the peripheral region as well as the cell region of the substrate 200. Thereafter, a third insulation interlayer may be formed on the second insulation interlayer 216 to a sufficient thickness to cover the bit line structure 224 and the preliminary sacrificial spacer 320s. Then, the third insulation interlayer 236 may be planarized by a planarization process until an upper surface of the bit line structure 224 and an upper surface of the preliminary sacrificial spacer 320.

Figure 34A:
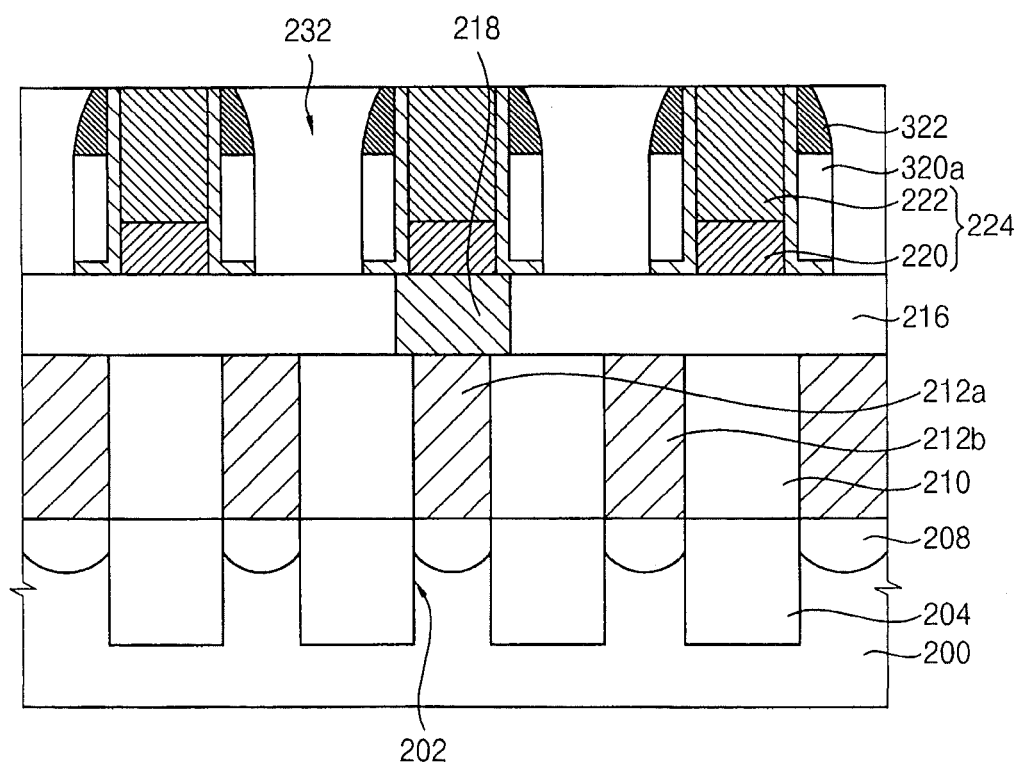

Referring to FIG. 34A, an upper portion of the preliminary sacrificial layer 320s may be removed downward along the second direction, to thereby form a gap space (not shown) between an upper portion of the third insulation interlayer 236 and an upper portion of the bit line structure 224. The gap space may have a depth from the upper surface of the preliminary sacrificial layer 320s and may extend in the second direction. The residual portions of the preliminary sacrificial layer 320s may remain on the bit line structure 224, to thereby form a sacrificial spacer 320a extending along the second direction in parallel with the bit line structure 224. An upper surface of the sacrificial spacer 320a may be higher than an upper surface of the bit line 220 of the bit line structure 224. For example, preliminary sacrificial layer 320s may be removed from the bit line structure 224 by a wet etching process.

Thereafter, a spacer layer (not shown) may be formed on the third insulation interlayer to a sufficient thickness to fill the gap space between an upper portion of the third insulation interlayer 236 and an upper portion of the bit line structure 224. Then, the spacer layer may be planarized by a planarization process, such as a CMP process, and an etch-back process, to thereby form the upper spacer 322 in the gap space. Therefore, the sidewall of the bit line structure 244 may be covered with both the upper spacer 322 and the sacrificial spacer 320a.

Figure 35A:
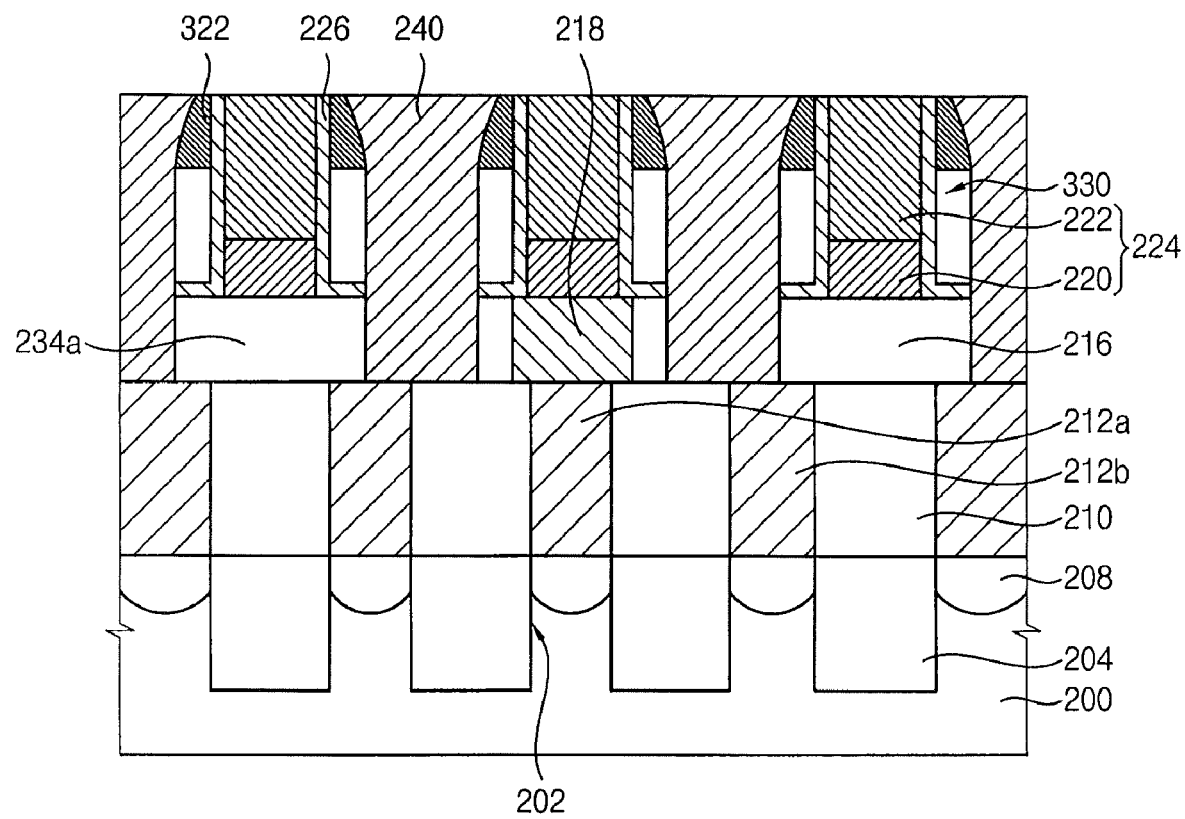

Referring to FIG. 35A, the third insulation interlayer and the second insulation interlayer 216 may be partially and sequentially removed from the substrate 200, to thereby form a contact hole through which the second pad contact 212b may be exposed. Thus, both the sacrificial spacer 320a and the upper spacer 322 may be exposed in the contact hole.

A conductive layer (not shown) may be formed on the third insulation interlayer to a sufficient thickness to fill up the contact hole. Then, the conductive layer may be planarized by a planarization process until an upper surface of the third insulation interlayer may be exposed, to thereby form a storage node contact 240 making contact with the second pad contact 212b in the contact hole.

Thereafter, the third insulation interlayer may be removed from the insulation interlayer 216 by a dry etching process and/or a wet etching process, more preferably, by a wet etching process. For the removal of the third insulation interlayer, a second space S2 may be formed between the second portions of the sidewalls of the neighboring bit line structures 224. Thus, the second space S2 may be defined by the neighboring bit line structures 224 and the storage node contact 240 and may provide a void without any kind of thin layers and merely filled with air, to thereby form an air gap 332 between the neighboring bit line structures 224. In addition, the upper spacer 322 and the sacrificial spacer 320a may also be exposed and/or in contact with to the second space S2.

The sacrificial spacer 320a may be partially removed from the substrate 200 by a wet etching process, thereby form a first space S1 below the upper spacer 322. The first space S1 may be defined by the bit line structure, the storage node contact 240 and the upper spacer 322 and may provide a void without any kind of thin layers and merely filled with air, to thereby define an air space 330 between the line structure 224 and the storage node contact 240. In the present example embodiment, the air spacer 330 may extend from the bottom surface of the upper spacer 322 to a lower portion of the bit line structure 224. Laterally extending portions of the mask 226 may define a lower boundary of the air spacer 330.

In addition, the air gap may also be formed between the neighboring bit line structures 224 in the peripheral region as well as cell region of the substrate 200.

The same process as described with reference to FIG. 31A may be performed on the resultant structure on the substrate 200, to thereby faun an upper insulation interlayer 252 on the storage node contact 240, the upper spacer 322, the hard mask pattern 222 and the air gap 332 in such a manner that that the air gap 332 is not filled with the upper insulation interlayer 252. Thereafter, the capacitor 254 may penetrate through the upper insulation interlayer 252 and may make contact with storage node contact 240. The capacitor 254 may be formed on the upper insulation interlayer 252 in the same process as described above.

According to example embodiments of the present inventive concept, conductive structures may be formed on a substrate with a high degree of integration and may be operated at high speed. In some embodiments, the conductive structures may be used in a wiring structure for a DRAM device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

That which is claimed:

1. A method of fabricating an integrated circuit device, the method comprising:

forming first and second conductive structures on a substrate spaced apart from one another in a first direction and extending in a second direction substantially perpendicular to the first direction;

forming a contact plug between the first and second conductive structures and spaced apart from the first and second conductive structures in the first direction by respective air gaps on opposite sides of the contact plug, the air gaps defining first and second air spacers that electrically insulate the contact plug from the first and second conductive structures, respectively; and forming an upper insulation layer on the first and second air spacers and the first and second conductive structures.

2. The method of claim 1, further comprising:

forming first and second upper spacers above the first and second air spacers, respectively, the first and second upper spacers separating respective sidewalls of the contact plug from sidewalls of the first and second conductive structures adjacent thereto, wherein the first and second upper spacers define an upper boundary of the first and second air spacers therebelow.

3. The method of claim 1, wherein forming the contact plug comprises:

forming an insulation layer on the first and second conductive structures;

partially removing the insulation layer to form a contact hole through which sidewalls of the first and second conductive structures are exposed;

forming sacrificial spacers in the contact hole on the sidewalls of the first and second conductive structures exposed through the contact hole;

forming the contact plug in the contact hole including the sacrificial spacers therein; and then removing the sacrificial spacers from the sidewalls of the conductive structures such that the contact plug is spaced apart from the sidewalls of the first and second conductive structures by the air gaps defining the first and second air spacers.

4. The method of claim 3, further comprising:

removing the insulation layer from the substrate after forming the contact plug and before removing the sacrificial spacers.

5. A method of fabricating an integrated circuit device, the method comprising:

forming a structure on a substrate, the structure including at least one pad contact;

forming a plurality of bit line structures on the substrate spaced apart from one another along a first direction, the bit line structures extending in a second direction substantially perpendicular to the first direction;

forming respective contact plugs between neighboring ones of the bit line structures and spaced apart therefrom by first gaps in the first direction, the first gaps defining respective air spacers that electrically insulate the neighboring ones of the bit line structures from the respective contact plugs therebetween; and forming an upper insulation layer covering the air spacers and the bit line structures.

6. The method of claim 5, wherein forming the respective contact plugs comprises:

forming an insulation layer on the substrate to cover the bit line structures;

partially removing the insulation layer to form contact holes through which sidewalls of the bit line structures are exposed;

forming sacrificial spacers on the sidewalls of the bit line structures exposed through the contact holes;

forming the respective contact plugs in the contact holes including the sacrificial spacers therein; and then at least partially removing the sacrificial spacers from the sidewalls of the bit line structures such that the contact plugs and the sidewalls of the bit line structures are spaced apart from each other by the first gaps to define the air spacers.

7. The method of claim 6, wherein forming the contact plugs further comprises:

removing an upper portion of at least one of the sacrificial spacers to provide an upper gap space defined by a remaining portion of the at least one of the sacrificial spacers; and forming an upper spacer in the upper gap space, the upper spacer separating an upper portion of a respective one of the contact plugs adjacent thereto from an upper portion of a respective one of the bit line structures adjacent thereto in such a manner that the respective one of the contact plugs is surrounded by the upper spacer.

8. The method of claim 7, wherein the upper spacer comprises one of a solid insulating material and a conductive material.

9. The method of claim 7, wherein the upper spacer comprises a material having etching selectivity with respect to the sacrificial spacers.

10. The method of claim 6, wherein forming the contact plugs further comprises:

removing the insulation layer from the substrate before removing the sacrificial spacers such that portions of the neighboring ones of the bit line structures extending beyond the respective contact plugs in the second direction are spaced apart from one another by respective second gaps along the first direction, the second gaps defining respective air gaps between the portions of the neighboring ones of the bit line structures.

11. The method of claim 6, wherein forming the contact plugs comprises:

forming sacrificial spacers on sidewalls of the bit line structures;

forming an insulation layer on the substrate to a thickness sufficient to cover the bit line structures;

partially removing the insulation layer from the substrate to form contact holes through which portions of the sacrificial spacers are exposed;

forming the respective contact plugs in the contact holes such that the sacrificial spacers contact the respective contact plugs; and removing the sacrificial spacers such that the respective contact plugs and the bit line structures adjacent thereto are spaced apart from one another by the first gaps to define the air spacers between the contact plugs and the bit line structures.

12. The method of claim 11, wherein forming the contact plugs further comprises:

removing an upper portion of at least one of the sacrificial spacers to form an upper gap space defined by a remaining portion of the at least one of the sacrificial spacers; and forming an upper spacer in the upper gap space, the upper spacer extending on a sidewall of an upper portion of a respective one of the bit line structures in the second direction.

13. The method of claim 12, wherein the upper spacer comprises an insulation material.

* * * * *